US011784456B2

(12) United States Patent
Yu

(10) Patent No.: US 11,784,456 B2
(45) Date of Patent: Oct. 10, 2023

(54) METHOD OF MANUFACTURING A III-V BASED OPTOELECTRONIC DEVICE

(71) Applicant: ROCKLEY PHOTONICS LIMITED, Altrincham (GB)

(72) Inventor: Guomin Yu, Glendora, CA (US)

(*) Notice: Subject to any disclaimer, the term of this patent is extended or adjusted under 35 U.S.C. 154(b) by 222 days.

(21) Appl. No.: 17/002,722

(22) Filed: Aug. 25, 2020

(65) Prior Publication Data
US 2021/0066537 A1 Mar. 4, 2021

Related U.S. Application Data

(60) Provisional application No. 62/891,874, filed on Aug. 26, 2019.

(30) Foreign Application Priority Data

Oct. 18, 2019 (GB) .................................. 1915085

(51) Int. Cl.
*H01S 5/00* (2006.01)
*H01S 5/02* (2006.01)
(Continued)

(52) U.S. Cl.
CPC .............. *H01S 5/021* (2013.01); *H01S 5/026* (2013.01); *H01S 5/0215* (2013.01);
(Continued)

(58) Field of Classification Search
CPC .... H01S 5/021; H01S 5/0215; H01S 5/02326; H01S 5/026; H01S 5/125; H01S 5/2081; H01S 5/2206; H01S 5/02375
See application file for complete search history.

(56) References Cited

U.S. PATENT DOCUMENTS 9,097,846 B2 8/2015 Mizrahi et al.
2009/0245298 A1* 10/2009 Sysak .................... B82Y 20/00
257/E33.068
(Continued)

FOREIGN PATENT DOCUMENTS

GB        2577608 A     4/2020
WO    WO 2019/101369 A1  5/2019
(Continued)

OTHER PUBLICATIONS

International Search Report and Written Opinion of the International Searching Authority, dated Nov. 10, 2020, Corresponding to PCT/EP2020/073767, 16 pages.
(Continued)

*Primary Examiner* — Kinam Park
(74) *Attorney, Agent, or Firm* — Lewis Roca Rothgerber Christie LLP

(57) ABSTRACT

A method of manufacturing a III-V based optoelectronic device on a silicon-on-insulator wafer. The silicon-on-insulator wafer comprises a silicon device layer, a substrate, and an insulator layer between the substrate and silicon device layer. The method includes the steps of: providing a device coupon, the device coupon being formed of a plurality of III-V based layers; providing the silicon-on-insulator wafer, the wafer including a cavity with a bonding region; transfer printing the device coupon into the cavity, and bonding a layer of the device coupon to the bonding region, such that a channel is left around one or more lateral sides of the device coupon; filling the channel with a bridge-waveguide material; and performing one or more etching steps on the device coupon, silicon-on-insulator wafer, and/or channel.

27 Claims, 62 Drawing Sheets

(51) Int. Cl.
   *H01S 5/125* (2006.01)
   *H01S 5/026* (2006.01)
   *H01S 5/22* (2006.01)
   *H01S 5/02326* (2021.01)
   *H01S 5/20* (2006.01)
   *H01L 33/00* (2010.01)
   *H01S 5/02375* (2021.01)

(52) U.S. Cl.
   CPC ......... *H01S 5/02326* (2021.01); *H01S 5/125* (2013.01); *H01S 5/2081* (2013.01); *H01S 5/2206* (2013.01); *H01L 33/0066* (2013.01); *H01S 5/02375* (2021.01)

(56) References Cited

U.S. PATENT DOCUMENTS

2013/0051727 A1* 2/2013 Mizrahi ................... G02B 6/26 385/28
2016/0291248 A1* 10/2016 HuangFu ................ H01L 29/20
2017/0229840 A1* 8/2017 Lambert ................. H01S 5/141

FOREIGN PATENT DOCUMENTS

WO   WO 2019/220207 A1   11/2019
WO   WO 2020/030641 A1   2/2020

OTHER PUBLICATIONS

U.K. Intellectual Property Office Search and Examination Report, dated Apr. 17, 2020, for Patent Application No. GB1915085.3, 5 pages.
U.K. Intellectual Property Office Search and Examination Report, dated Dec. 21, 2021, for Patent Application No. GB 1915085.3, 4 pages.

\* cited by examiner

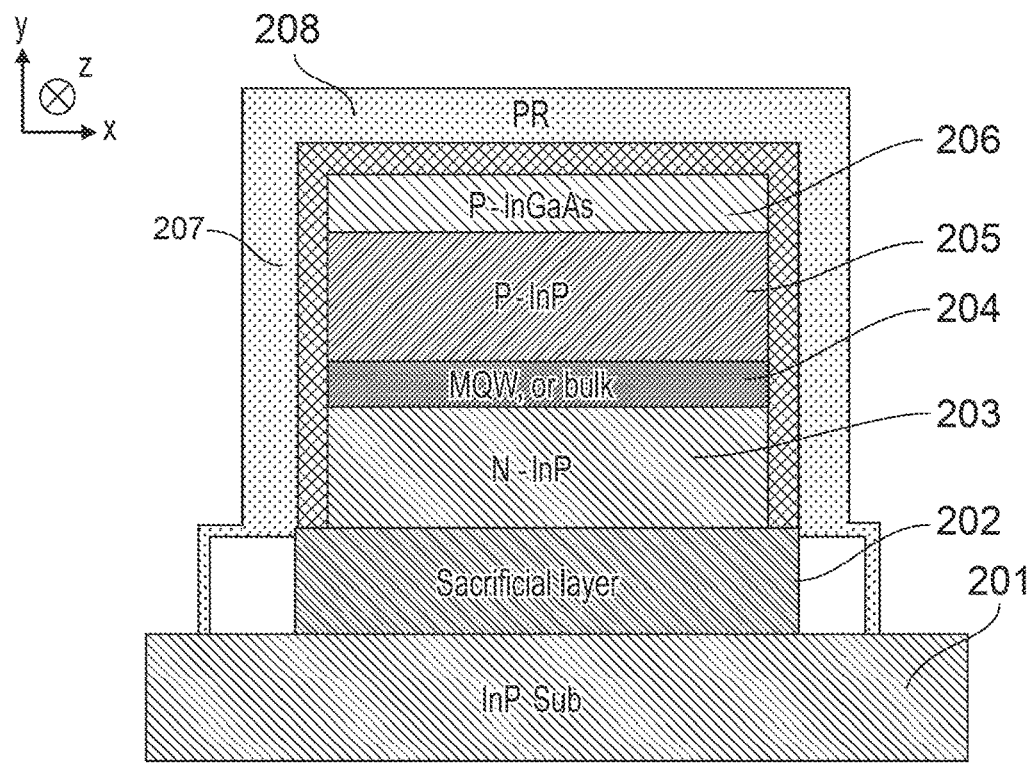
Fig. 2(iii)

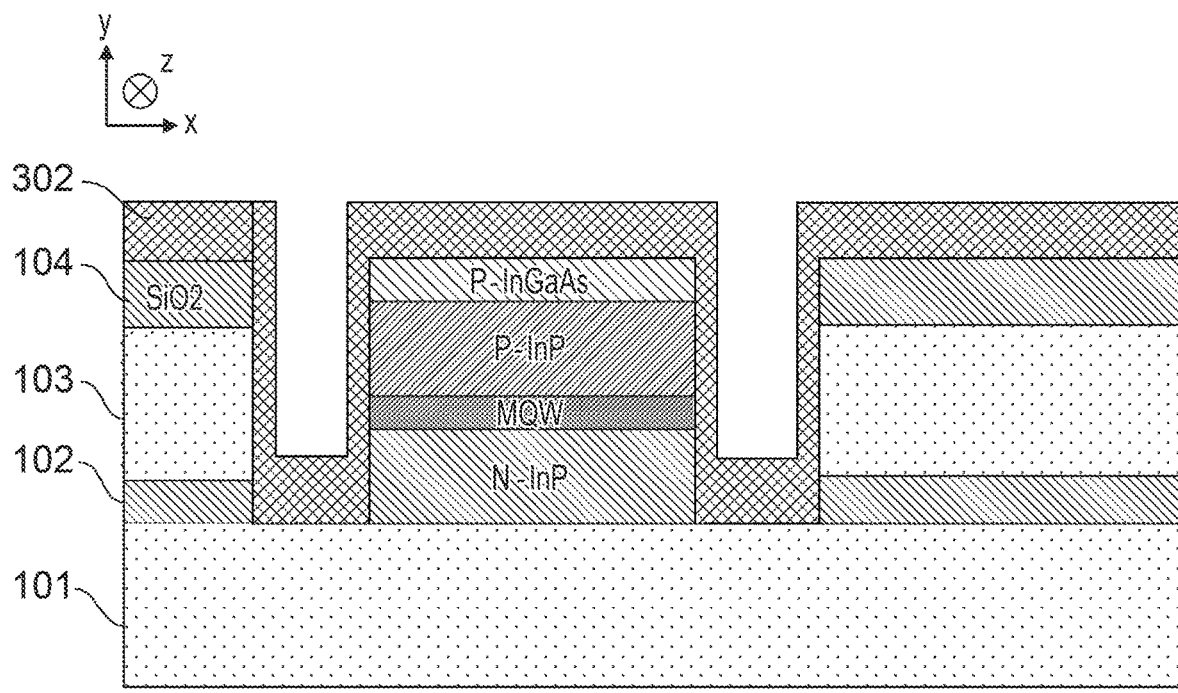
Fig. 3(iii)

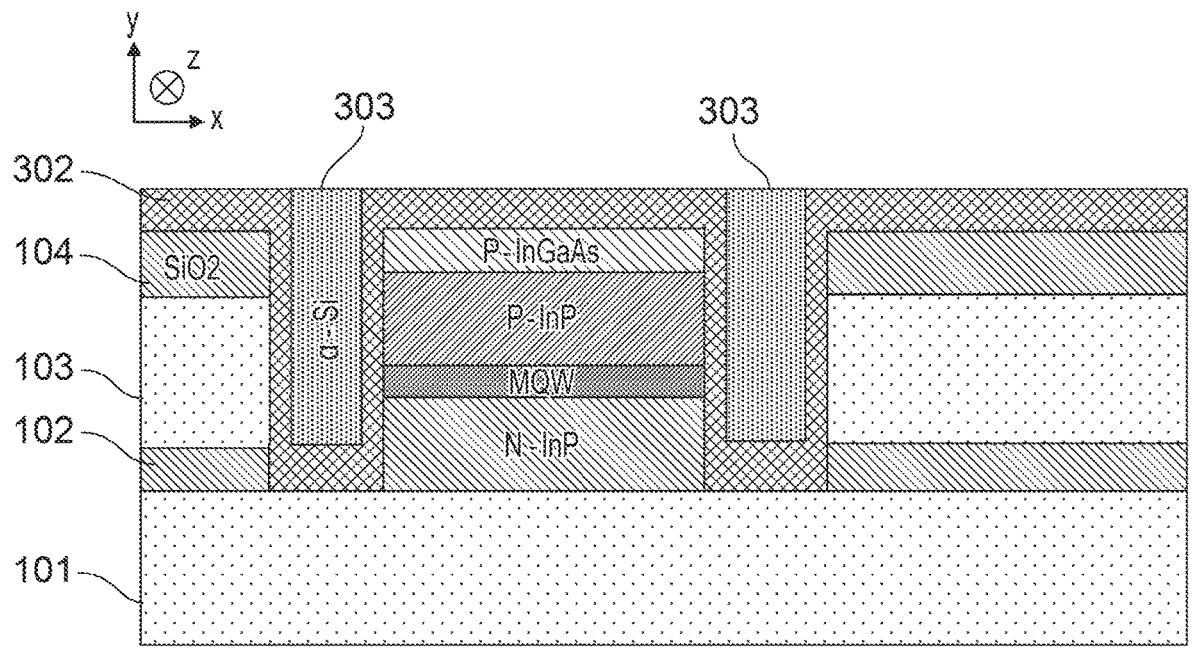
Fig. 3(vii)
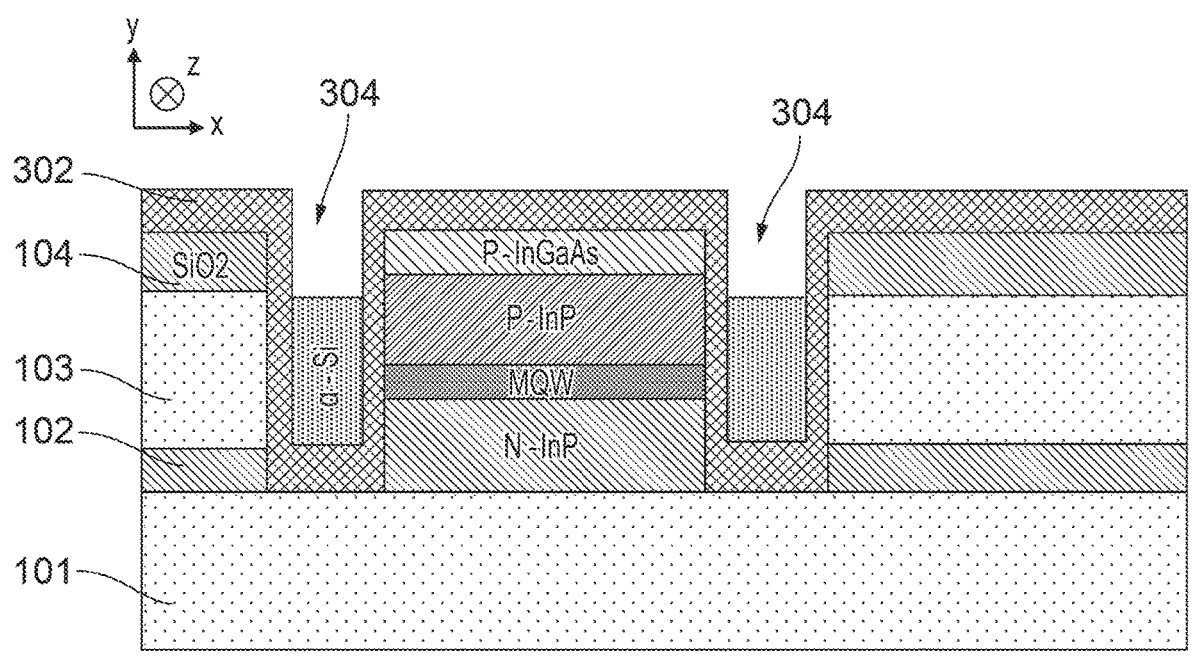
Fig. 3(viii)

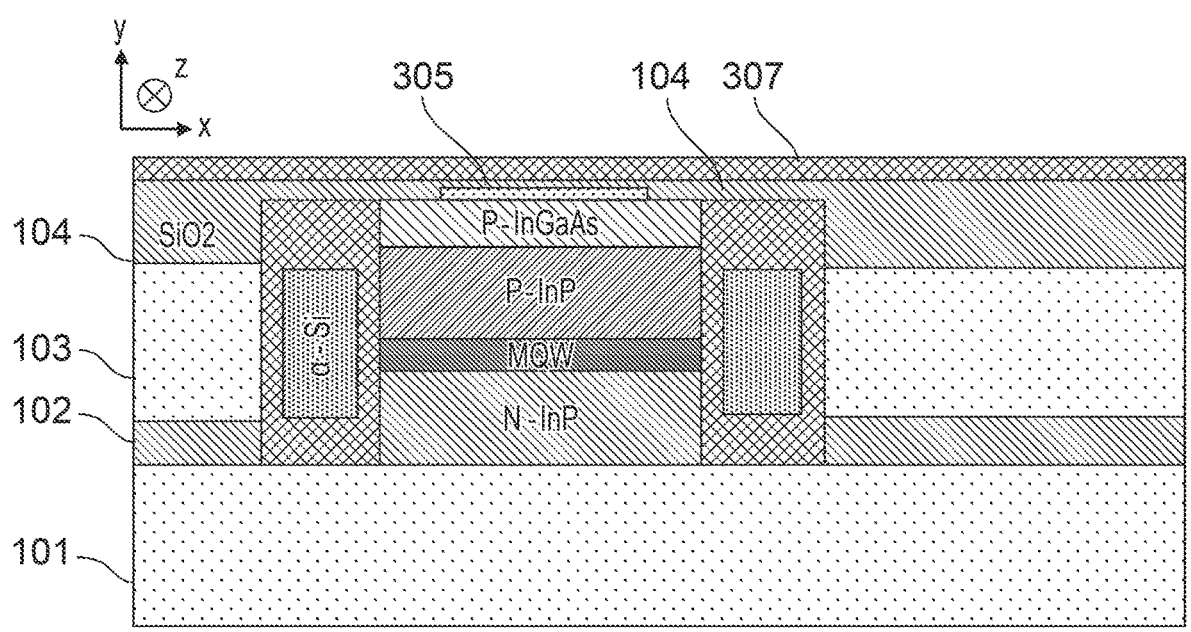
Fig. 3(xii)

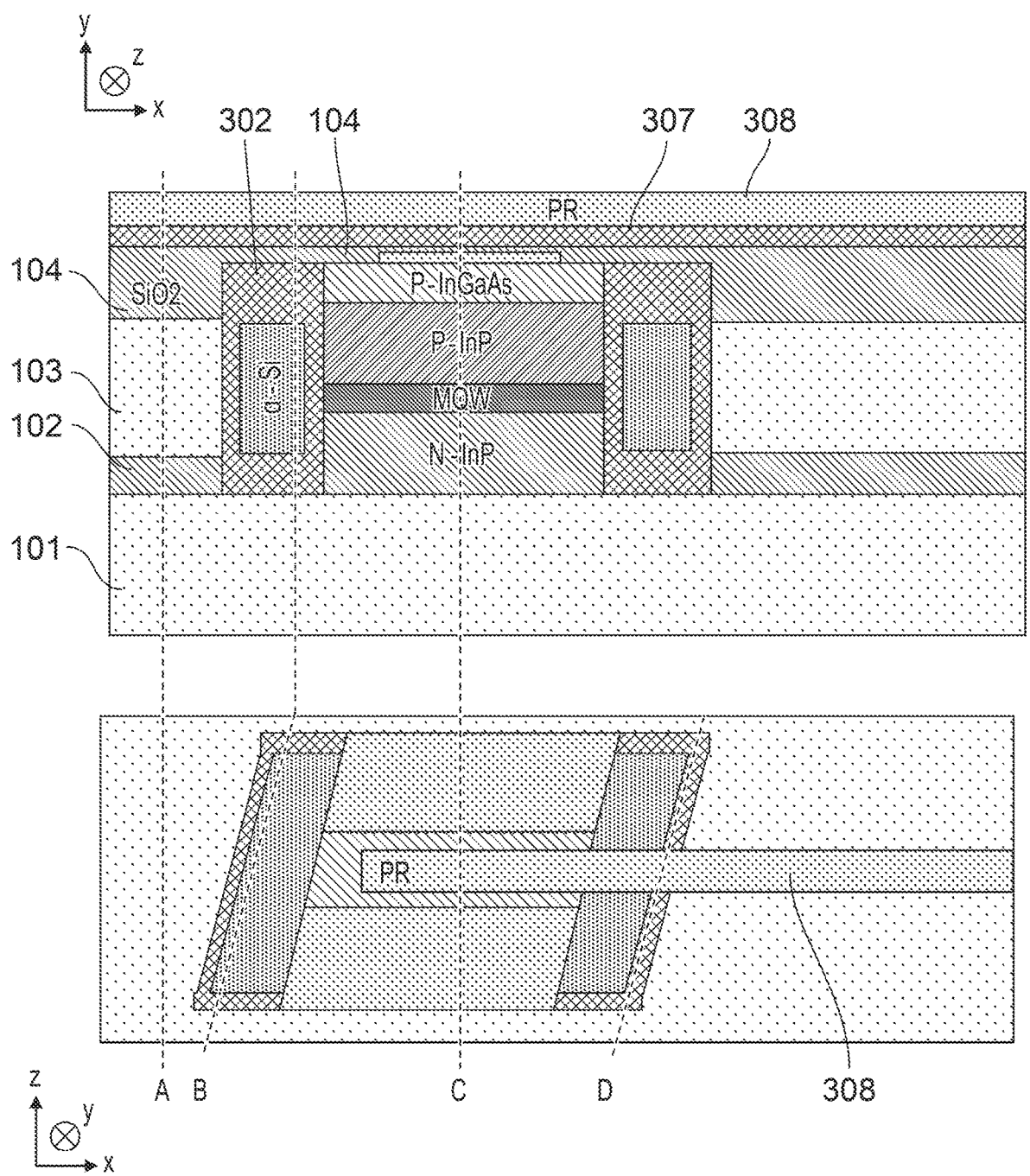
Fig. 3(xiii)

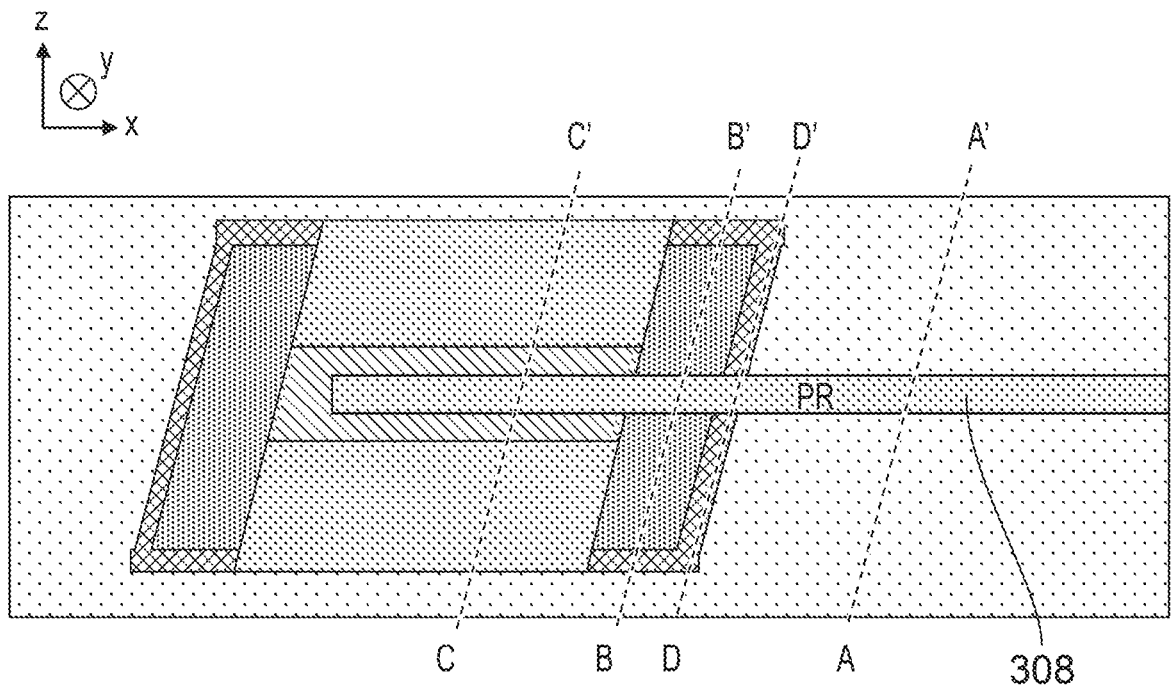
Fig. 3(xiv)
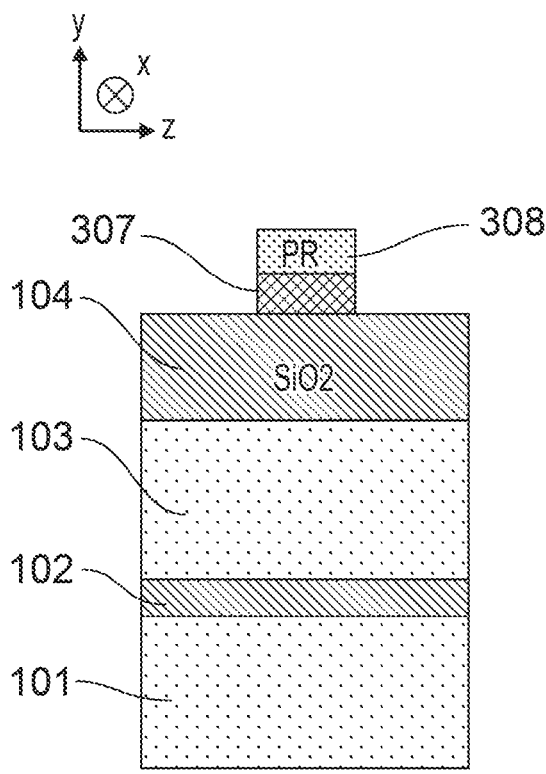 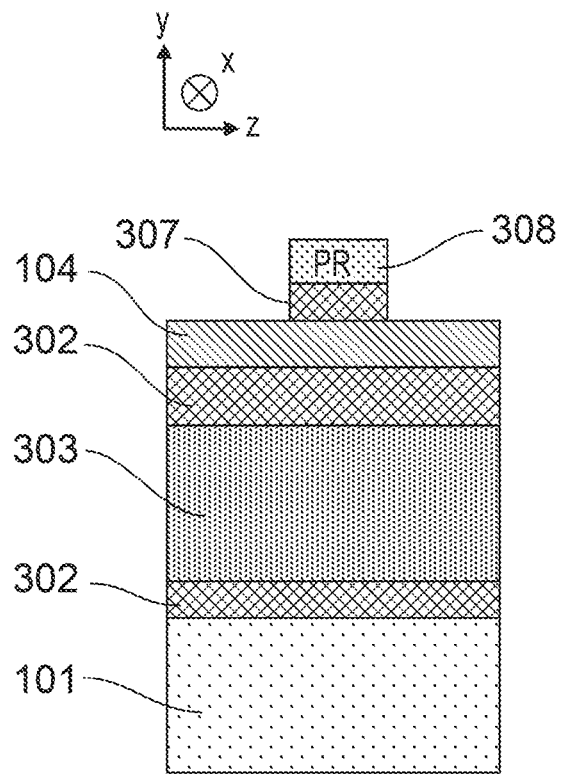
Fig. 3(xiv)(A)                Fig. 3(xiv)(B)

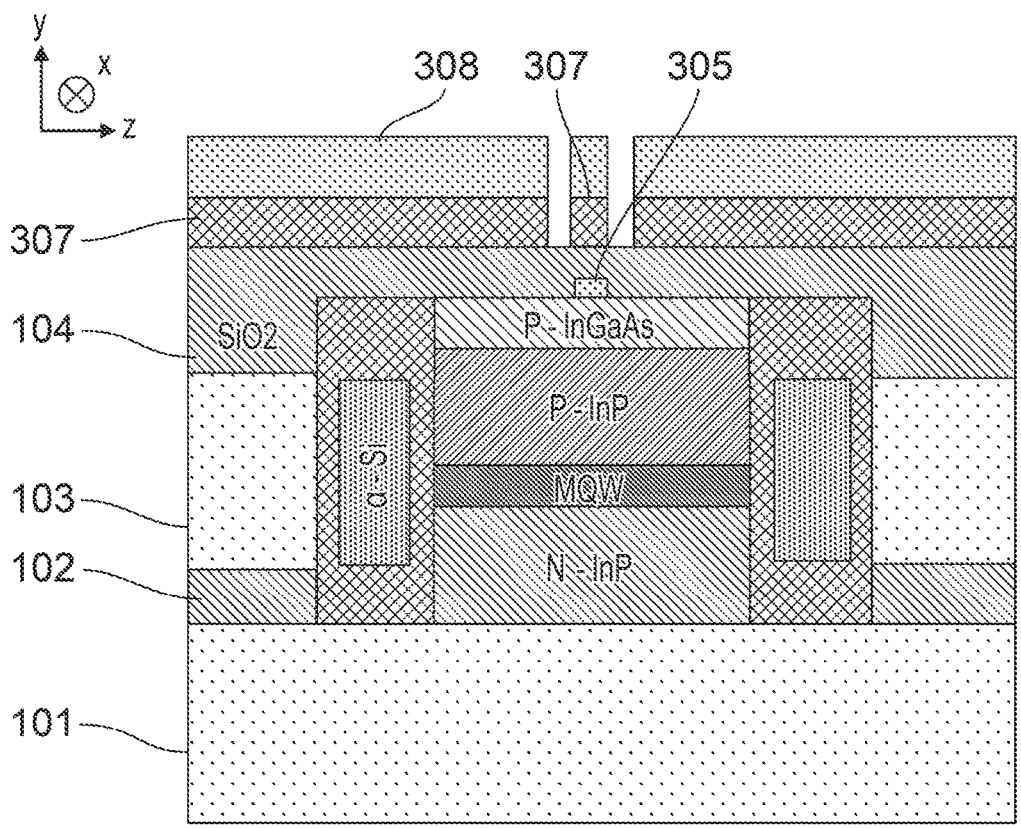
Fig. 3(xiv)(C)
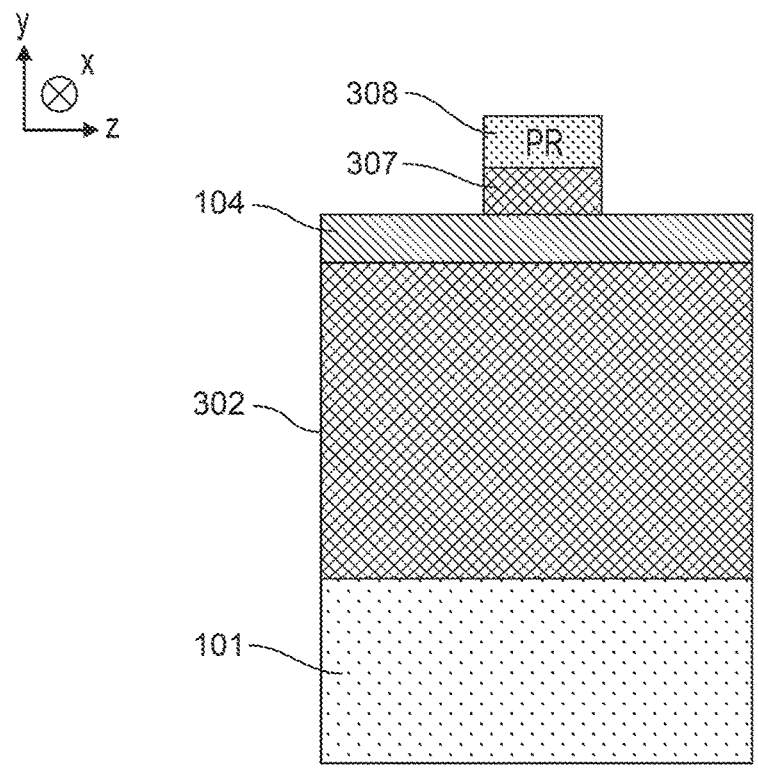
Fig. 3(xiv)(D)

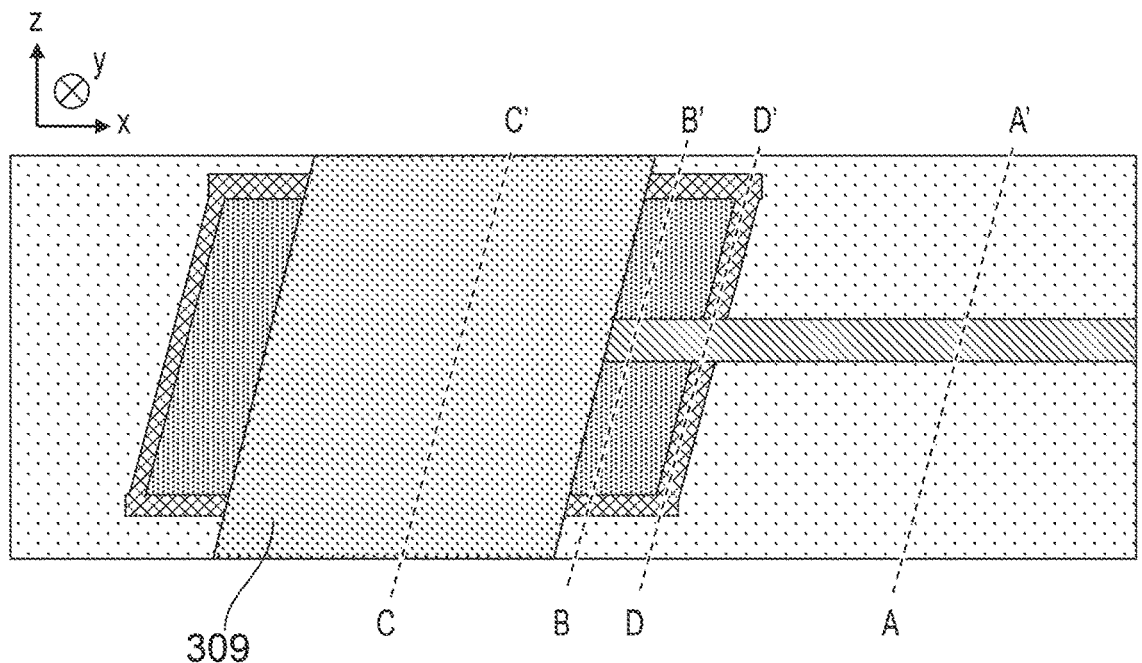
Fig. 3(xvi)
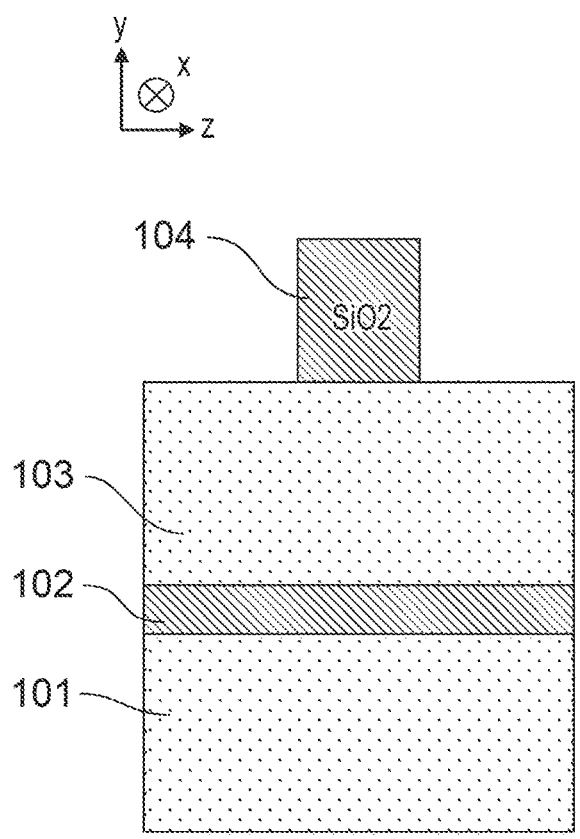
Fig. 3(xvi)(A)
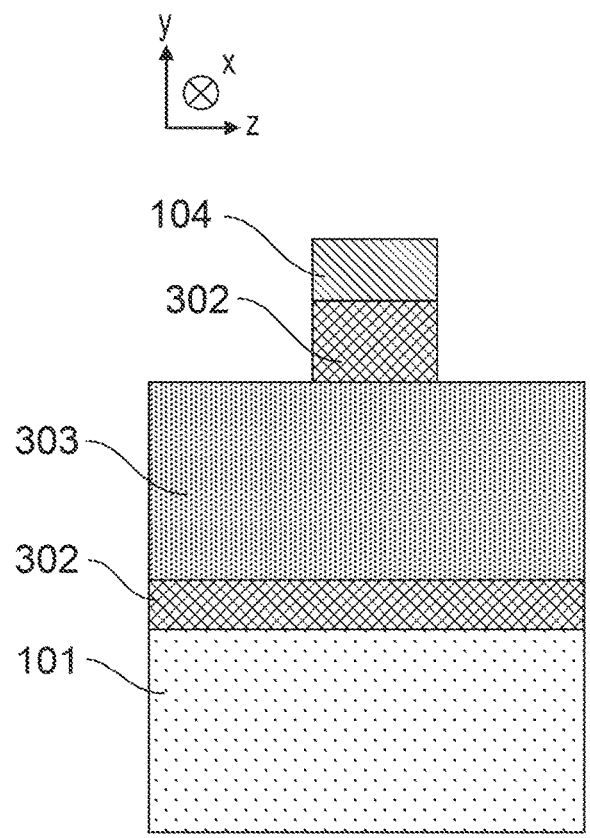
Fig. 3(xvi)(B)

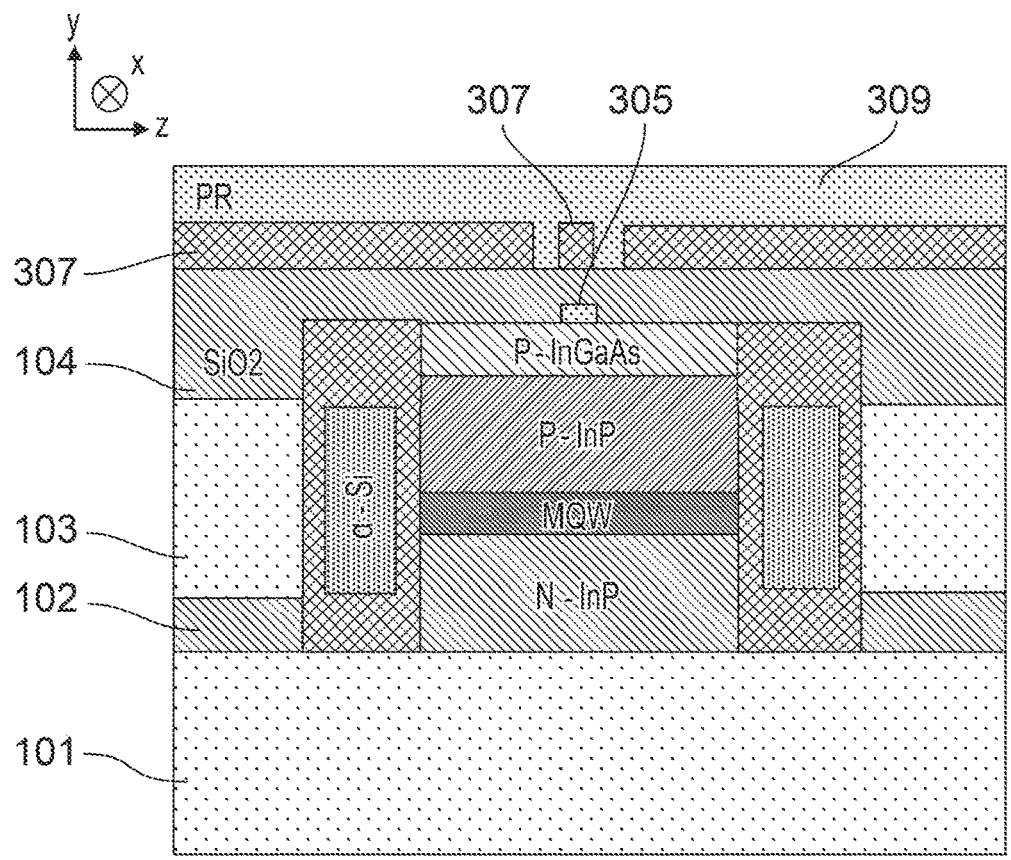
Fig. 3(xvi)(C)
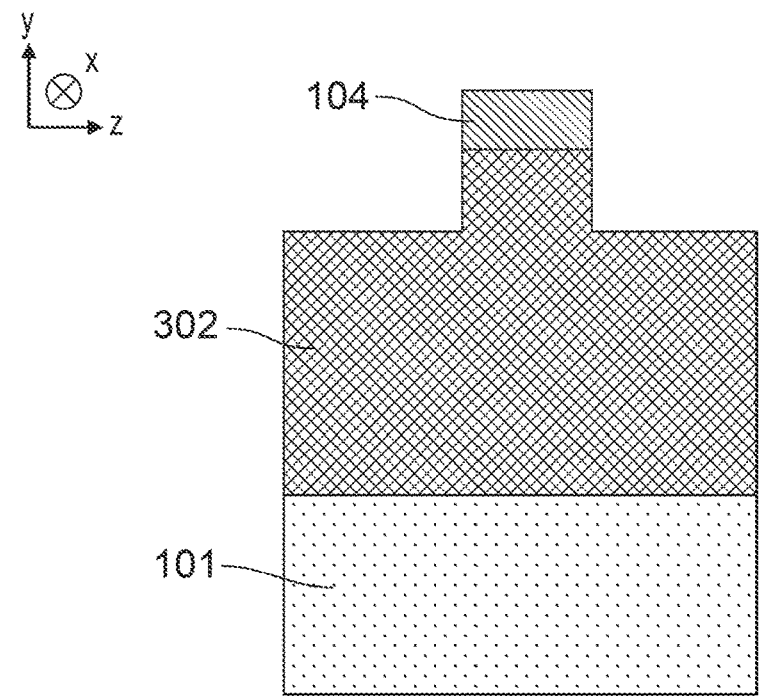
Fig. 3(xvi)(D)

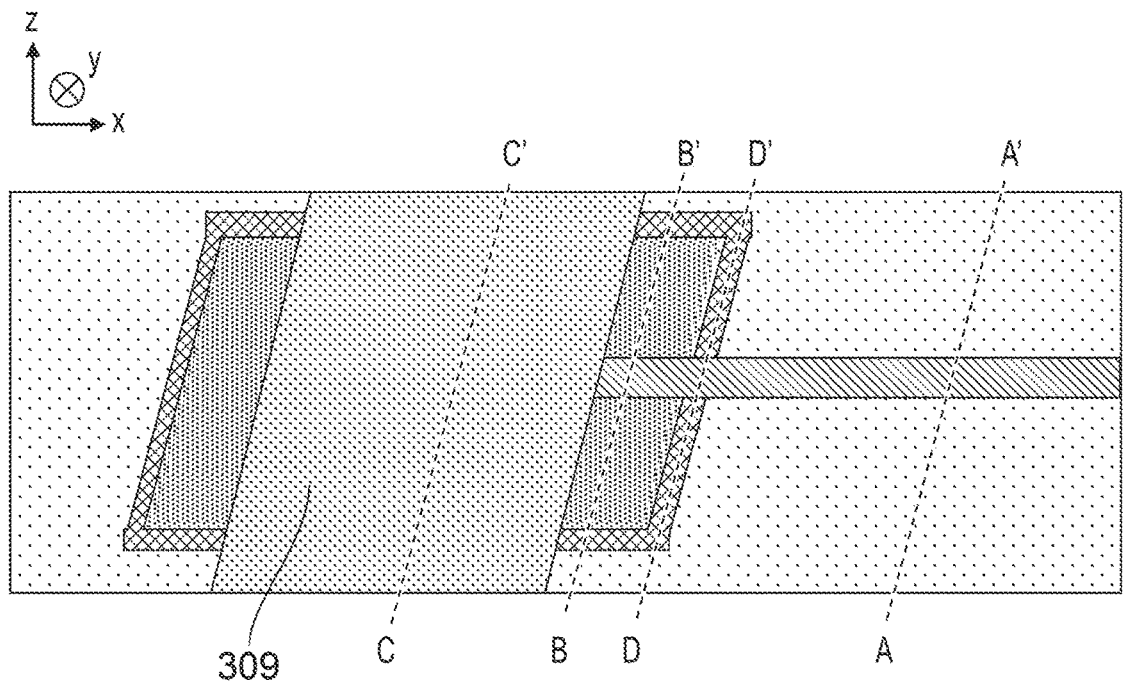
Fig. 3(xvii)
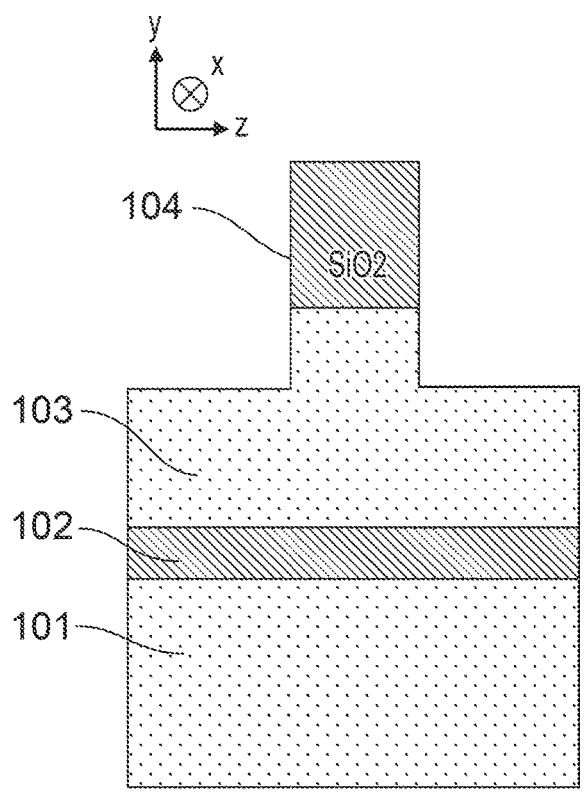
Fig. 3(xvii)(A)
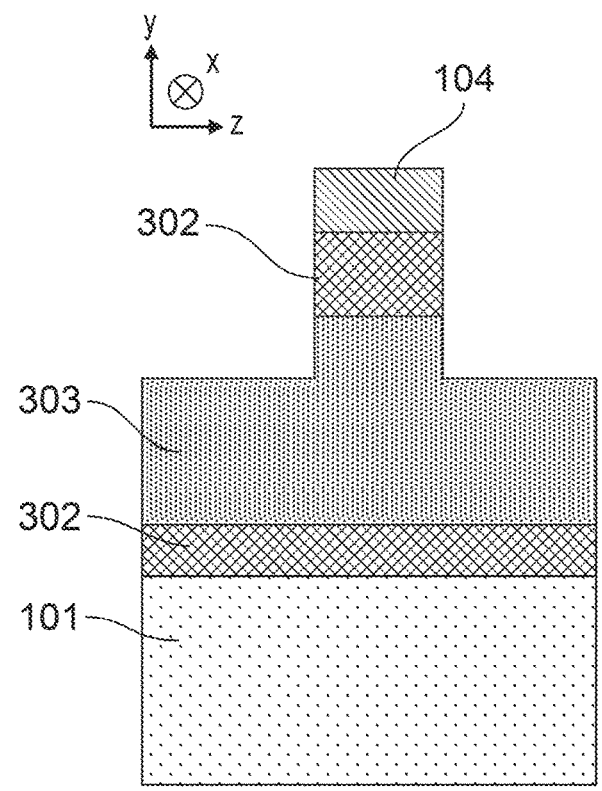
Fig. 3(xvii)(B)

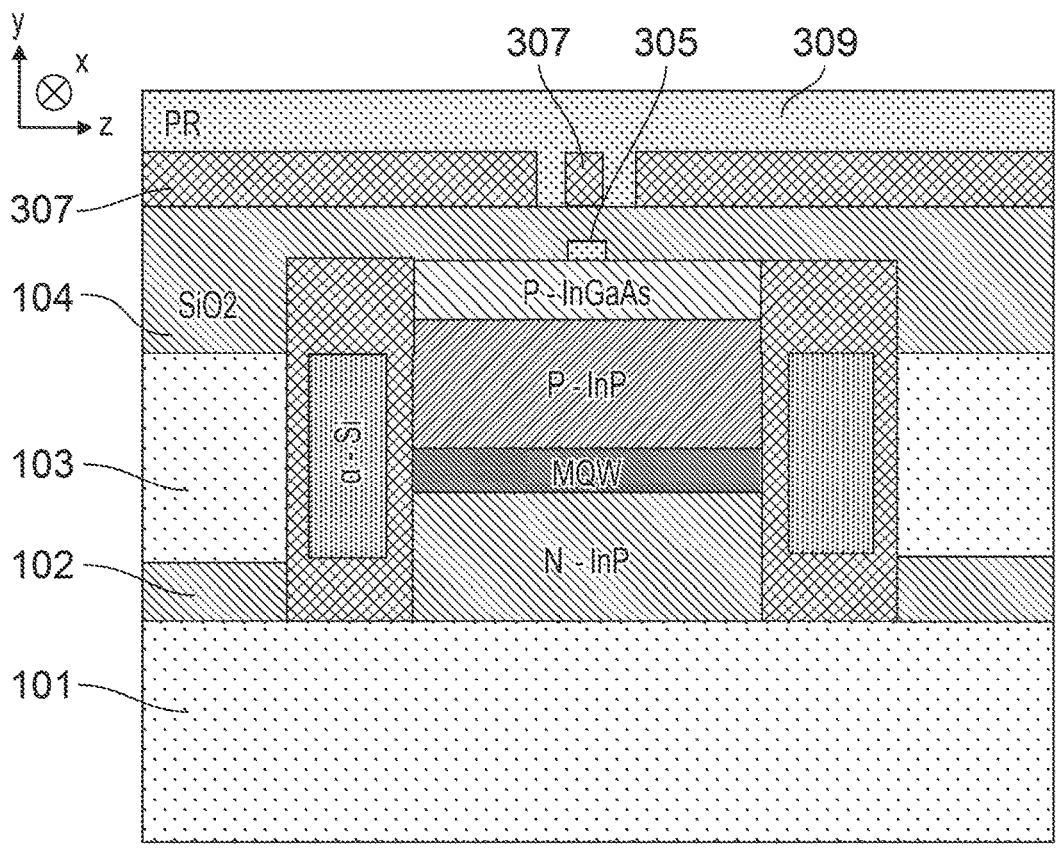
Fig. 3(xvii)(C)
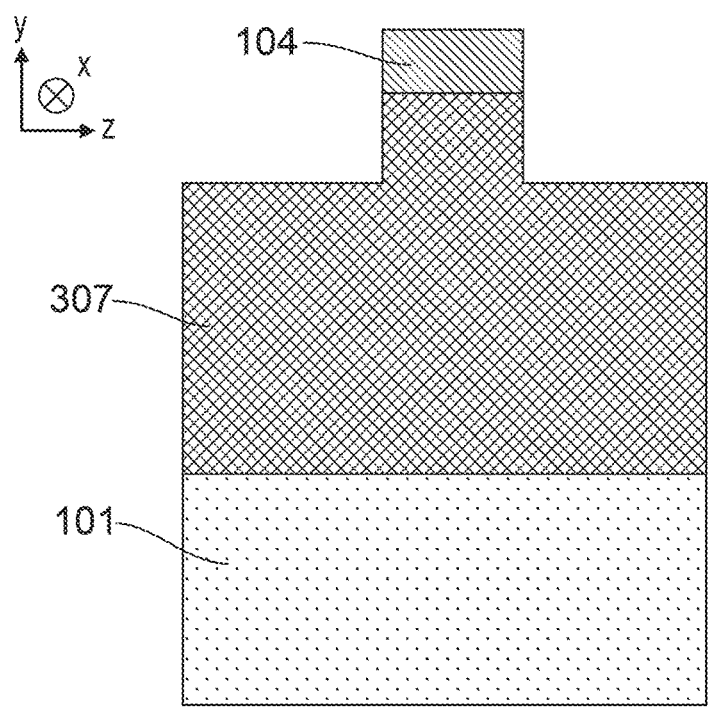
Fig. 3(xvii)(D)

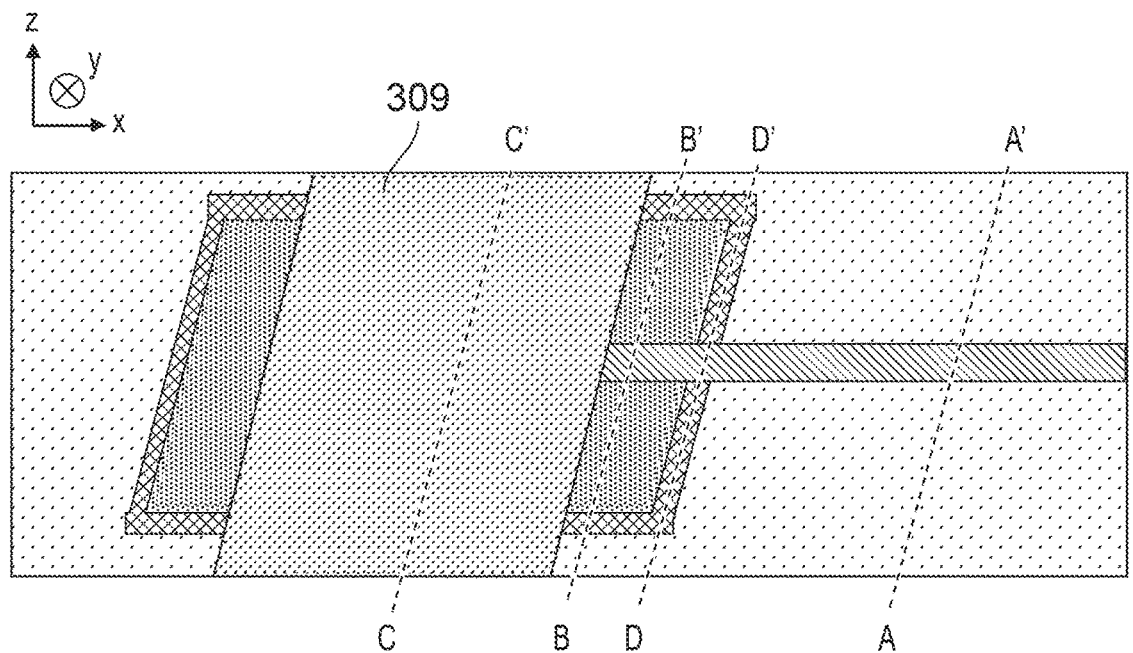
Fig. 3(xviii)
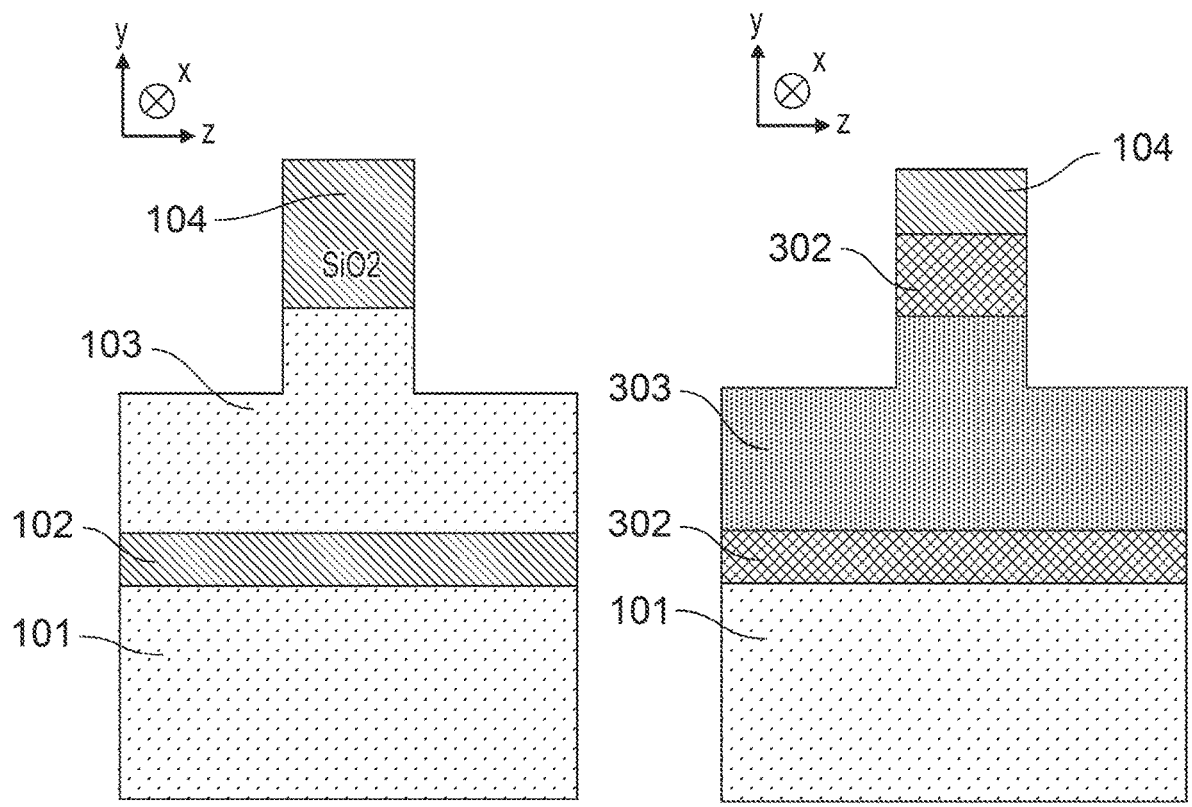
Fig. 3(xviii)(A)    Fig. 3(xviii)(B)

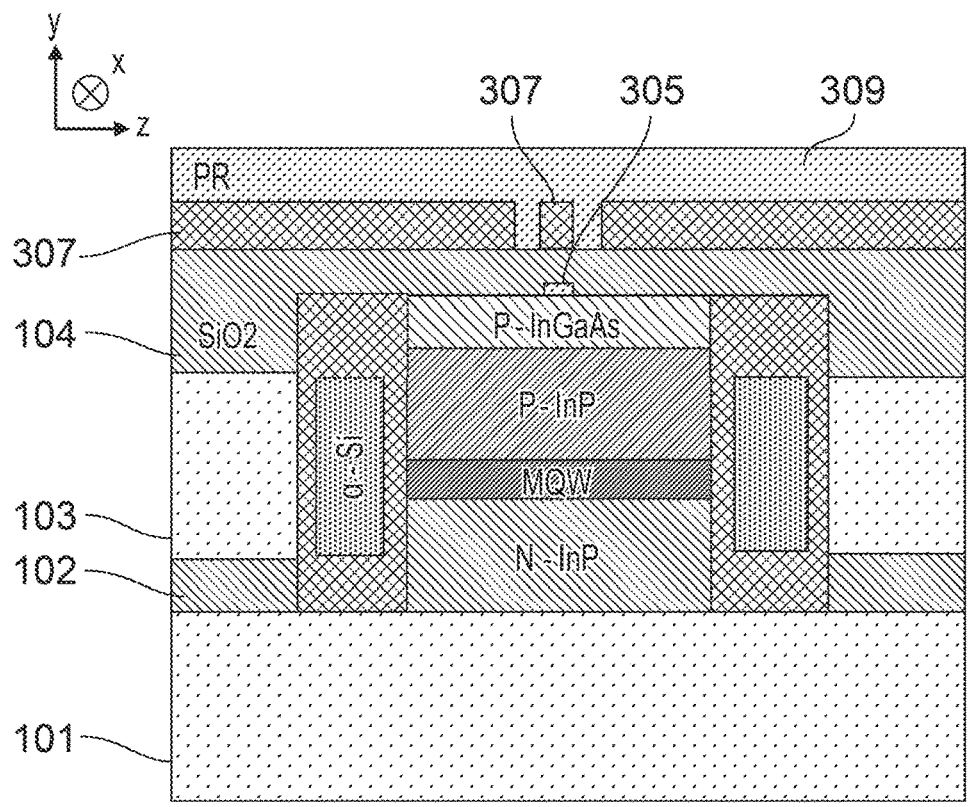
Fig. 3(xviii)(C)
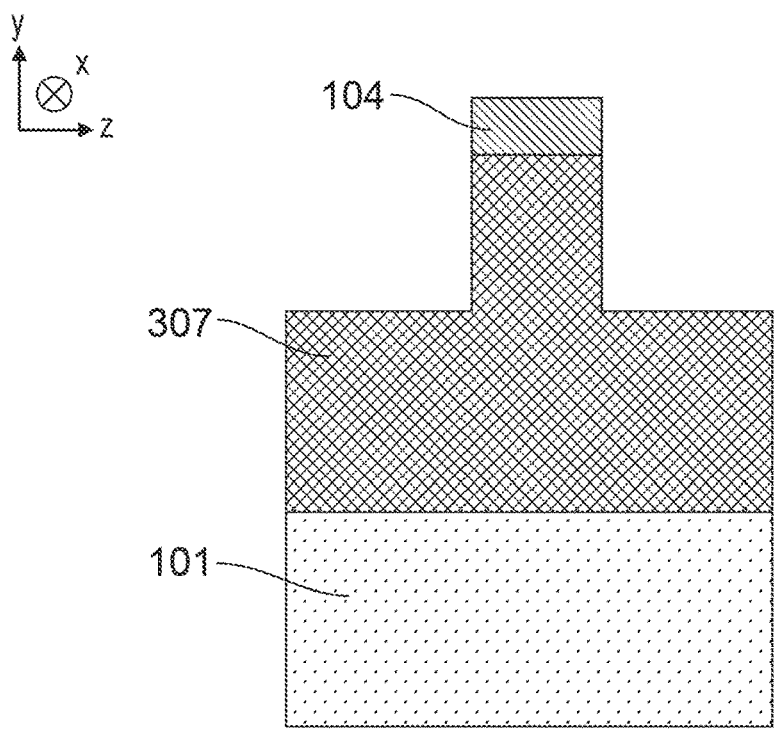
Fig. 3(xviii)(D)

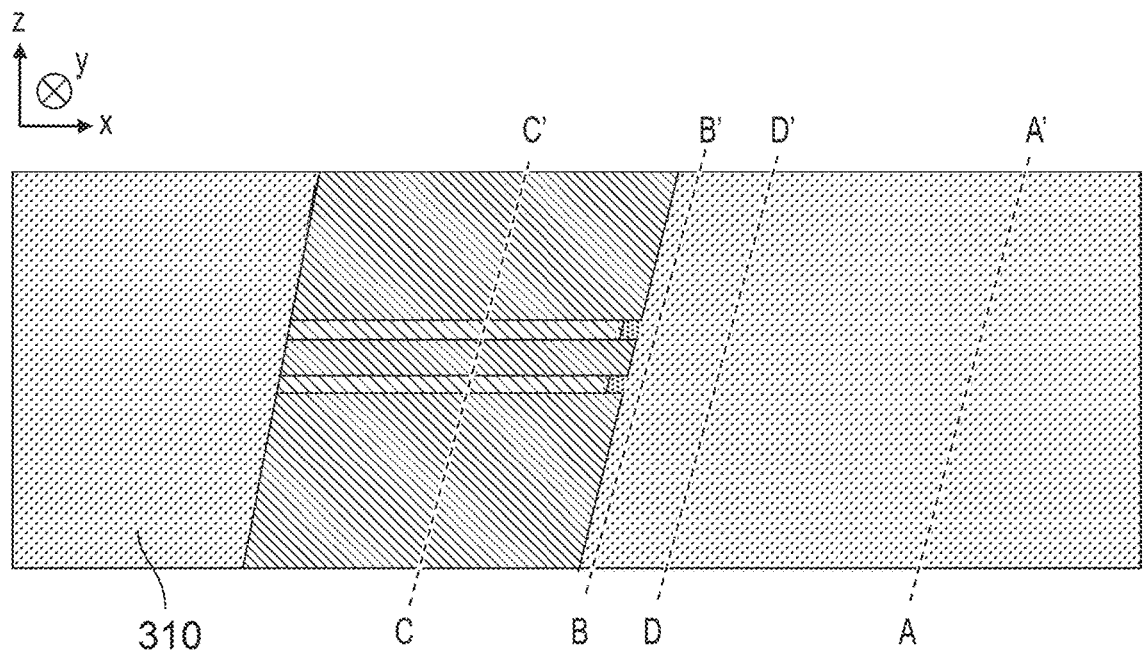
Fig. 3(xix)
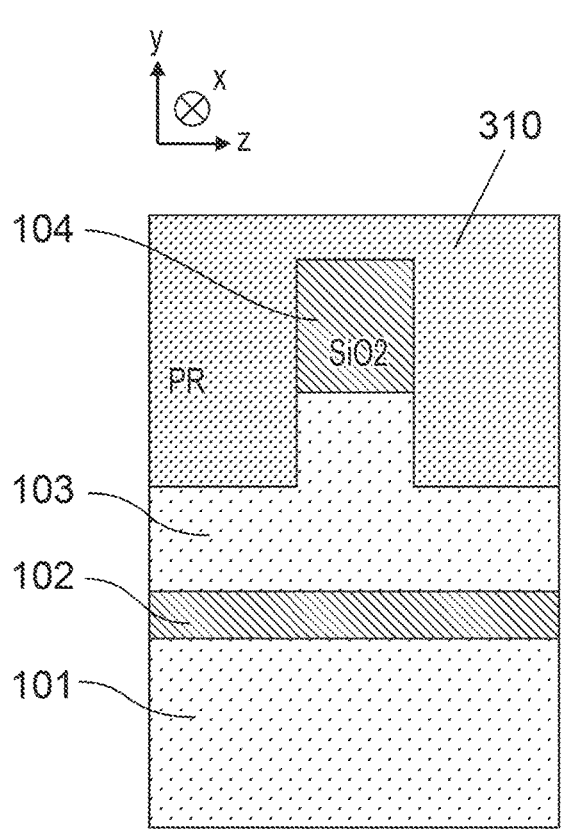
Fig. 3(xix)(A)
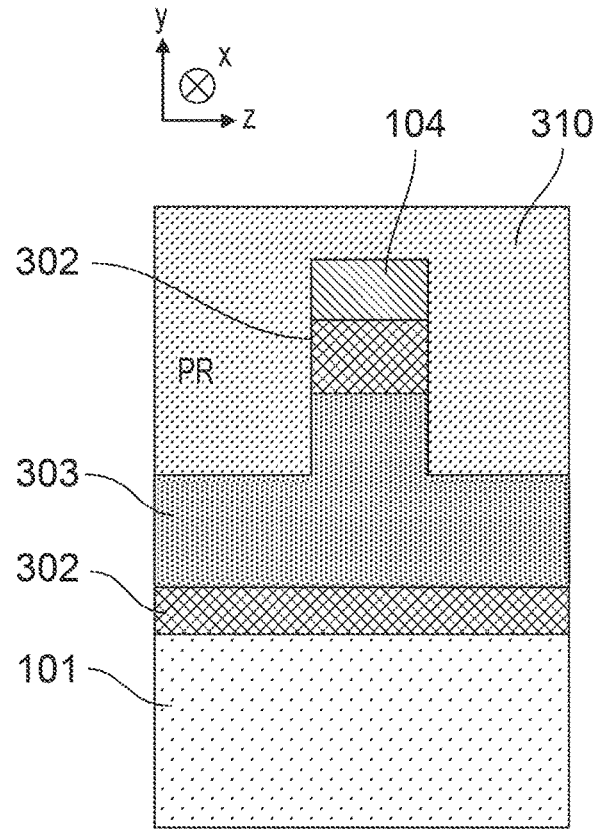
Fig. 3(xix)(B)

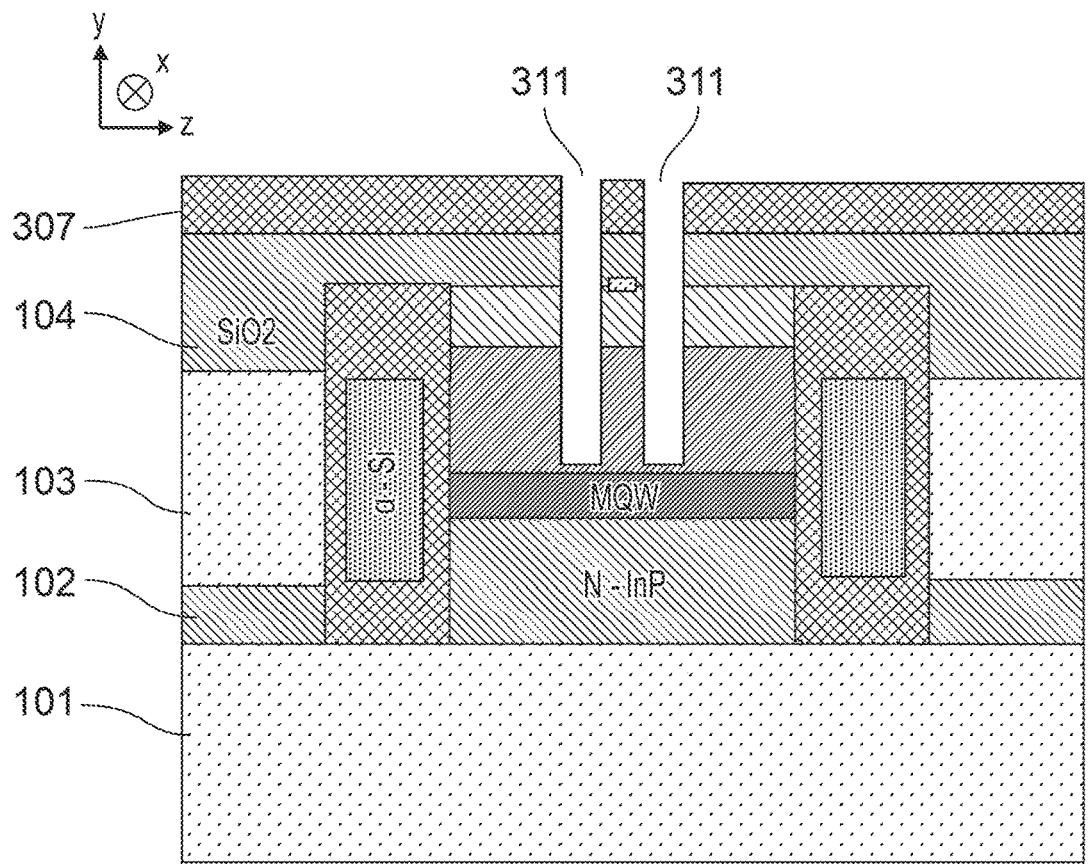
Fig. 3(xix)(C)
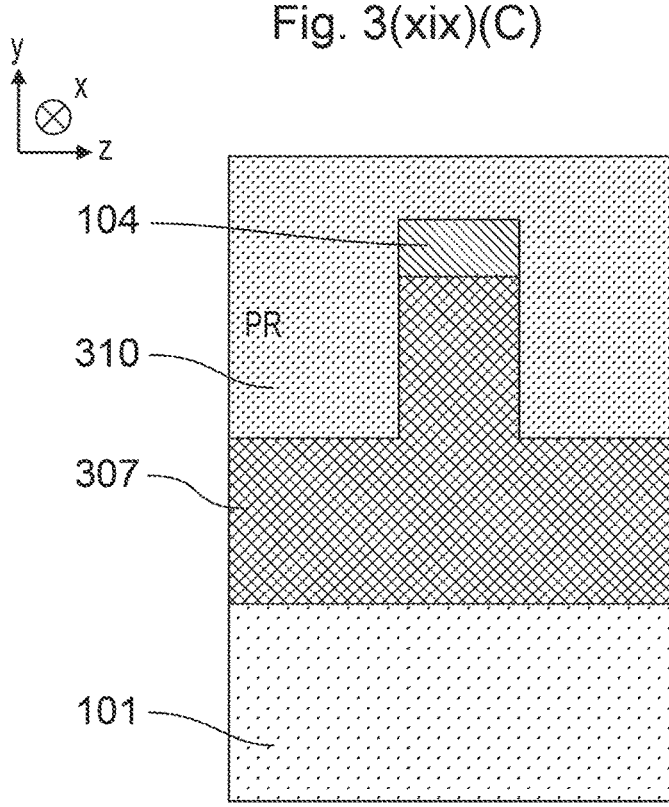
Fig. 3(xix)(D)

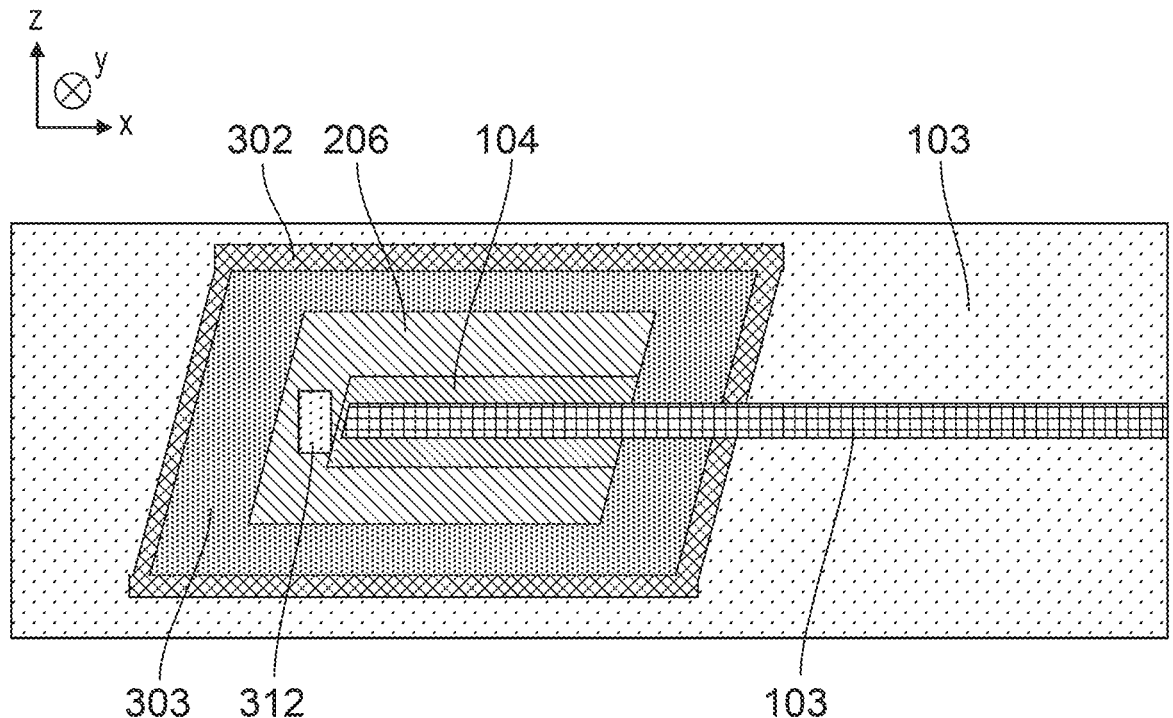
Fig. 3(xxi)
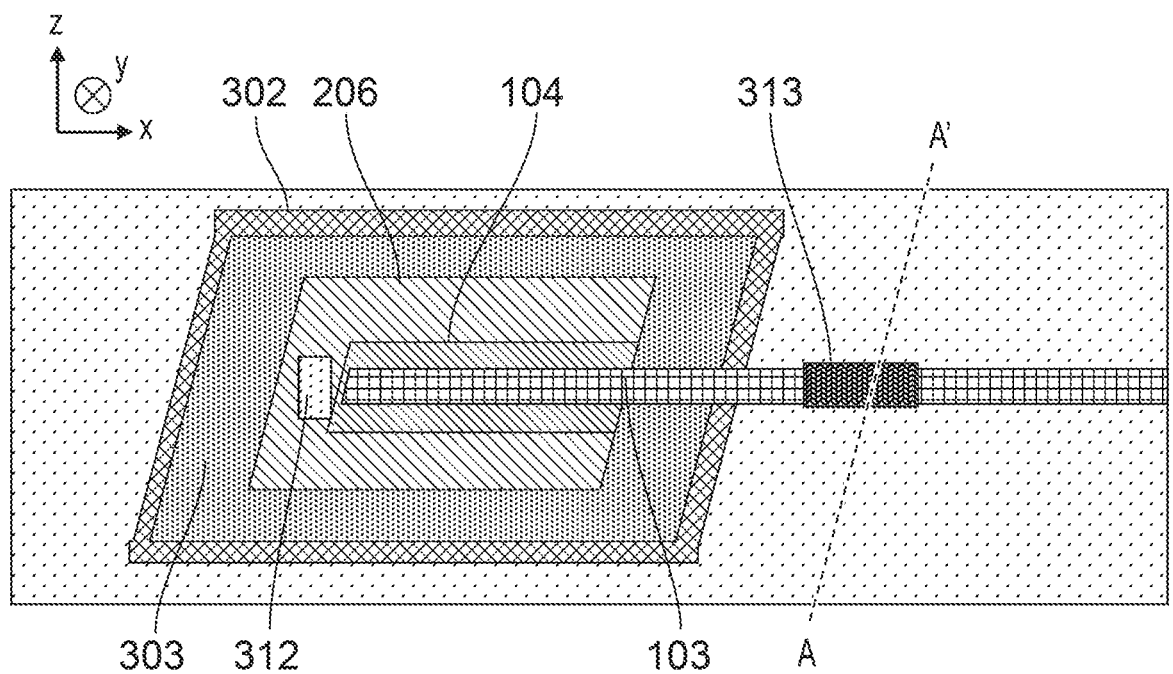
Fig. 3(xxi')

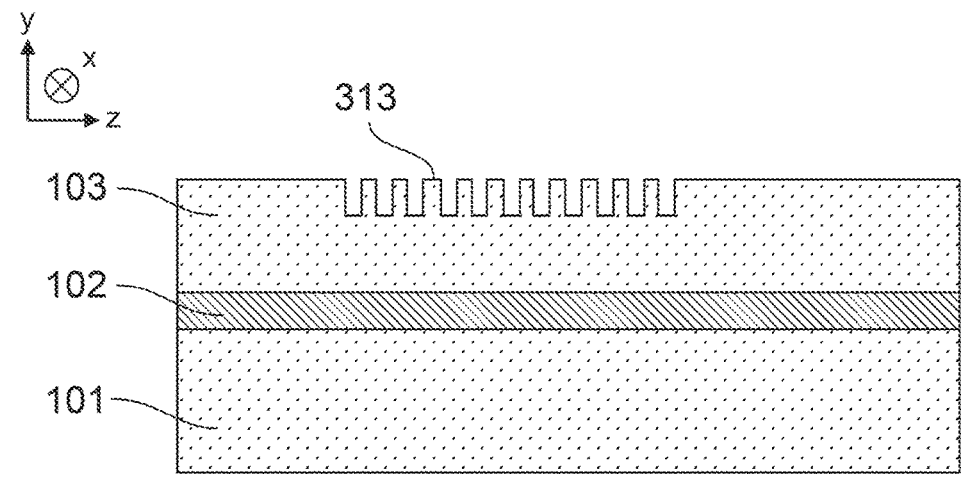
Fig. 3(xxi')(A)
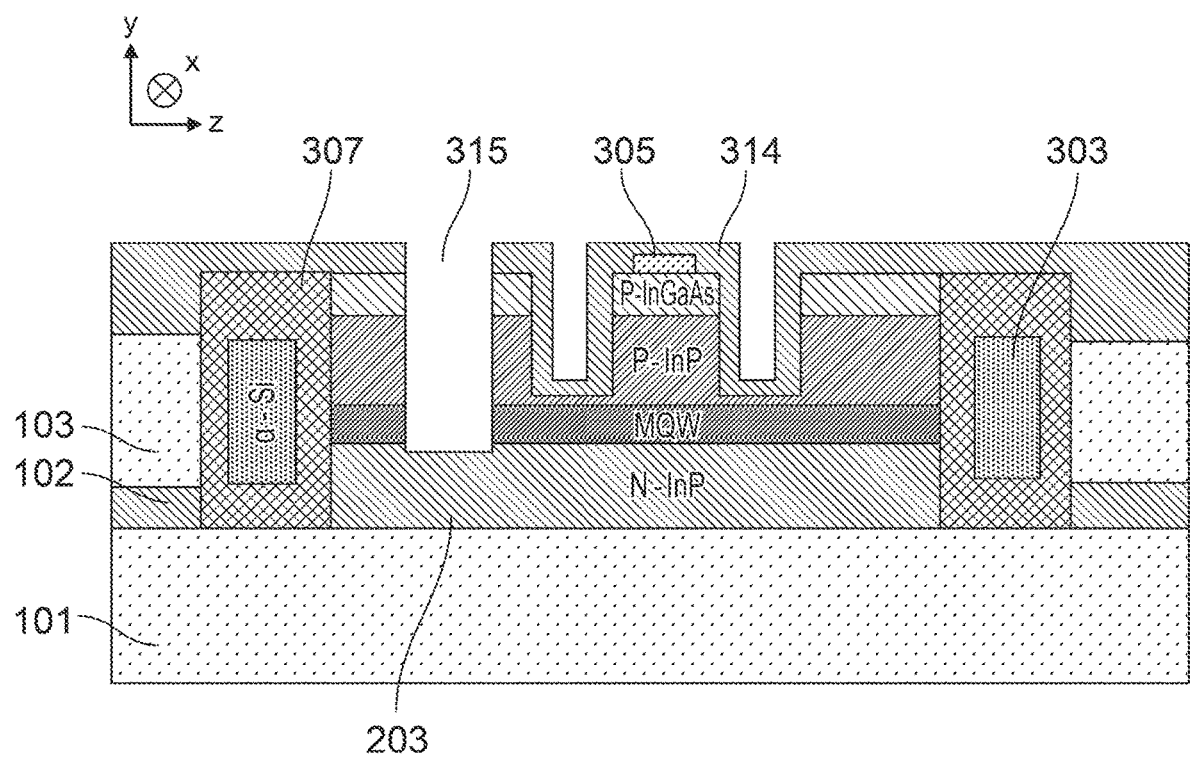
Fig. 3(xxii)

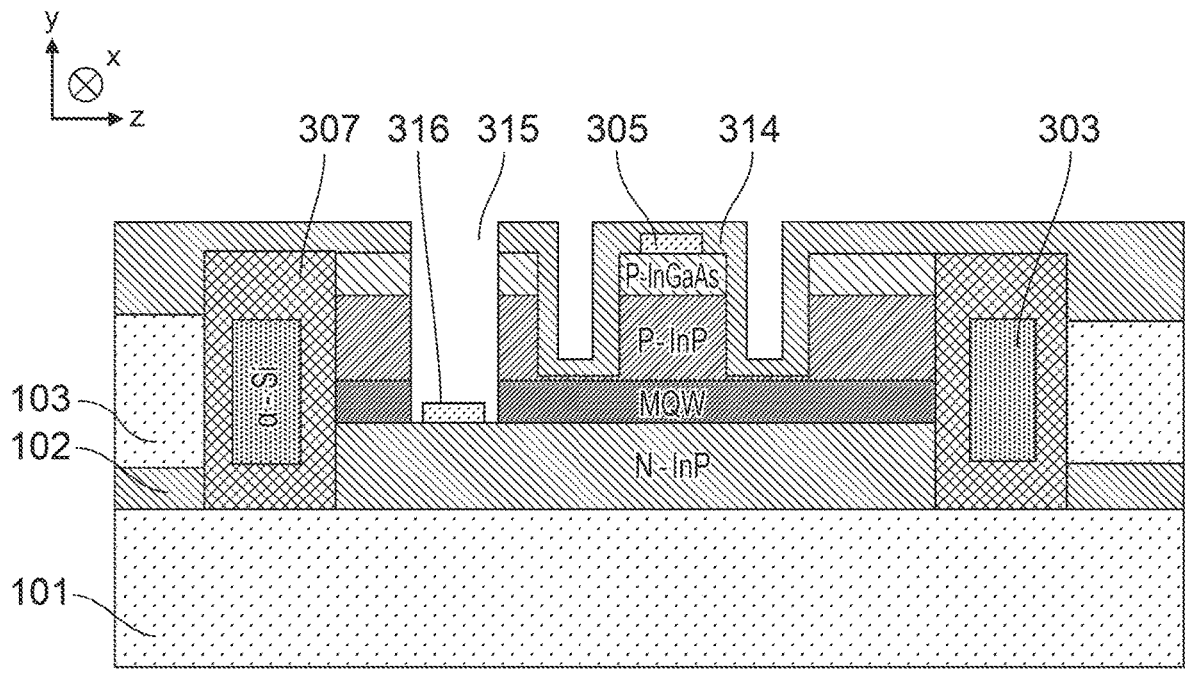
Fig. 3(xxiii)
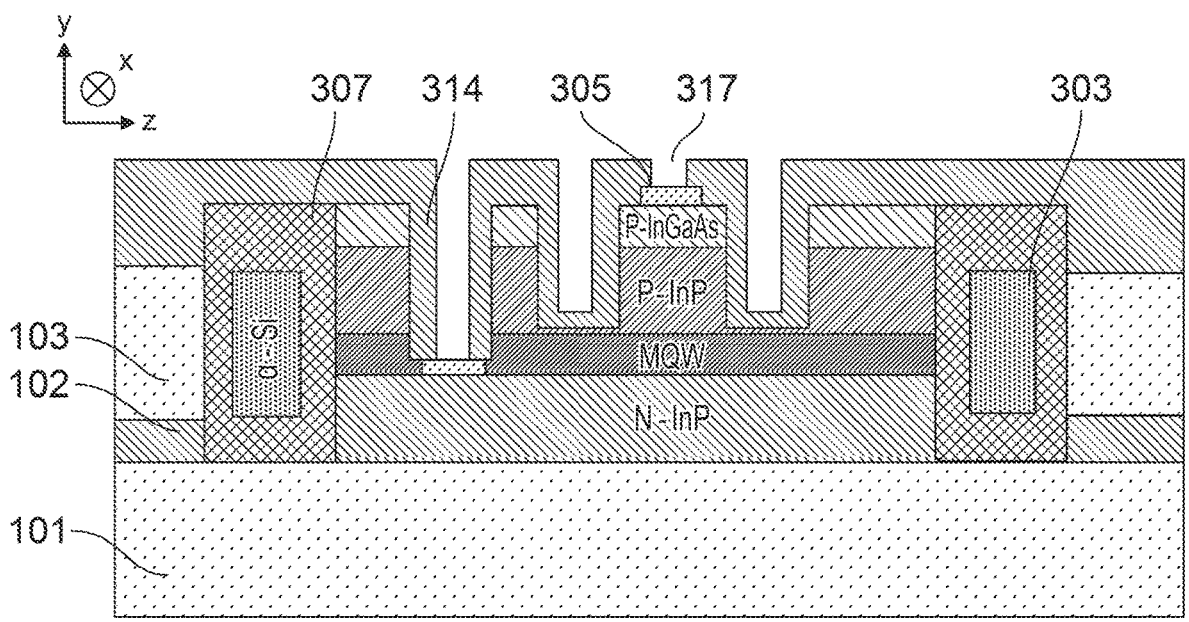
Fig. 3(xxiv)

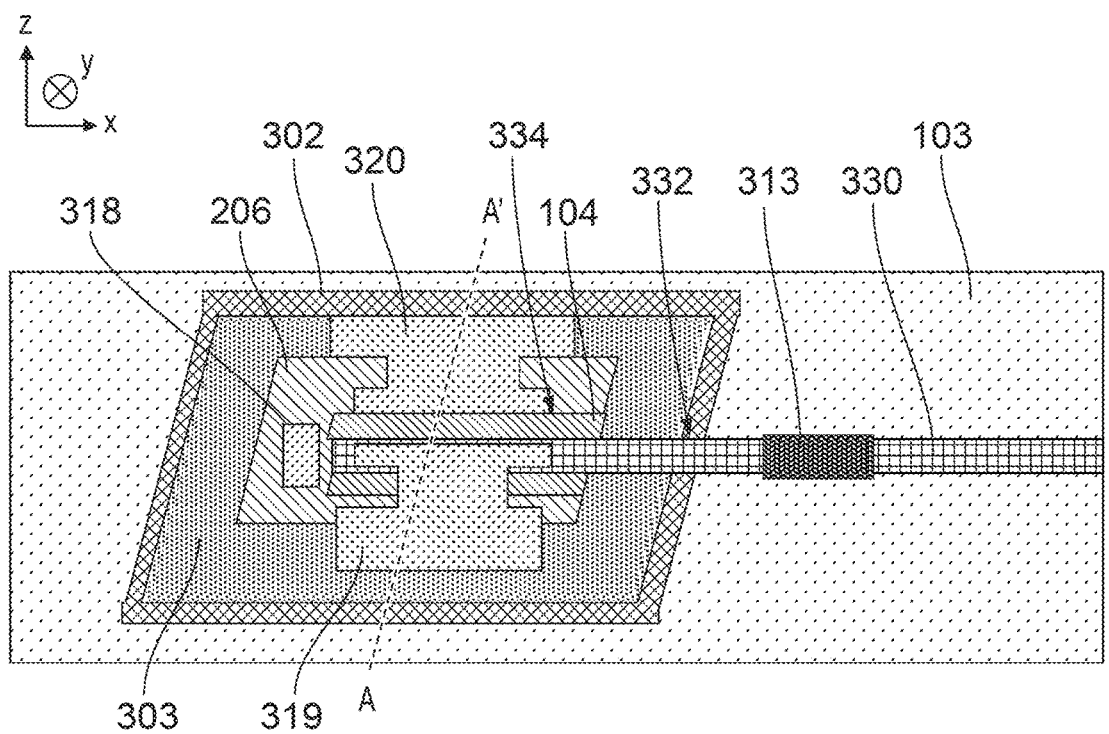
Fig. 3(xxv)
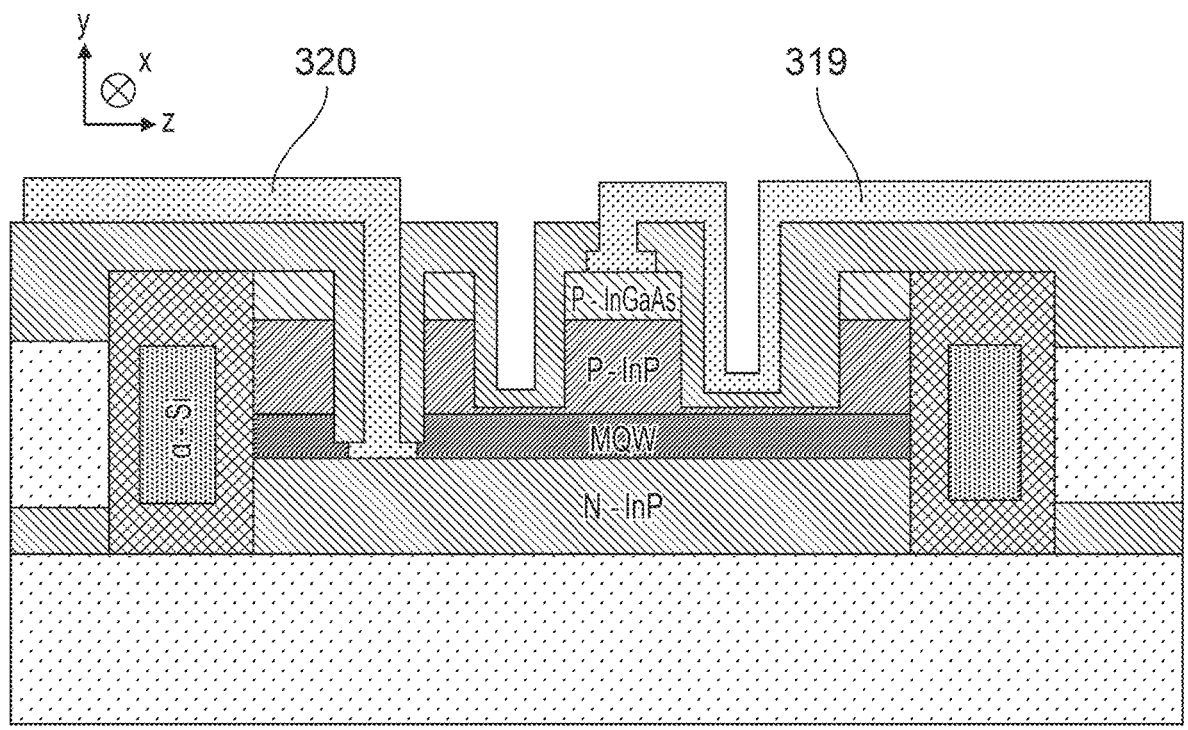
Fig. 3(xxv)(A)

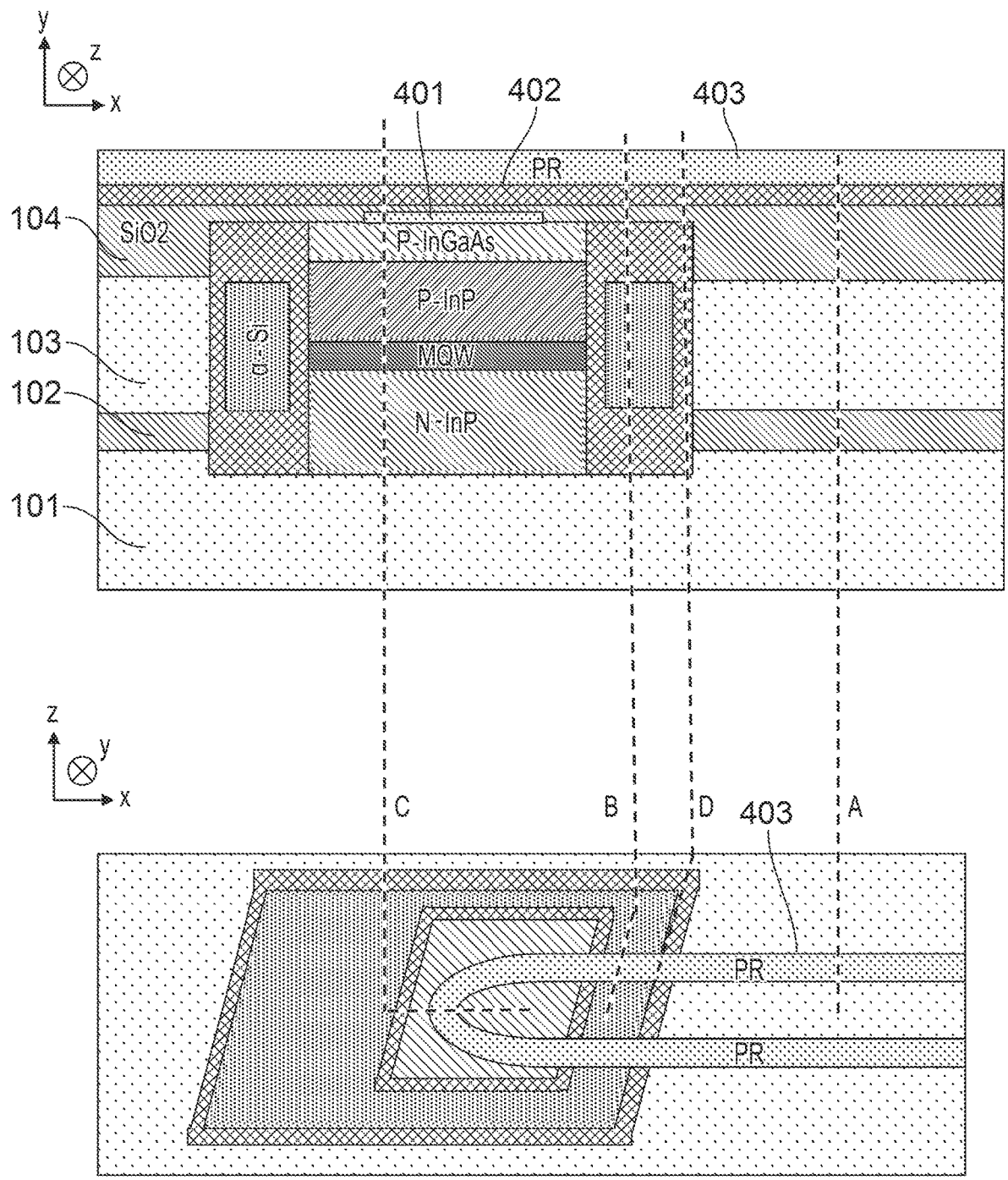
Fig. 4(iii)

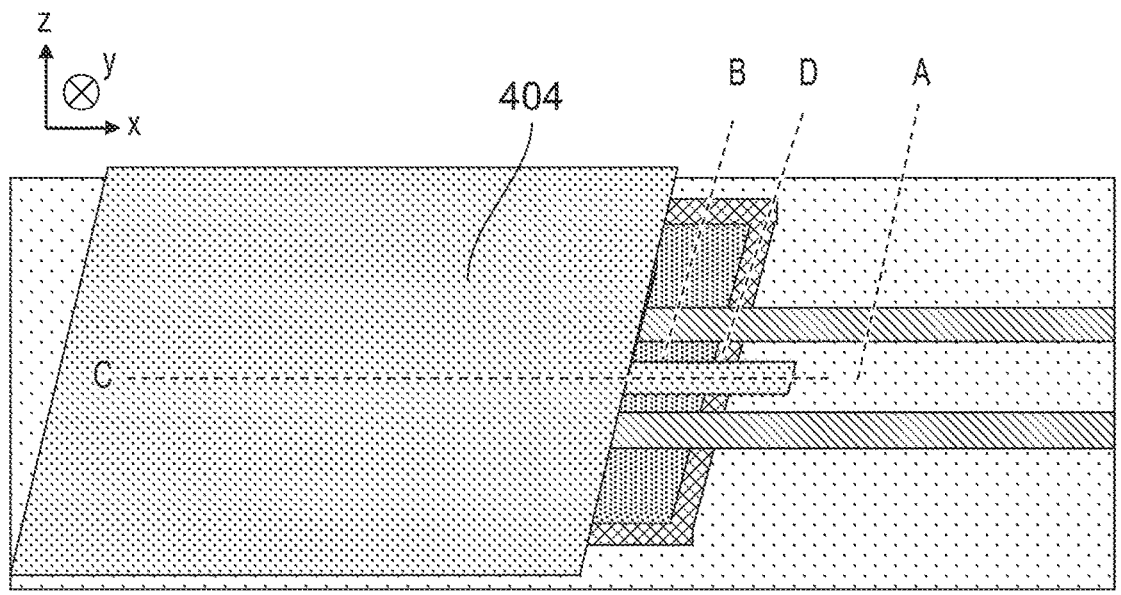
Fig. 4(vii)
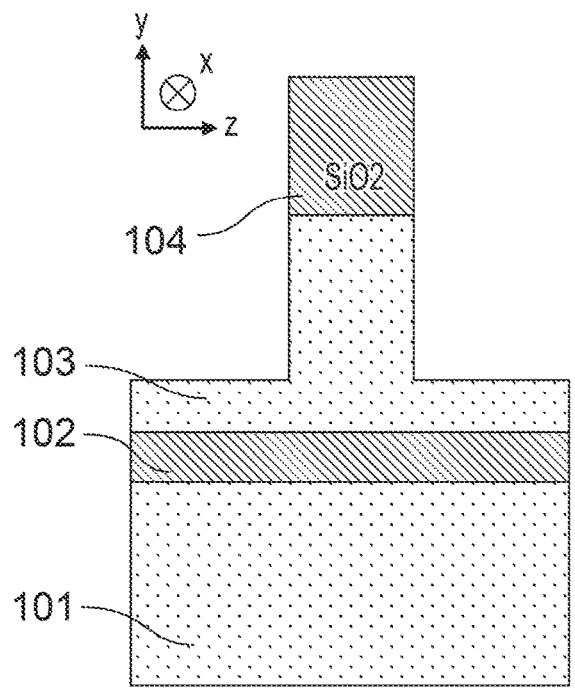
Fig. 4(vii)(A)
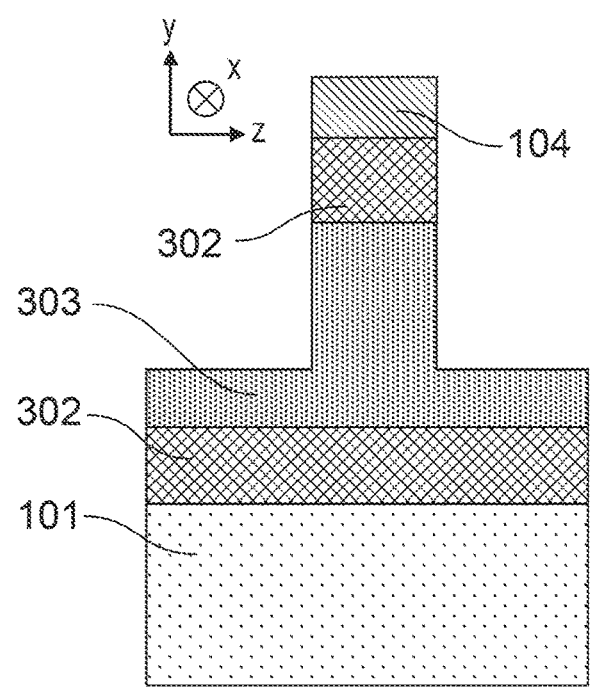
Fig. 4(vii)(B)

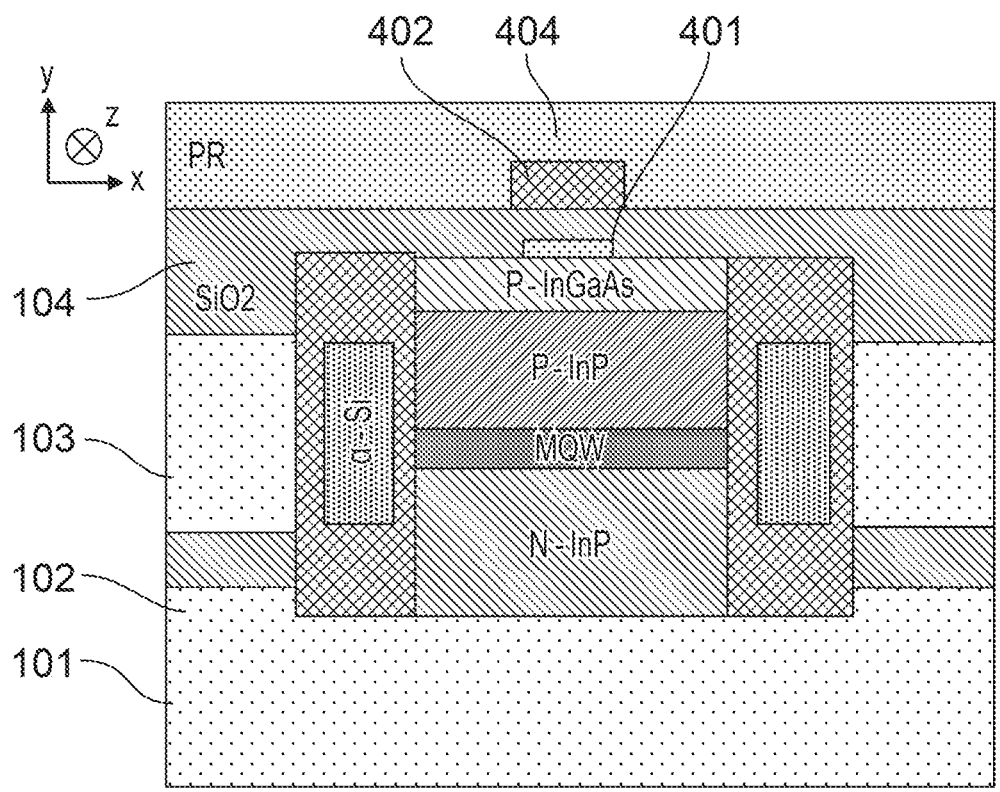
Fig. 4(vii)(C)
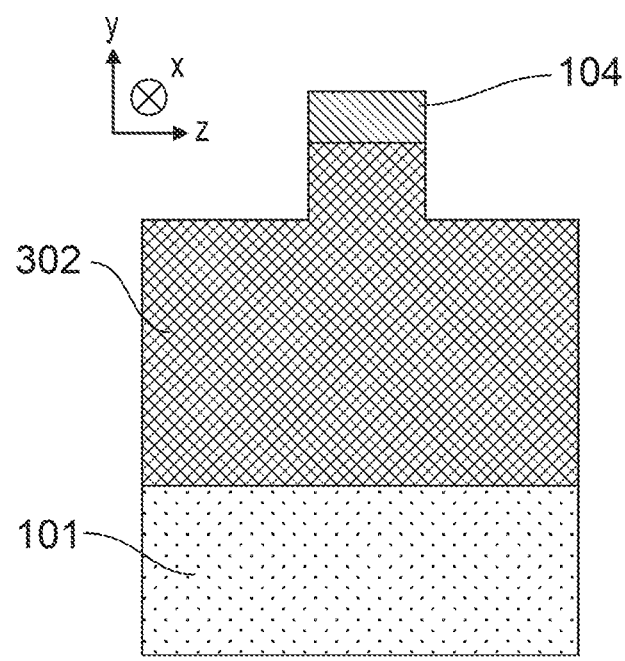
Fig. 4(vii)(D)

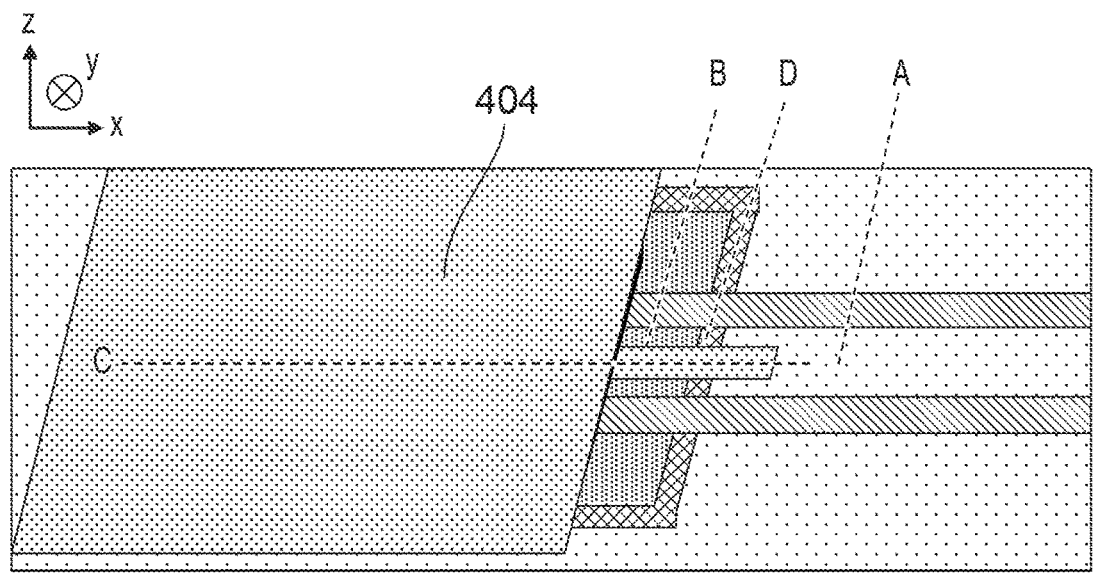
Fig. 4(viii)
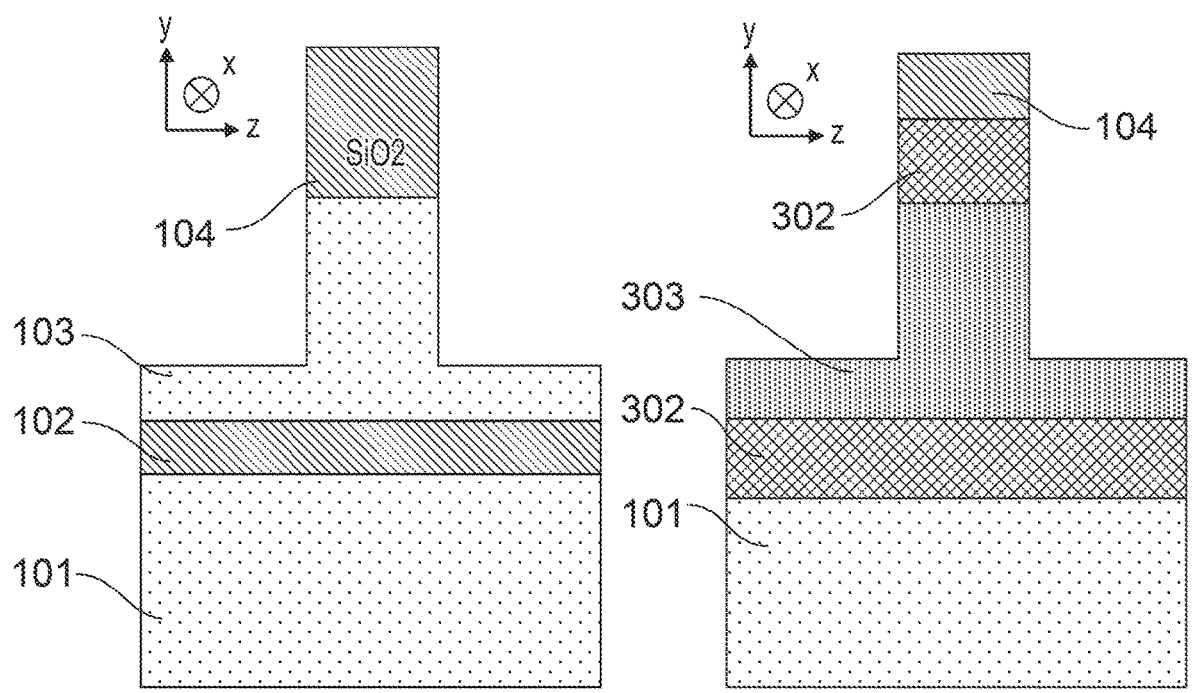
Fig. 4(viii)(A)  Fig. 4(viii)(B)

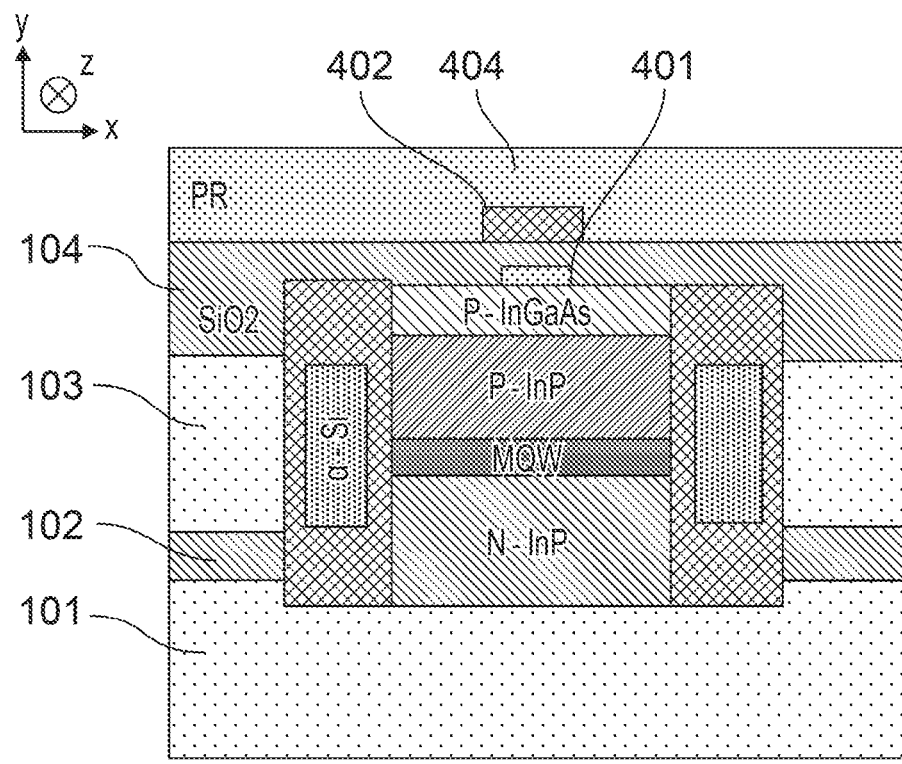
Fig. 4(viii)(C)
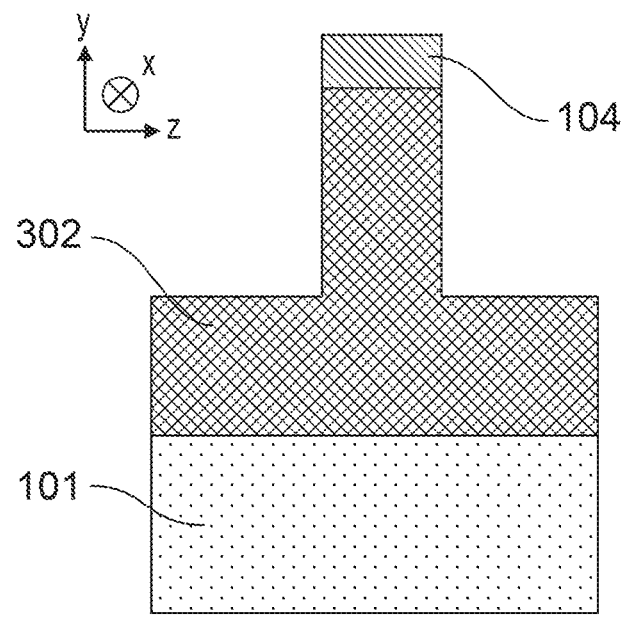
Fig. 4(viii)(D)

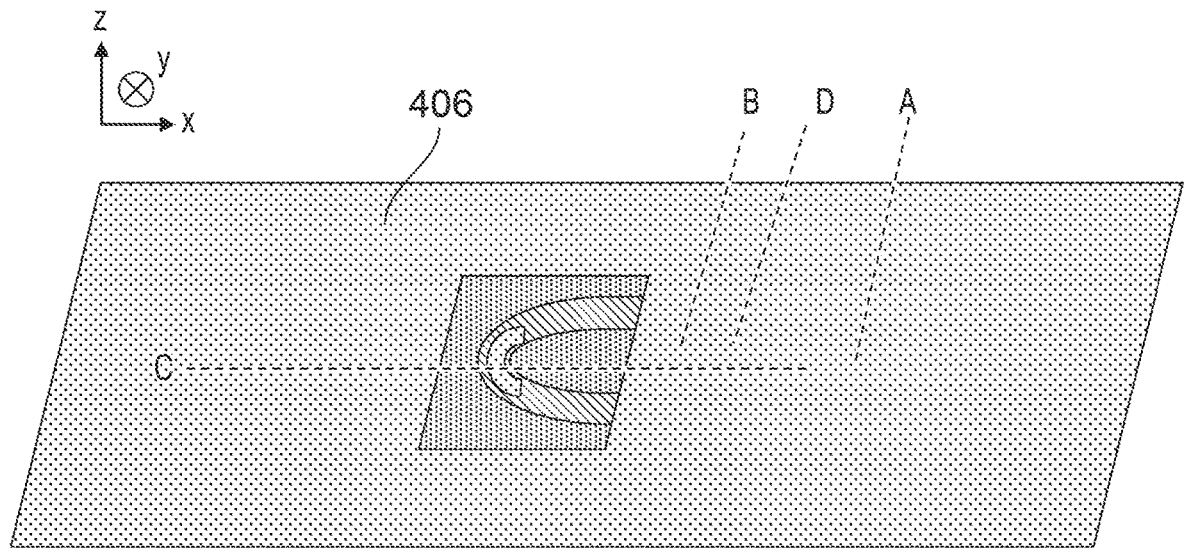
Fig. 4(xii)
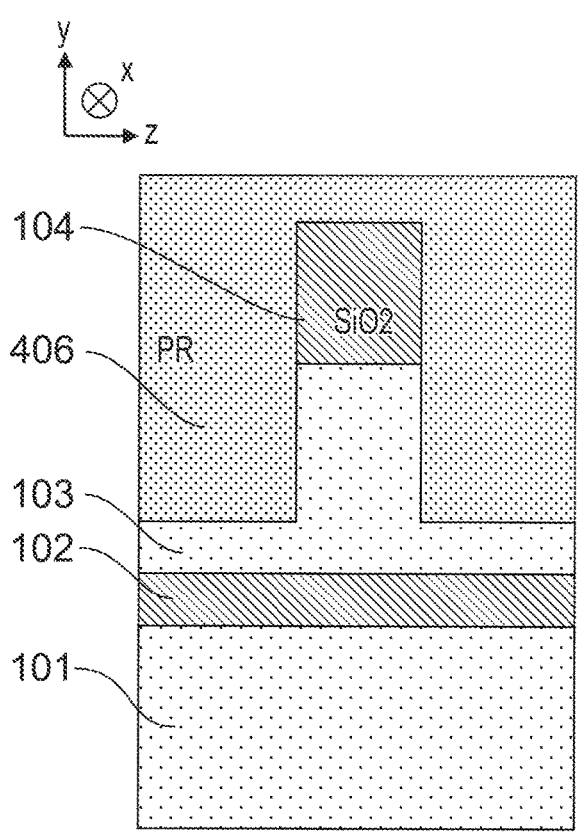
Fig. 4(xii)(A)
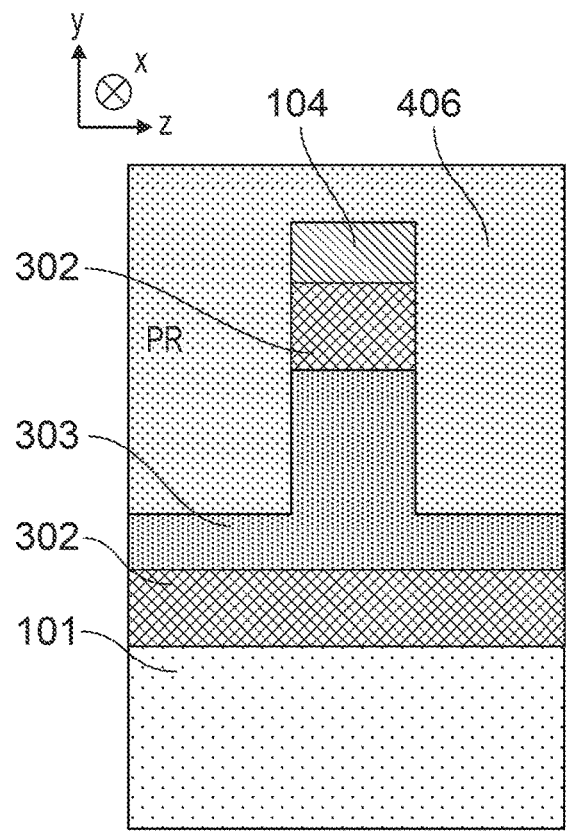
Fig. 4(xii)(B)

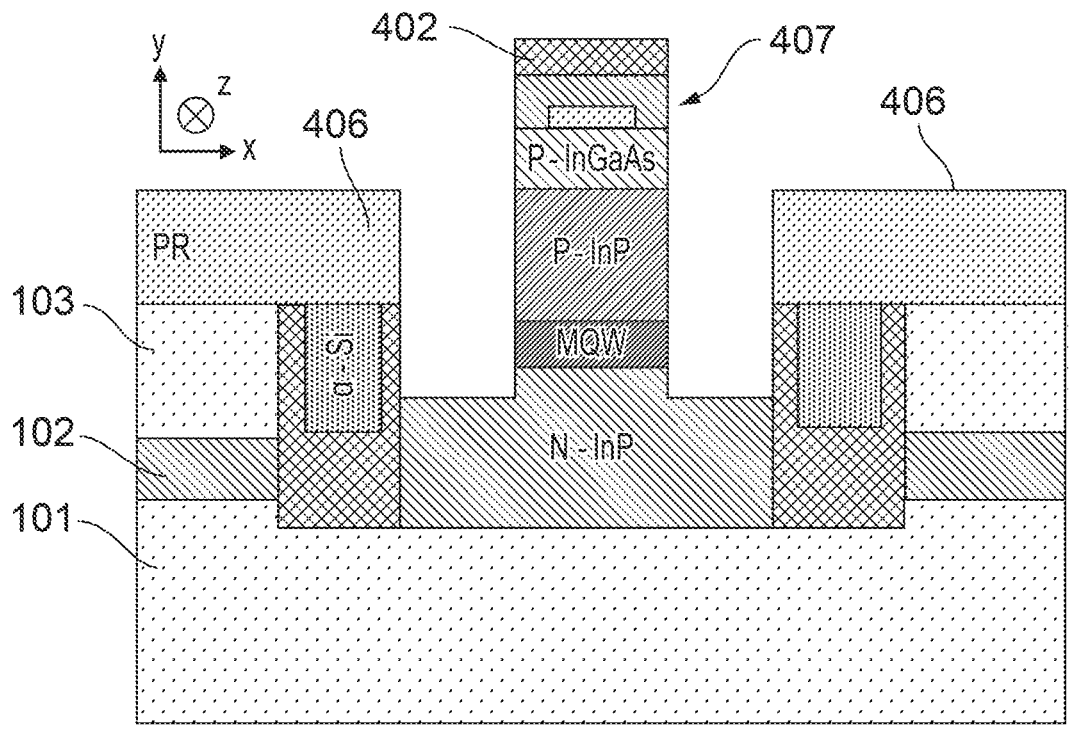
Fig. 4(xii)(C)
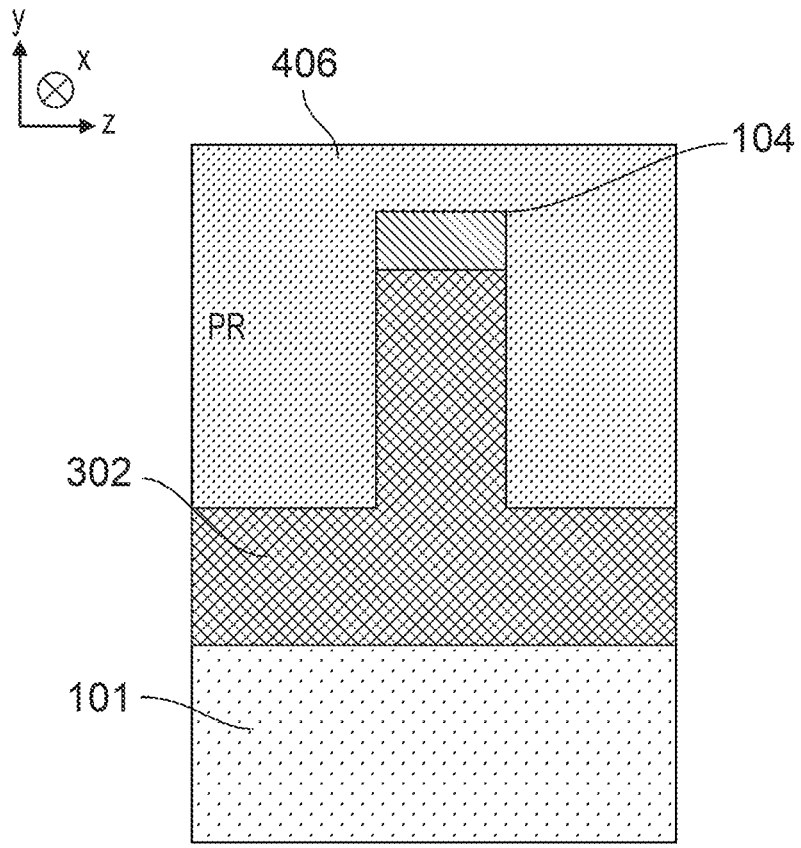
Fig. 4(xii)(D)

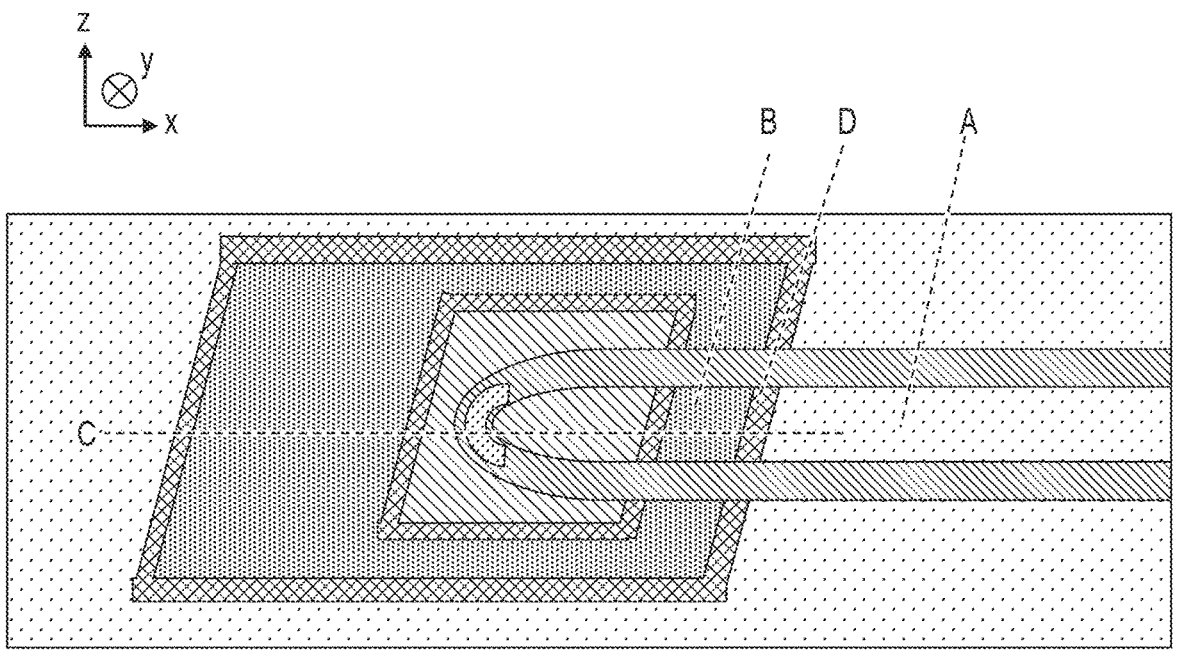
Fig. 4(xiii)
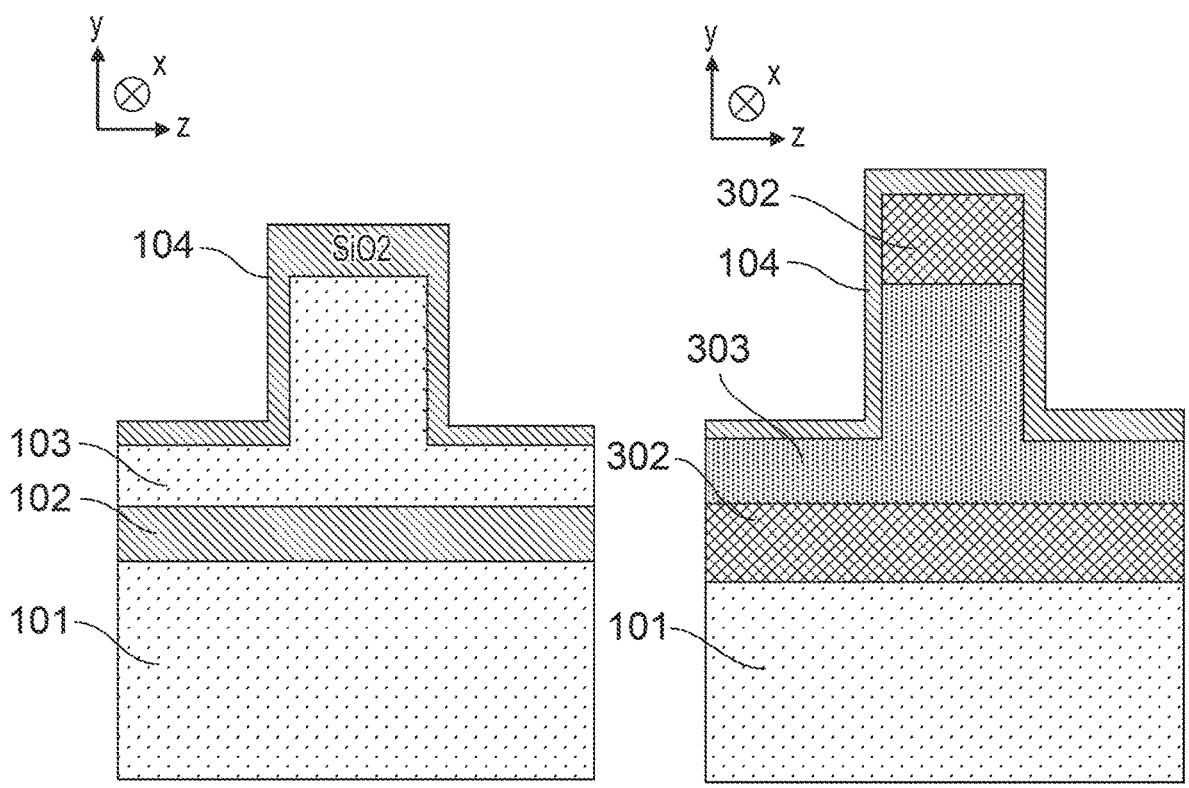
Fig. 4(xiii)(A)　　　Fig. 4(xiii)(B)

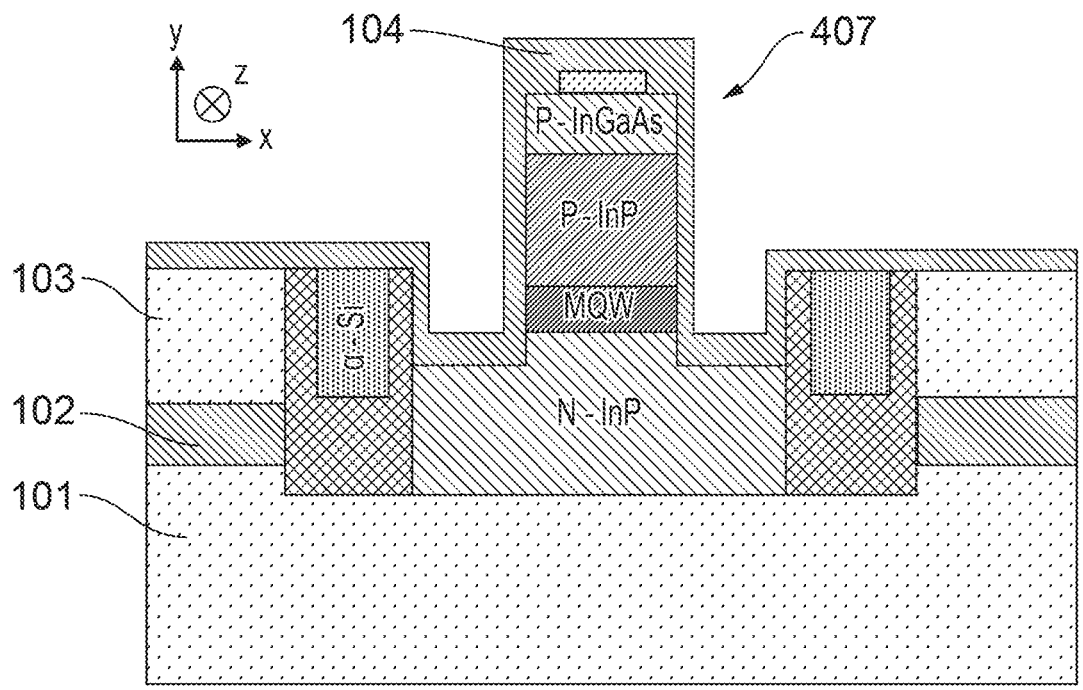
Fig. 4(xiii)(C)
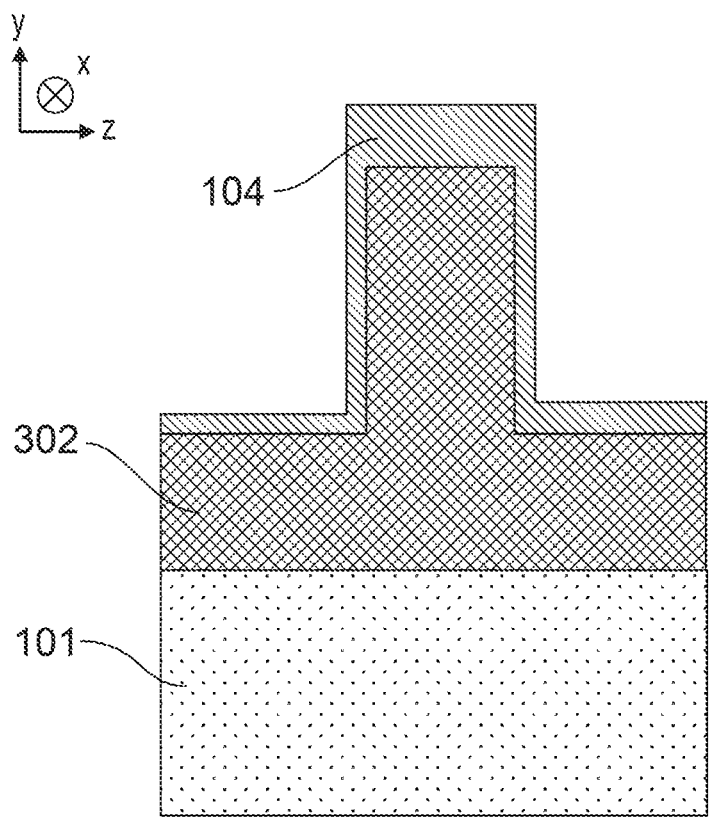
Fig. 4(xiii)(D)

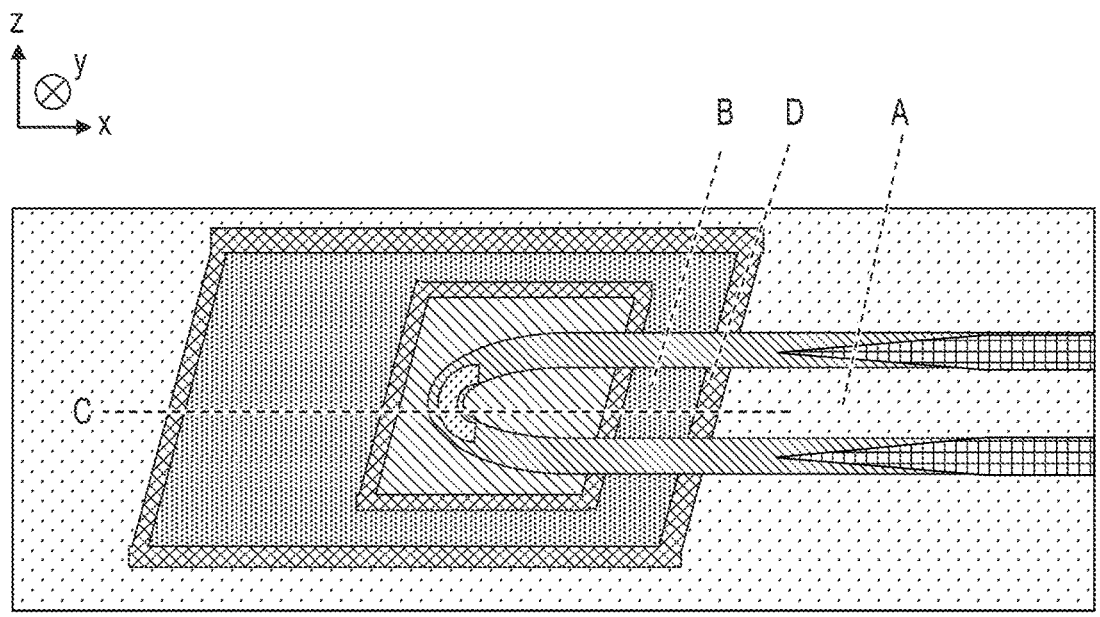
Fig. 4(xiv)
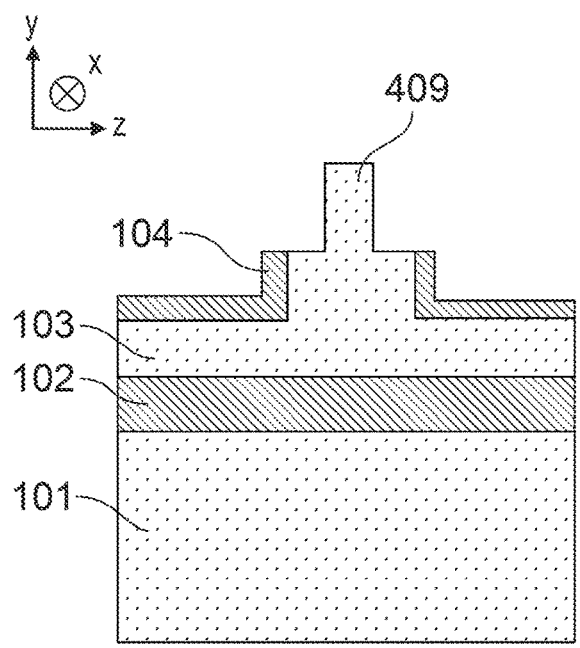 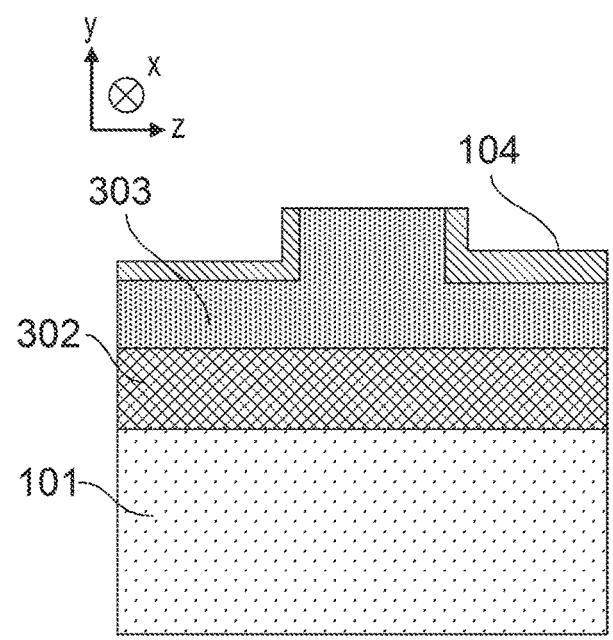
Fig. 4(xiv)(A)　　　　　Fig. 4(xiv)(B)

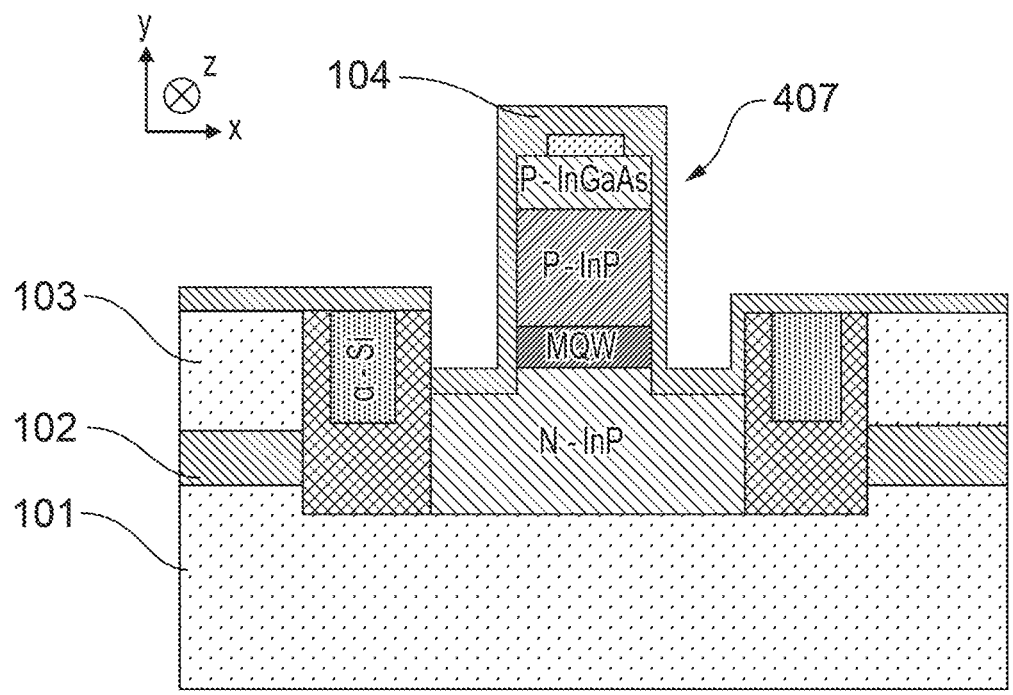
Fig. 4(xiv)(C)
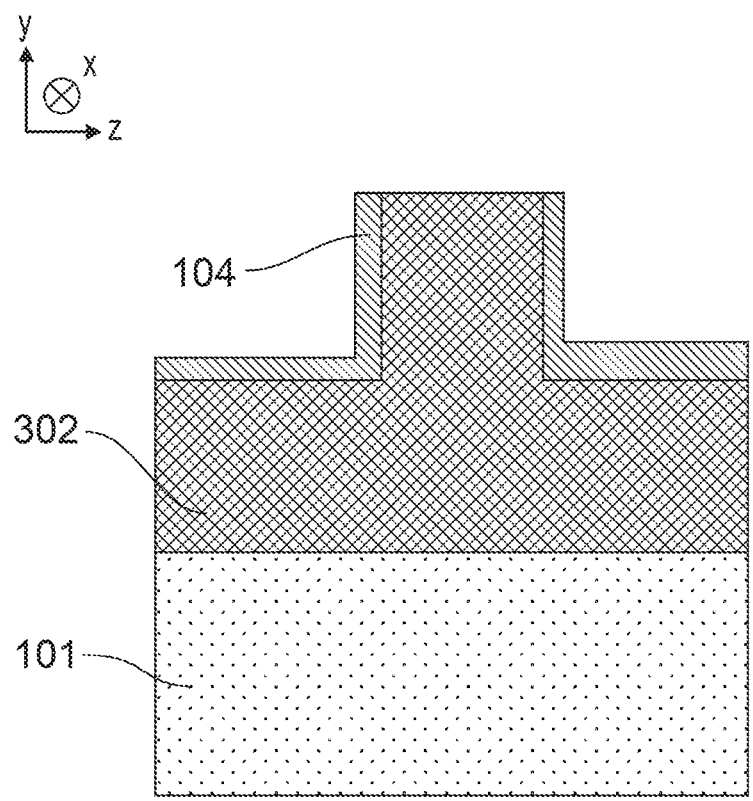
Fig. 4(xiv)(D)

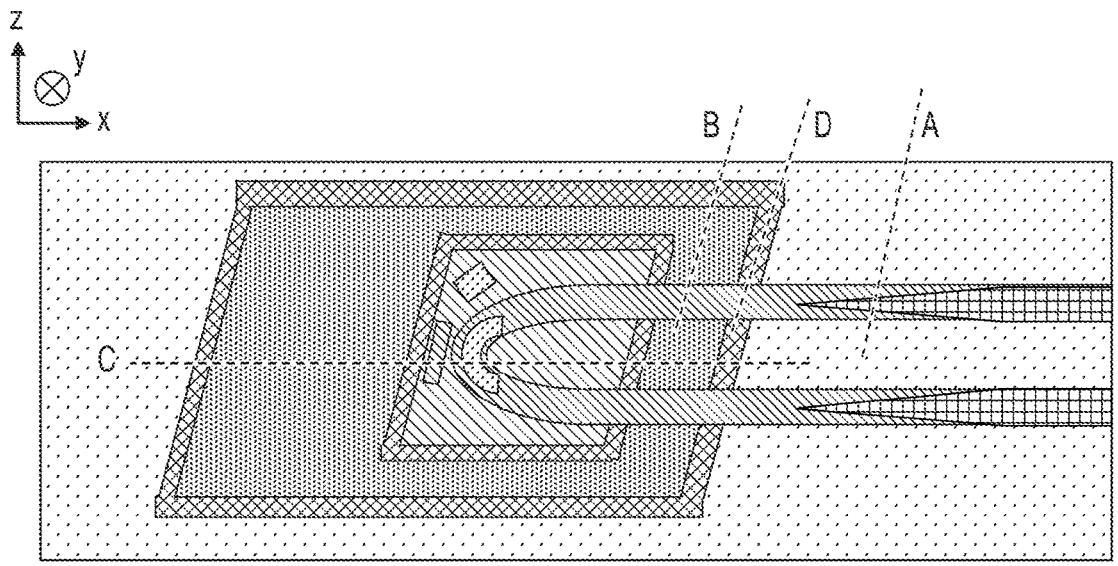
Fig. 4(xvi)
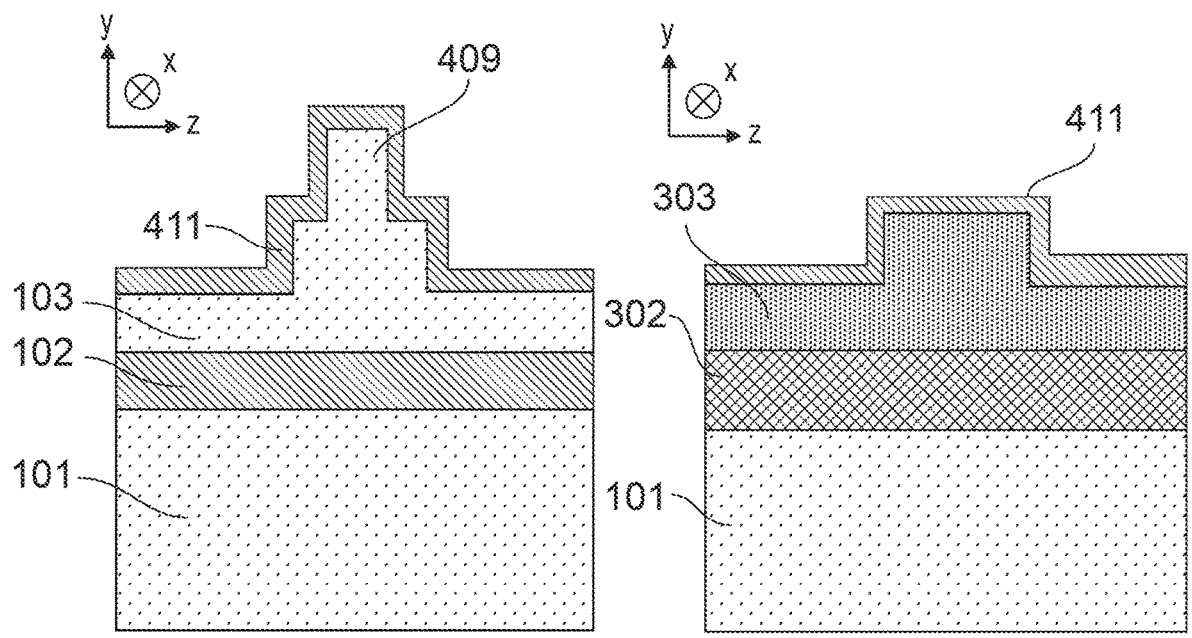
Fig. 4(xvi)(A)  Fig. 4(xvi)(B)

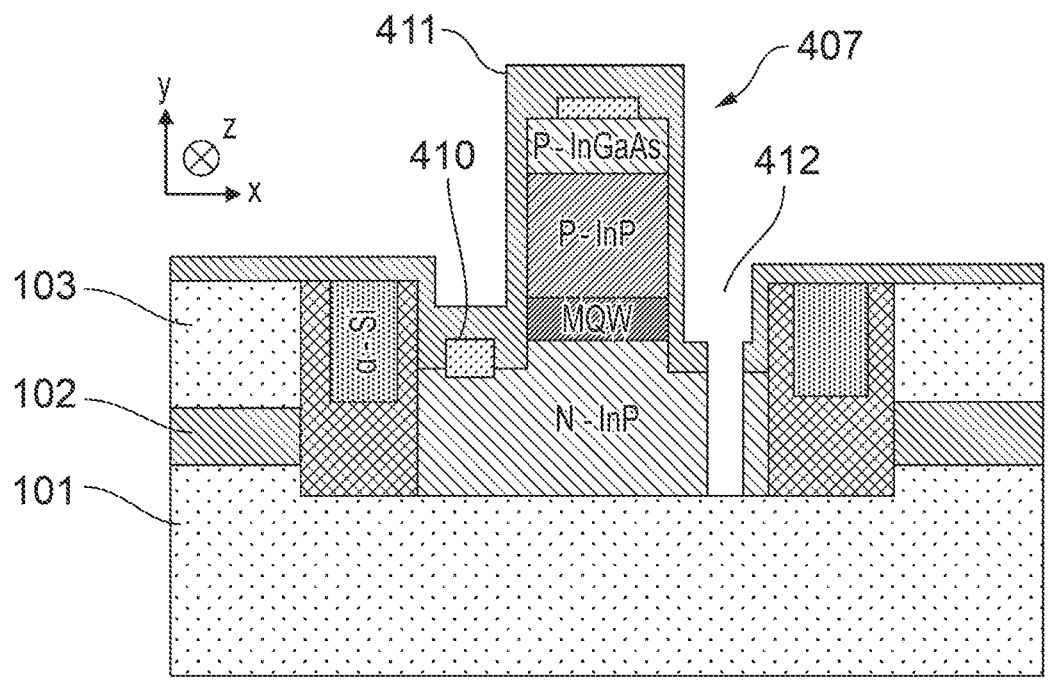
Fig. 4(xvi)(C)
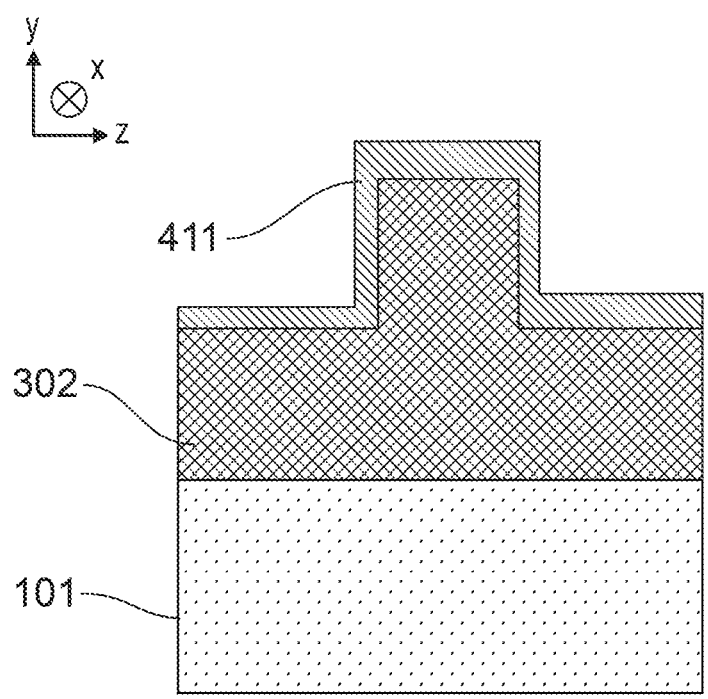
Fig. 4(xvi)(D)

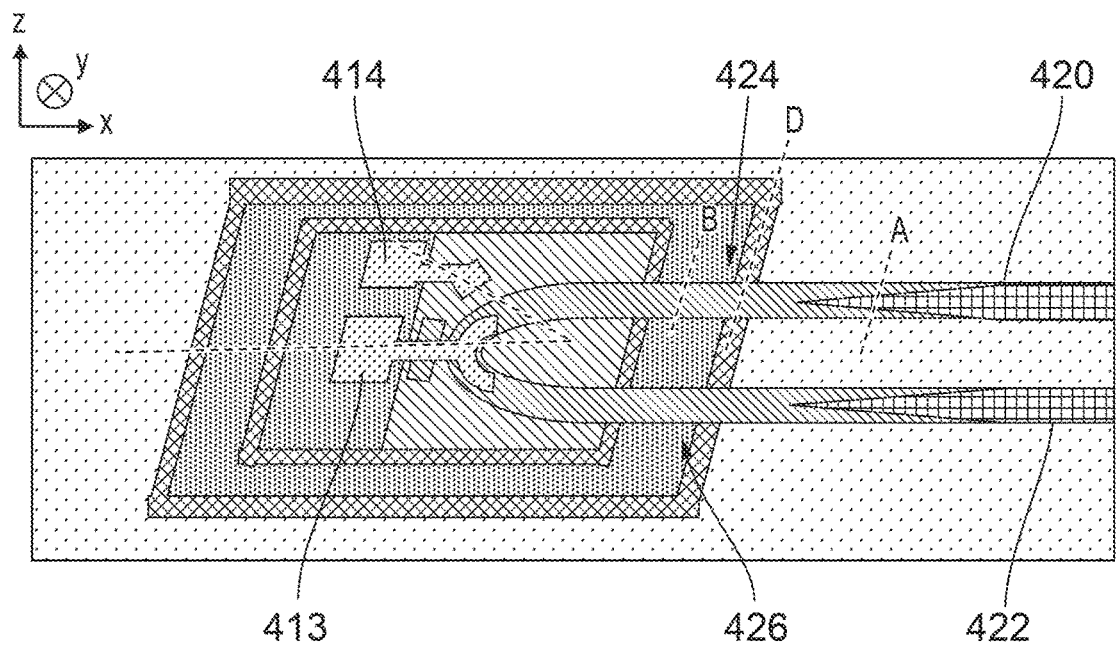
Fig. 4(xvii)
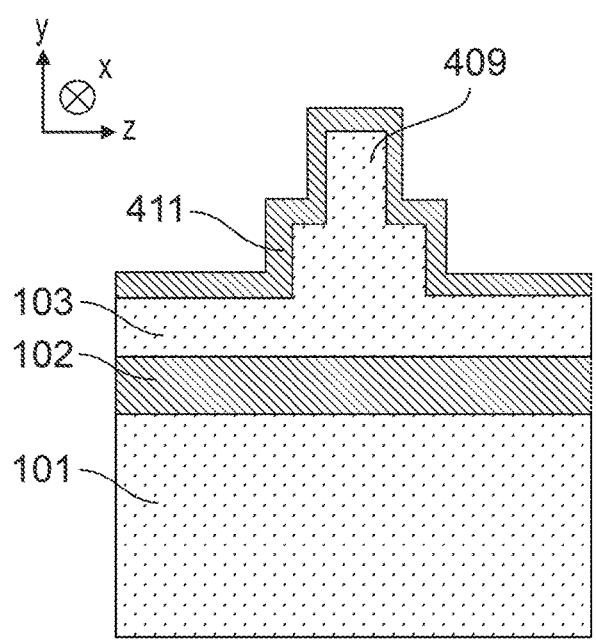
Fig. 4(xvii)(A)
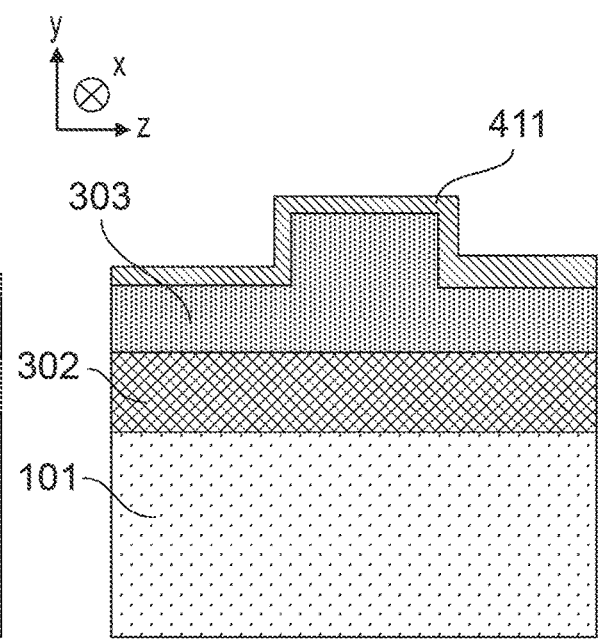
Fig. 4(xvii)(B)

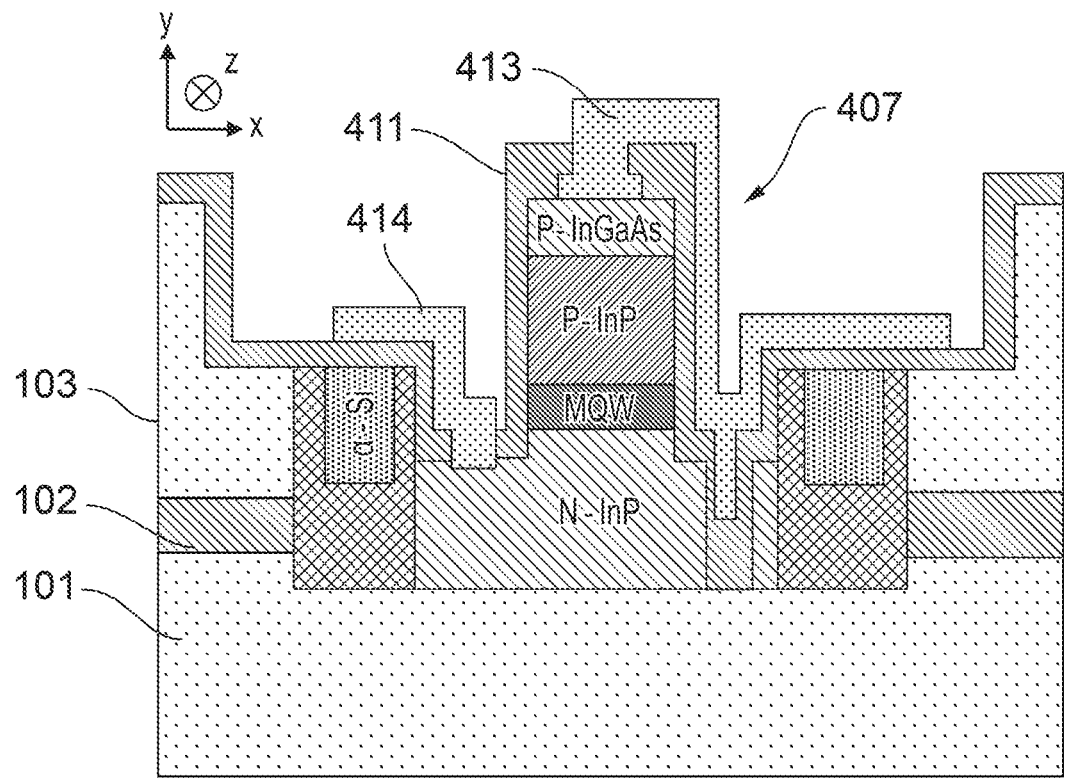
Fig. 4(xvii)(C)
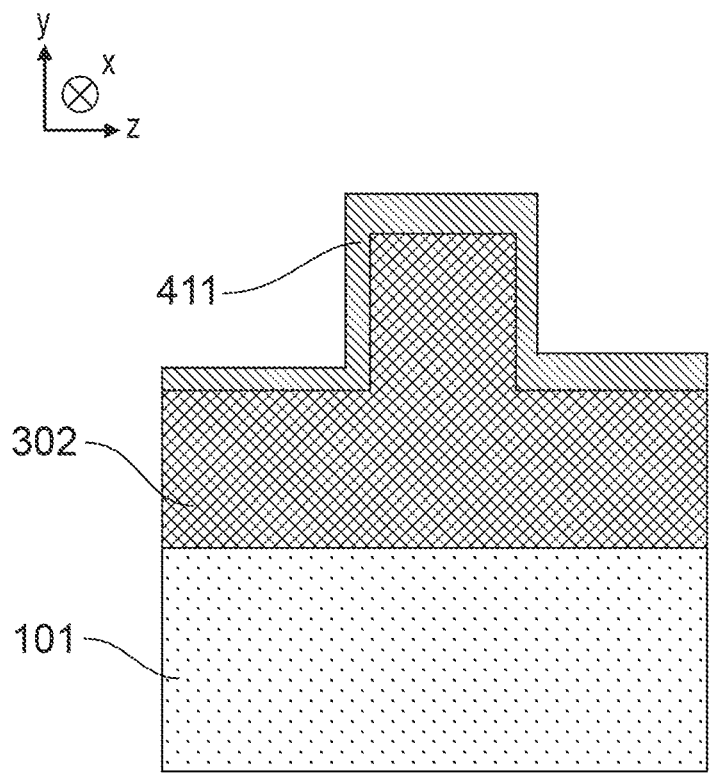
Fig. 4(xvii)(D)

METHOD OF MANUFACTURING A III-V BASED OPTOELECTRONIC DEVICE

CROSS-REFERENCE TO RELATED APPLICATION(S)

The present application claims priority to United Kingdom application number GB 1915085.3, filed on Oct. 18, 2019, which claims priority to and the benefit of U.S. provisional patent application No. 62/891,874, filed Aug. 26, 2019, the entire contents of both of which are incorporated herein by reference.

FIELD OF THE INVENTION

The present invention relates to a method of manufacturing a III-V based optoelectronic device on a silicon-on-insulator wafer.

BACKGROUND

Hybrid optoelectronic devices, which utilise III-V based semiconductors as well as silicon platforms, benefit from the advantages of these two technologies. For example, the field of silicon photonics benefits from low manufacturing costs due to the detailed nature in which silicon fabrication is understood. Similarly, III-V based semiconductor devices (e.g. lasers, electro-absorption modulators, photodetectors, semiconductor optical amplifiers, and electro-absorption modulators lasers) have higher performance than their silicon counterparts.

However, there are still issues that prevent the widespread adoption of III-V/Si based optoelectronic devices. Chief amongst these are the high optical loss in such devices, the lack of a method to manufacture them in high volumes, and issues with the reliability in manufacturing them. For example, in micro-transfer printing based manufacturing processes, high alignment accuracy can be required (typically less than 0.5 μm) which prevents the high throughput possible from a large printing array. Further, 2-4 μm T-bar interfaces can be required for the III-V waveguide facet and a 1 μm T-bar interface for the SOI waveguide facet. In some examples this can add an additional 2 dB of optical loss to the coupling between these two.

As an alternative to micro-transfer printing, flip-chip bonding techniques have been proposed. In these, a III-V based semiconductor device is fabricated on a III-V based wafer. This wafer is then flipped, and aligned with a silicon based platform wafer. A sacrificial layer, bonding the III-V based semiconductor device to the III-V based wafer is then removed, and the III-V based semiconductor is bonded to the silicon platform. However, when the III-V based semiconductor device includes a plurality of layers these must be grown in the reverse order to that desired when the device is bonded to the silicon platform (as the chip is 'flipped').

It is possible to identify, for example through secondary ion mass spectrometry (SIMS), that a III-V/Si hybrid device has been fabricated through the flip-chip bonding technique in that it can be identified that the region or layer of the III-V device closest to the silicon platform was grown last as compared to the rest of the device or remaining layers. For example, SIMS can be used to determine each layer's composition, doping type, and distribution with relation to the InP substrate on which the device was fabricated.

A drawback to flip-chip bonding is that it typically requires additional steps in order to arrive at a workable device. For example, in a multi-layered structure including a quantum well active layer, a P-doped layer should have as high a level of doping as possible so as to ensure good ohmic contact between the metal bond pad and the P-doped III-V layer.

However, so as to minimise optical losses, the doping concentration should decrease as it approaches the quantum well active layer. Therefore, typically, the P doped layer is grown last, on the top of the multi-layered structure, so as to avoid dopant diffusion towards the quantum well active layer. This, however, is not possible with a flip-chip based approach and so further steps are required to provide a good level of ohmic contact.

Further, in the context of III-V based lasers, typically the waveguide is made on P-doped layers as the efficiency of the resulting device is increased. This is because the P carriers have a significantly lower mobility as compared to the N carriers. N carriers in the N doped region can have a mobility >25 times that of the P carriers, and this allows them to easily escape and leads a lower efficiency. When using flip-chip processing, it is required that the waveguide is on N-doped layers, and so the problems discussed arise.

SUMMARY

In a first aspect, embodiments of the invention provide a method of manufacturing a III-V based optoelectronic device on a silicon-on-insulator wafer, the silicon-on-insulator wafer comprising a silicon device layer, a substrate, and an insulator layer between the substrate and the silicon device layer, wherein the method includes the steps of:
  providing a device coupon, the device coupon being formed of a plurality of III-V based layers;
  providing the silicon-on-insulator wafer, the wafer including a cavity with a bonding region;
  transfer printing the device coupon into the cavity, and bonding a layer of the device coupon to the bonding region, such that a channel is left around one or more lateral sides of the device coupon;
  filling the channel with a bridge-waveguide material; and
  performing one or more etching steps on the device coupon, silicon-on-insulator wafer, and/or channel to provide a III-V semiconductor based waveguide in the device coupon, one or more bridge-waveguides in the channel, and a silicon waveguide in the silicon-on-insulator wafer.

The method results in an optoelectronic device which incurs less loss as an optical signal passes through it, as the bridge-waveguides reduce optical loss between the III-V semiconductor based waveguide and the silicon waveguide. The resulting optoelectronic device also performs better than one made via a flip-chip bonding process, as discussed above.

The method may have any one or, to the extent that they are compatible, any combination of the following optional features.

By lateral, it may be meant the sides of the device coupon which directly face one or more sidewalls of the cavity. The one or more etching steps may include etching the bridge-waveguide material, i.e. the now filled channel, to provide a bridge-waveguide.

The optoelectronic device may be any one of: a III-V semiconductor based distributed Bragg reflector laser; a III-V semiconductor distributed feedback laser; a laser using a III-V semiconductor based gain medium; a III-V semiconductor electro-absorption modulator (EAM); a III-V semiconductor based semiconductor optical amplifier; a III-V semiconductor based photodetector; and a III-V semiconductor based externally modulated laser.

The III-V semiconductor based layers may include an optically active layer formed of any of the following materials: InGaAsP, AlInGaAs, and InGaNAs. The optically active layer may be formed of bulk material, or may include multiple-quantum wells.

The method may include a step, performed before filling the channel, of lining the channel with an anti-reflective liner. The channel may be lined such that a portion of the anti-reflective liner which coats a bed of the channel has an upper surface which is aligned with an upper surface of the insulator layer.

The method may further include a step, after filling the channel with the bridge-waveguide material, of aligning an upper surface of the bridge-waveguide material with an upper surface of the silicon device layer.

A geometry of the III-V semiconductor based waveguide, a geometry of the one or more bridge-waveguides in the channel, and a geometry of the silicon waveguide adjacent to the bridge waveguide(s) may be substantially identical.

The method advantageously negates the need for T-bar interfaces between the waveguide components, which can substantially reduce optical losses.

The III-V semiconductor based waveguide, the one or more bridge-waveguides, and the silicon waveguide may be etched with a same etching hard mask. This ensures that the various waveguides are self-aligned, which further reduces optical losses.

The method may include a step of forming one or more electrical bonding pads on the silicon-on-insulator wafer. This negates the need to form them on the III-V device coupon, and thereby saves real estate. Further, it enhances device speed by minimising parasitic capacitance.

The bridge-waveguide material may be formed from amorphous silicon. The III-V layers may include layers formed from: InGaAsP, InP, or InGaAs.

The method may further include a step of etching a reflection facet, which is adjacent to an end of the III-V semiconductor based waveguide which is distal to the bridge-waveguide, such that the optoelectronic device is operable as a laser. The method may further include a step of etching a grating into the silicon waveguide, such that the optoelectronic device is operable as a distributed Bragg reflector laser.

The optoelectronic device may be operable as an electro-absorption modulator. The III-V semiconductor based waveguide may be either straight or U-shaped, and the silicon waveguide may be an input waveguide, and the silicon-on-insulator wafer may also be etched to provide an output waveguide, the input waveguide and output waveguide being optically coupled to respective legs of the III-V semiconductor based waveguide through respective bridge-waveguides. The III-V semiconductor based waveguide may be shaped, or substantially L-shaped, the silicon waveguide may be an input waveguide, and the silicon-on-insulator wafer may also be etched to provide an output waveguide, the input waveguide and the output waveguide may be optically coupled to respective legs of the III-V semiconductor based waveguide through respective bridge-waveguides. The method may include a step of fabricating a waveguide taper in each of the input and output waveguides, which tapers an optical mode from a first optical mode distal to the bridge-waveguide(s), for transmission from/reception to the optoelectronic device, to a second optical mode proximal to the bridge-waveguide(s), for guiding through the optoelectronic device. The second optical mode may be smaller than the first optical mode. The taper may be a vertical taper, in that the height of the optical mode changes from the first to the second.

The cavity may have a parallelogramal shape. Accordingly, the interface(s) between the input and/or output waveguides and the corresponding bridge waveguide(s) are at an angle relative to the guiding direction. This can reduce reflections from the interface, and so decrease optical reflection.

In a second aspect, embodiments of the present invention provide an optoelectronic device manufactured according to the method of the first aspect, including any one, or any combination insofar as they are compatible, of the optional features set out with reference thereto.

In a third aspect, embodiments of the present invention provide an optoelectronic device, comprising: a silicon-on-insulator wafer including: a silicon waveguide located within a silicon device layer, a substrate, and an insulator layer between the substrate and silicon device layer; a III-V semiconductor based waveguide, located within a cavity of the silicon-on-insulator wafer; and a bridge-waveguide, which optically couples the silicon waveguide located within the silicon device to the III-V semiconductor based waveguide located within the cavity; wherein the III-V semiconductor based waveguide is a multi-layered structure obtained or obtainable by a process of epitaxially growing a sequence of layers, and wherein the layer of the multi-layered structure distalmost to the cavity was grown last in said process.

Such an optoelectronic device incurs less loss as an optical signal passes through it, as the bridge-waveguides reduce optical loss between the III-V semiconductor based waveguide and the silicon waveguide. The resulting optoelectronic device also performs better than one made via a flip-chip bonding process, as discussed above.

The optoelectronic device of the third aspect may have any one, or any combination insofar as they are compatible, of the optional features set out with reference to the first aspect.

The device may include one or more anti-reflective liners, located between the bridge-waveguide and the III-V semiconductor based waveguide and/or the bridge-waveguide and the silicon waveguide. The liners may be formed of silicon nitride.

A geometry of the III-V semiconductor based waveguide, a geometry of the bridge-waveguide, and a geometry of the silicon waveguide adjacent to the bridge-waveguide may be substantially identical.

The III-V semiconductor based waveguide may be electrically connected to one or more electrical bonding pads located on the silicon-on-insulator wafer.

The bridge-waveguide may be formed of amorphous silicon.

The optoelectronic device may include a reflection facet, adjacent to an end of the III-V semiconductor based waveguide which is distal to the bridge-waveguide, such that the optoelectronic device is operable as a laser. The silicon waveguide may include a grating, such that the optoelectronic device is operable as a distributed Bragg reflector laser.

The optoelectronic device may be operable as an electro-absorption modulator, or semiconductor amplifier.

The silicon waveguide may include a waveguide taper, which tapers an optical mode from a first optical mode distal to the bridge waveguide, for transmission from/reception to the optoelectronic device, to a second optical mode proximal to the bridge-waveguide, for guiding through the optoelectronic device.

The cavity may have a parallelogramal shape.

Further aspects of the present invention provide: a computer program comprising code which, when run on a computer, causes the computer to perform the method of the first aspect; a computer readable medium storing a computer program comprising code which, when run on a computer, causes the computer to perform the method of the first aspect; and a computer system programmed to perform the method of the first aspect.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

Figure 1I:
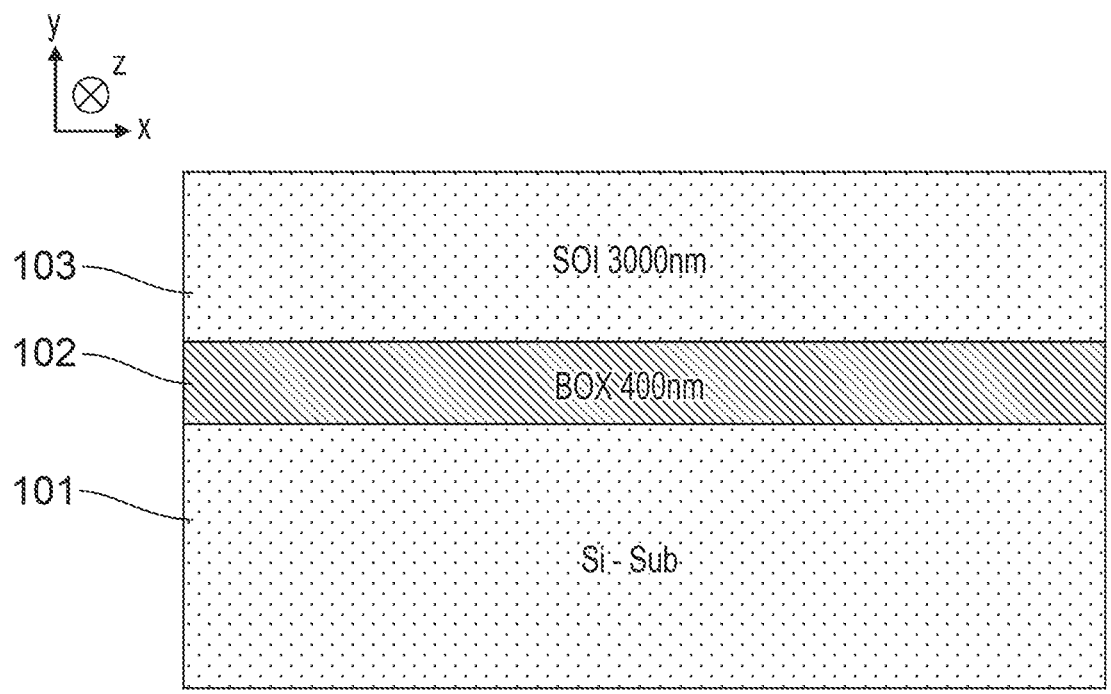
FIGS. 1(*i*)-1(*ii*)(B) show a method of preparing a silicon-on-insulator wafer.
Figure 1:
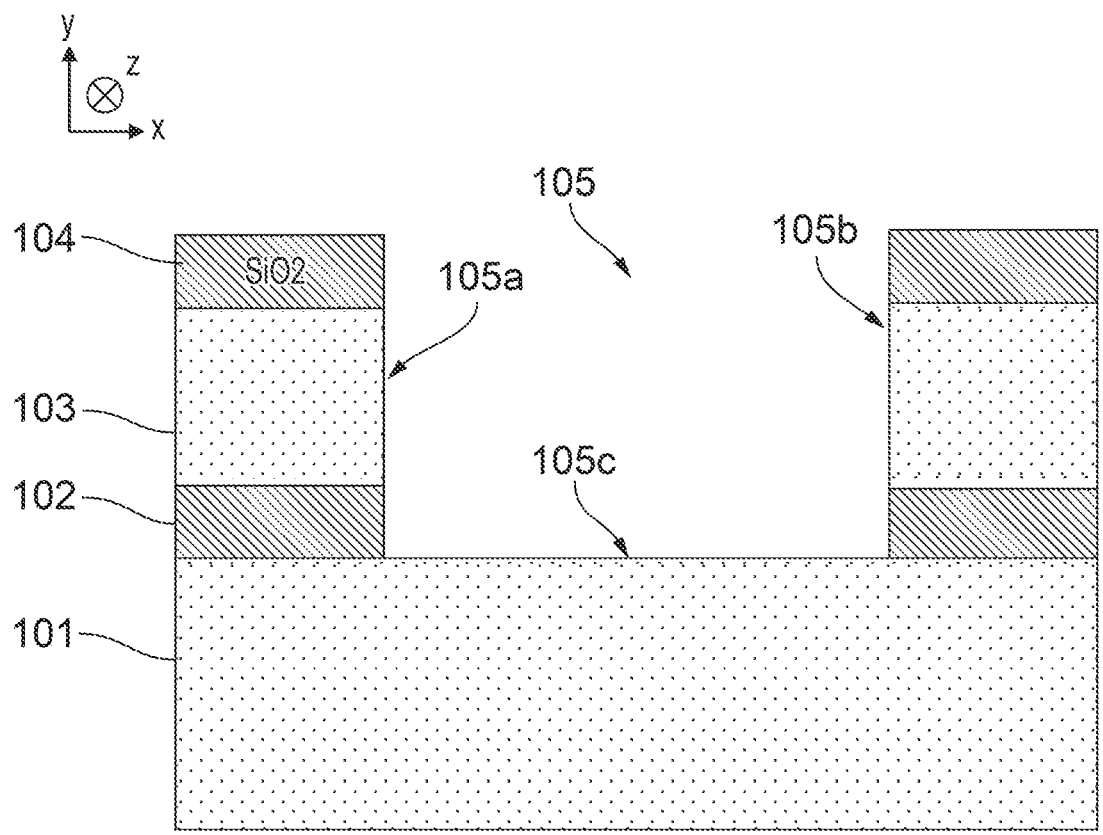
Figure 1:
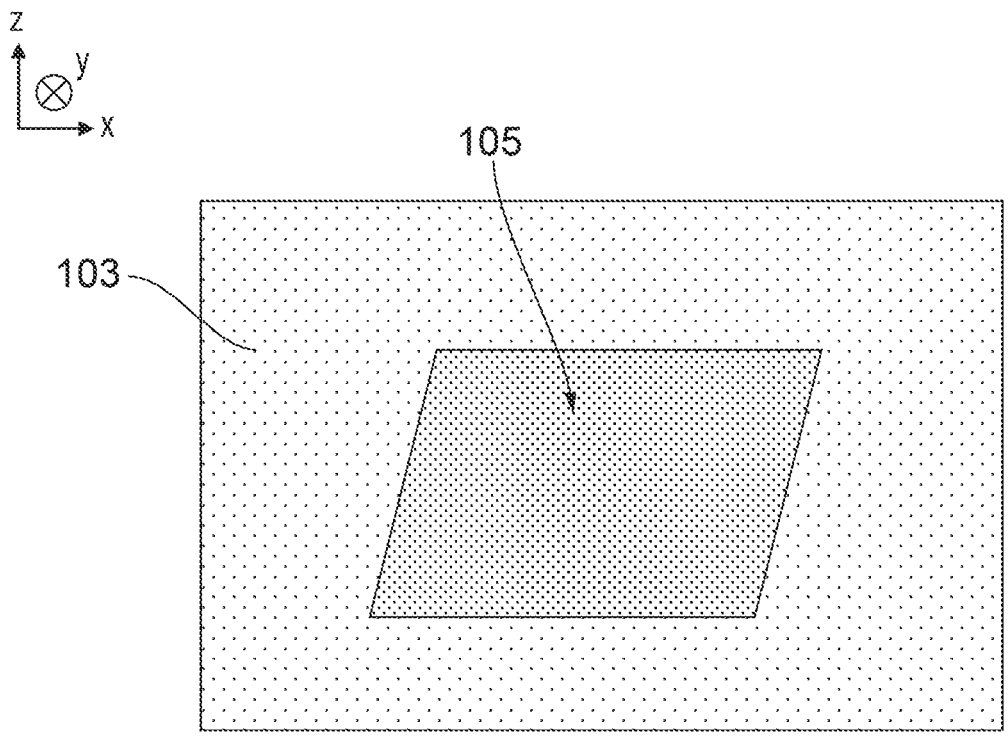

FIGS. 1(*i*)-1(*ii*)(B) show a method of preparing a silicon-on-insulator wafer. In a first step, shown in FIG. 1(*i*), a silicon-on-insulator (SOI) wafer is provided. The SOI wafer includes a silicon substrate 101, above which is a buried oxide layer 102, formed of silica/SiO$_2$. The buried oxide layer functions as a lower cladding layer for waveguides formed later. Above the buried oxide layer 102, i.e. on an opposing side of the buried oxide layer to the substrate, is device layer 103 (also referred to as a silicon-on-insulator layer). The device layer has a thickness as measured from an uppermost surface of the buried oxide layer to an uppermost layer of the device layer, of around 3000 nm/3 μm. The buried oxide layer has a thickness of around 400 nm.

In a subsequent step, shown along a cross-section in FIG. 1(*ii*)(A), a portion of the device layer 103 and buried oxide 102 are etched. The area to be etched is defined by a mask, and the unmasked portion is etched down to the silicon substrate. That is, the etch is performed so that an upper surface of the substrate 101 is exposed. This etch defines the cavity 105, having sidewalls 105*a*/105*b* as well as bed 105*c*. The mask is, in this example, provided as silicon dioxide layer 104. The height of the silicon dioxide layer is chosen such that the top surface is level with the top surface of a subsequently formed III-V device coupon.

FIG. 1(*ii*)(B) shows the wafer of FIG. 1(*ii*)(A) from a top-down view. Notably, the cavity 105 has a parallelogramal geometry which provides one or more angled interfaces for the waveguides in the final device (which reduces optical reflection).

Figure 2I:
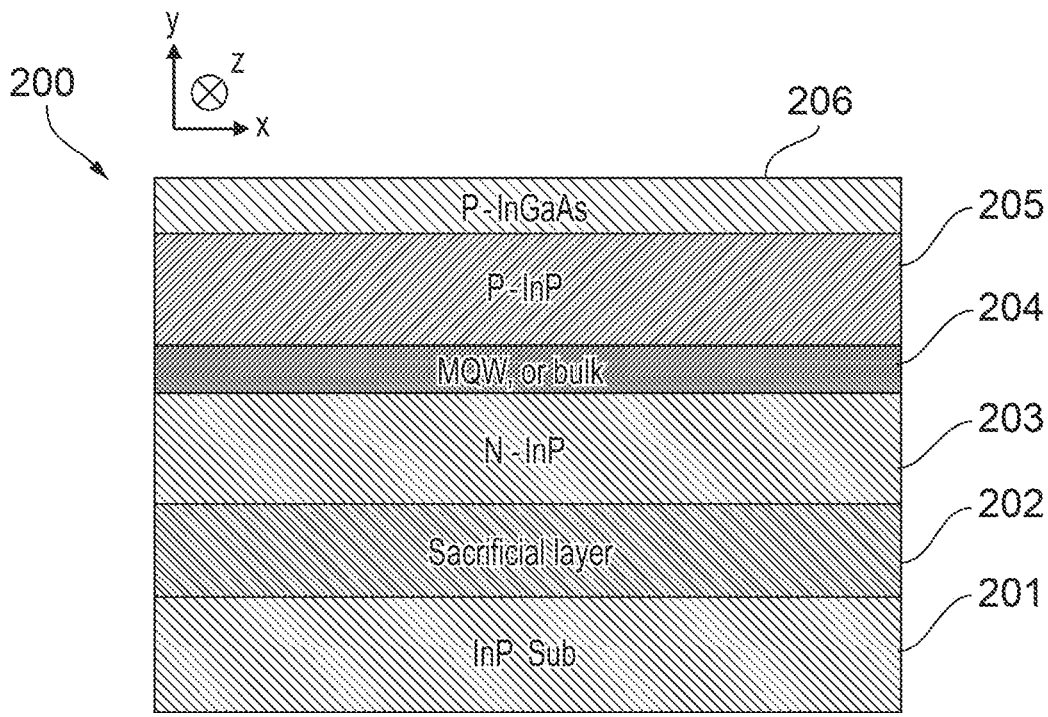
FIGS. 2(*i*)-2(*v*) show a method of preparing a device coupon.
Figure 2:
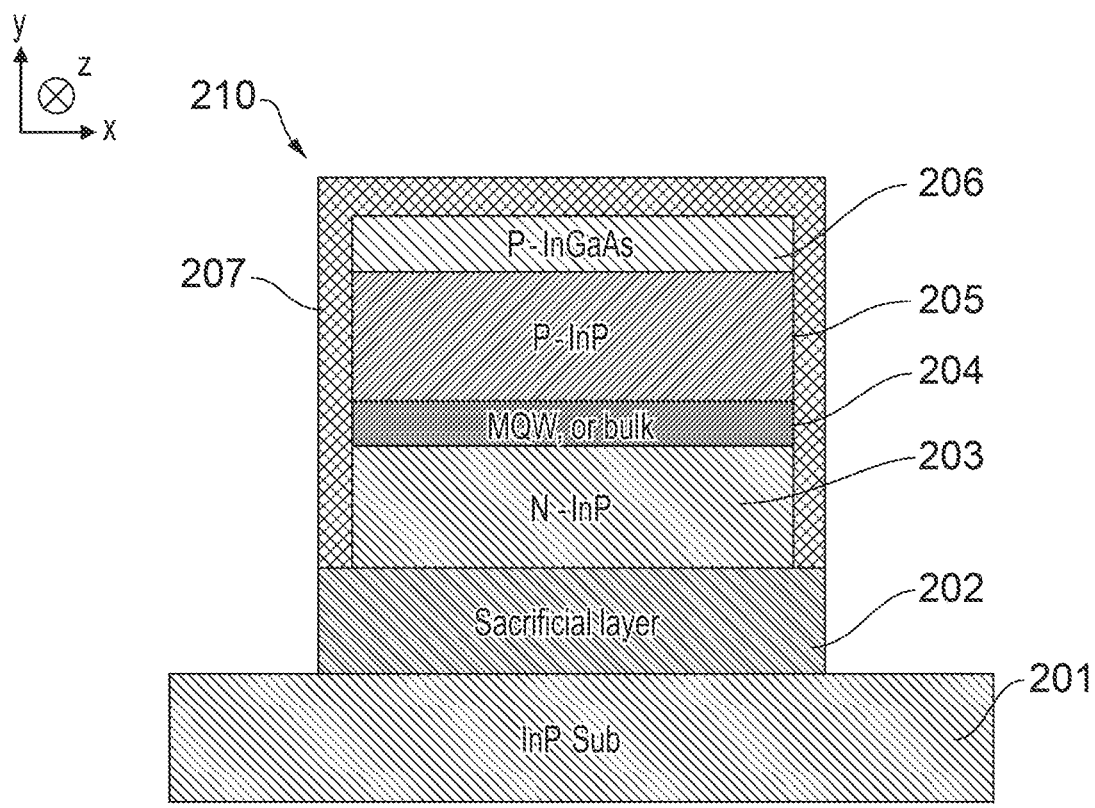
Figure 2:
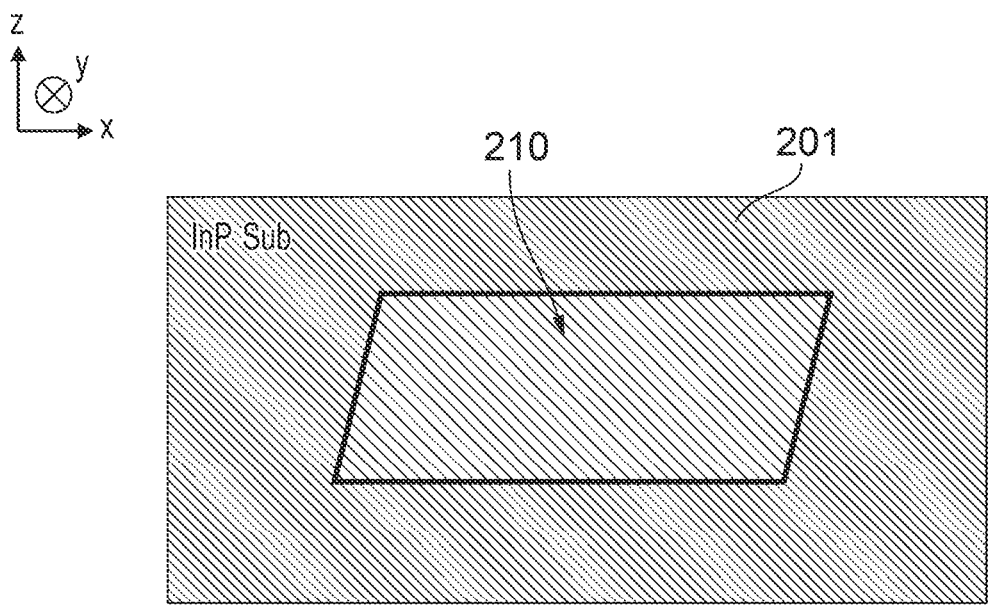
Figure 2:
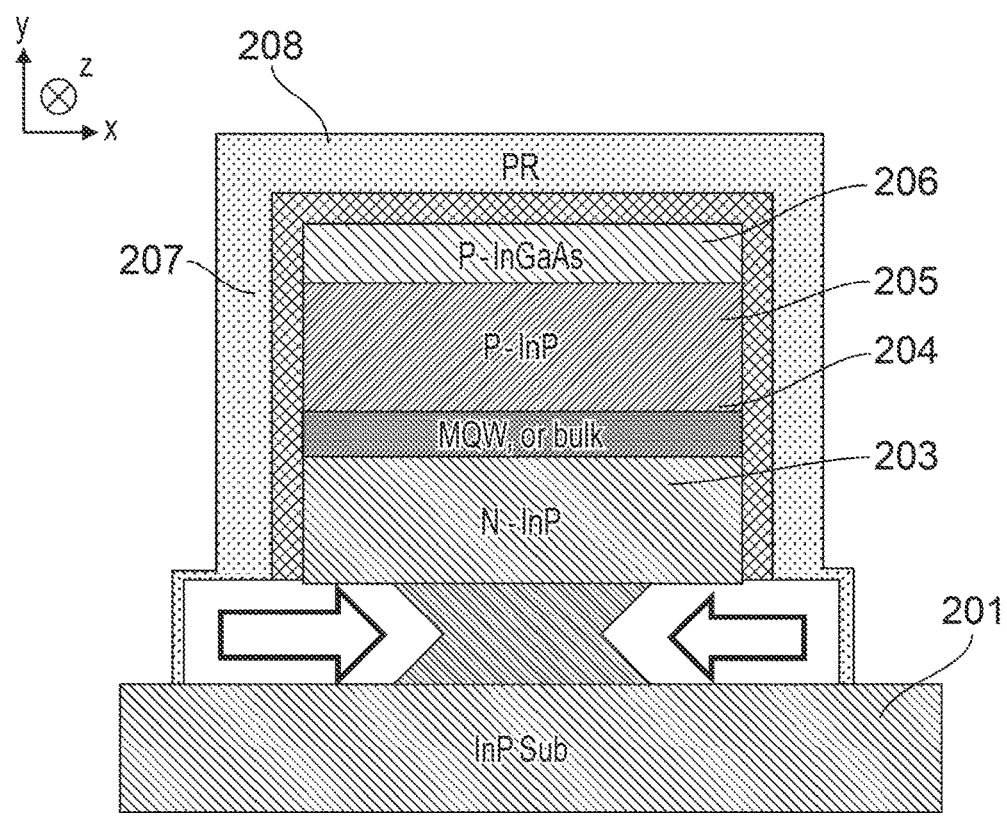
Figure 2V:
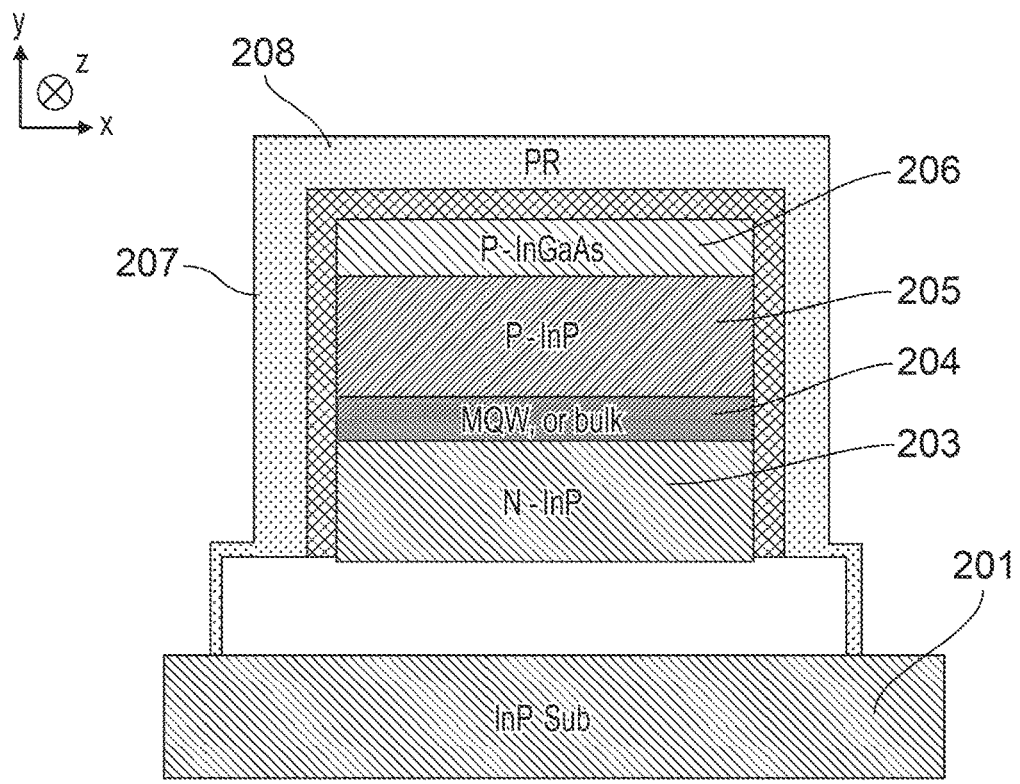

FIG. 2(*i*) shows a simplified schematic of a III-V based semiconductor stack 200, suitable for use as a III-V/Si based optoelectronic device. The stack has plural layers, starting from a bottommost to a topmost:

201—Indium phosphide (InP) substrate, which is reusable;
202—Sacrificial layer, formed of InGaAs;
203—N-doped Indium phosphide;
204—Multiple-quantum well, or bulk, III-V based optically active layer;
205—P-doped Indium phosphide; and
206—P-doped Indium gallium arsenide, InGaAs.

In one example, layer 204 is a multiple-quantum well layer (MQW) which allows the subsequently formed device to function as a distributed Bragg reflector (DBR) laser. Advantageously, the stack can include an etch stop to allow precise etching of the waveguide. For example, when the III-V based semiconductor stack is to be used to make a laser, an InGaAsP layer of 20 nm etch stop layer above the multiple-quantum well or bulk III-V based optically active layer can be used as an etch stop. After the III-V based stack 200 has been provided, it is etched to provide device coupon 210 and covered with a protective silicon nitride layer 207. This etch also exposes sidewalls of the sacrificial layer 202, and notably the silicon nitride cover 207 does not extend any further than the bottom of the N—InP layer 203. The silicon nitride cover has a thickness of around 400 nm. The result of this etch, and the covering with silicon nitride, is shown in FIG. 2(*ii*)(A). FIG. 2(*ii*)(B) shows the same stage from a top-down perspective. As with the cavity 105 of the silicon-on-insulator wafer, the device coupon 210 has a parallelogramal geometry.

Next, in a step shown in FIG. 2(*iii*), a tether photoresist 208 is provided around the device coupon 210. Notably, the tether photoresist does not entirely encapsulate device coupon 210. Instead, the tether leaves sacrificial layer 202 exposed on its lateral sides. After the photoresist tether is provided, an etch is performed to remove the sacrificial layer. The first stage of this is shown in FIG. 2(*iv*), the arrows indicating the direction of the etch, and the completed etch is shown in FIG. 2(*v*) in which the coupon is suspended by the tether. This etch completes the fabrication steps for the III-V based device coupon 210, and leaves it ready to be picked up by the stamp in a micro-transfer print process.

Figure 3I:
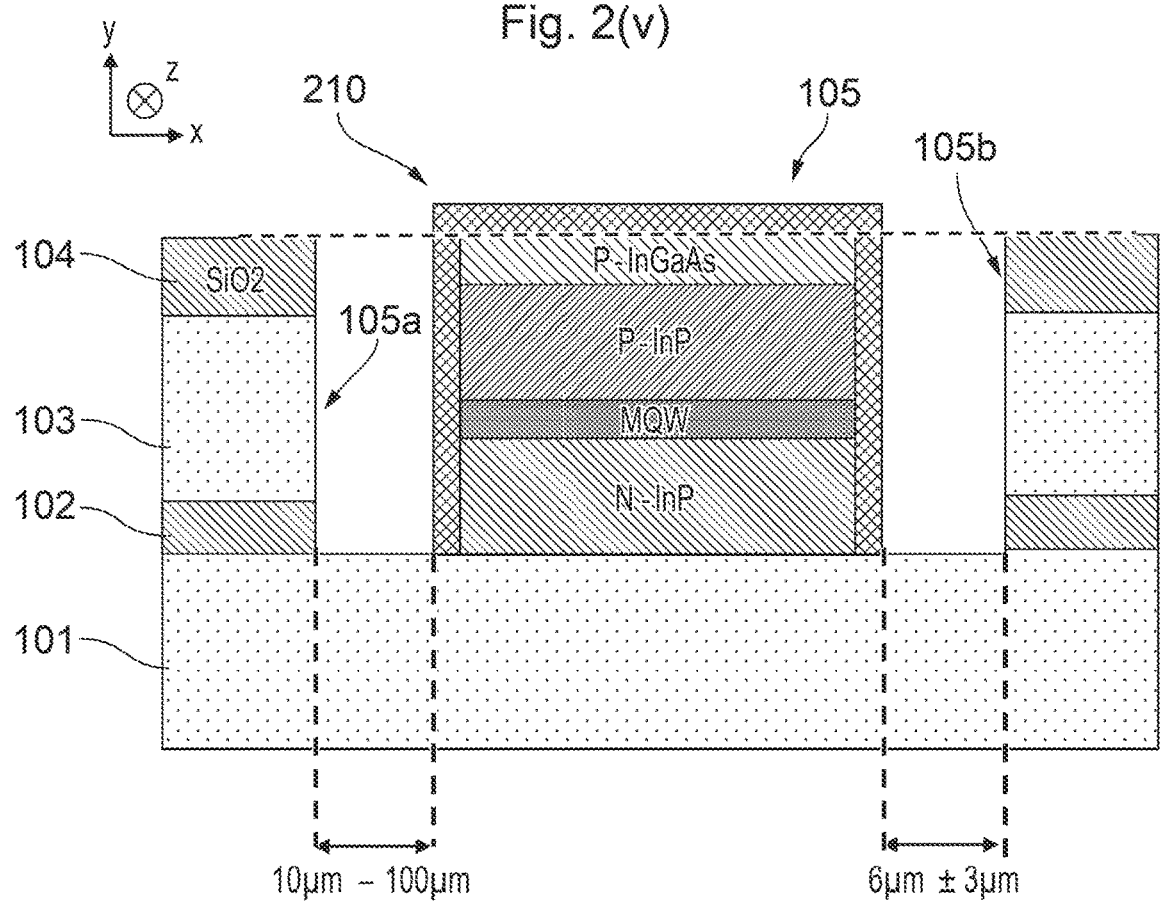
FIGS. 3(*i*)-3(*xxv*)(A) show a method of manufacturing a III-V based optoelectronic device.
Figure 3:
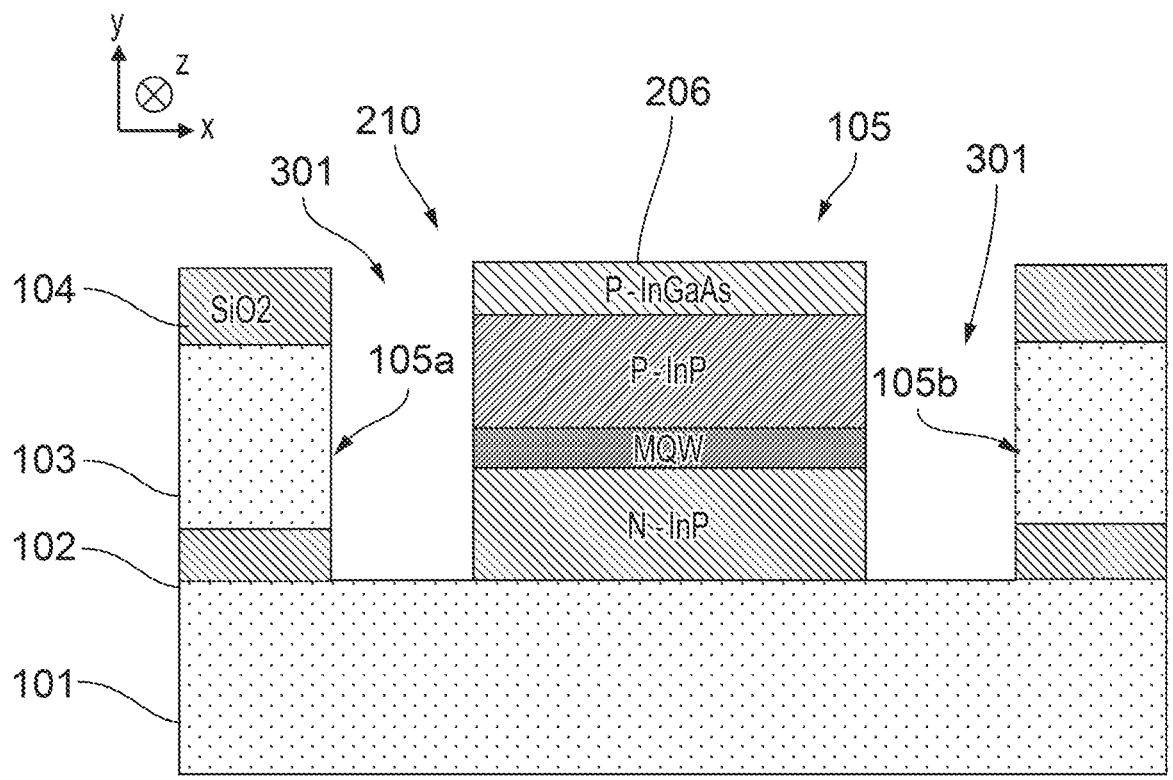
Figure 3:
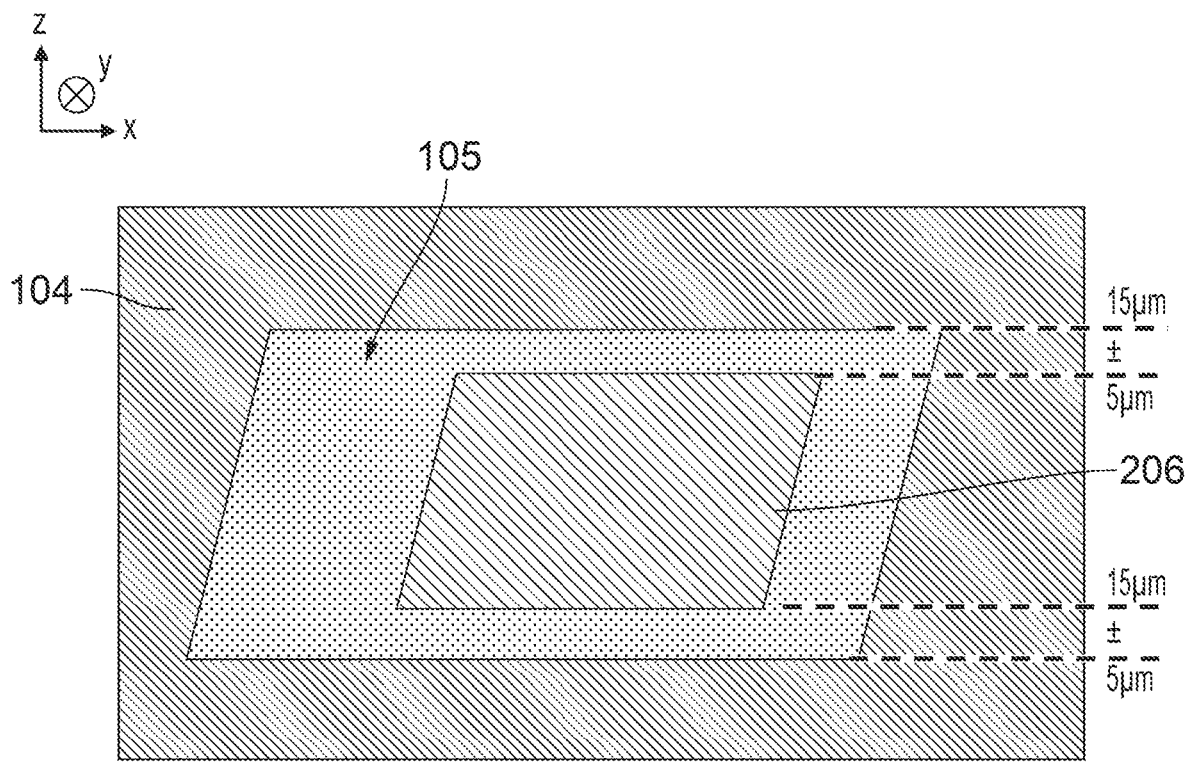
Figure 3:
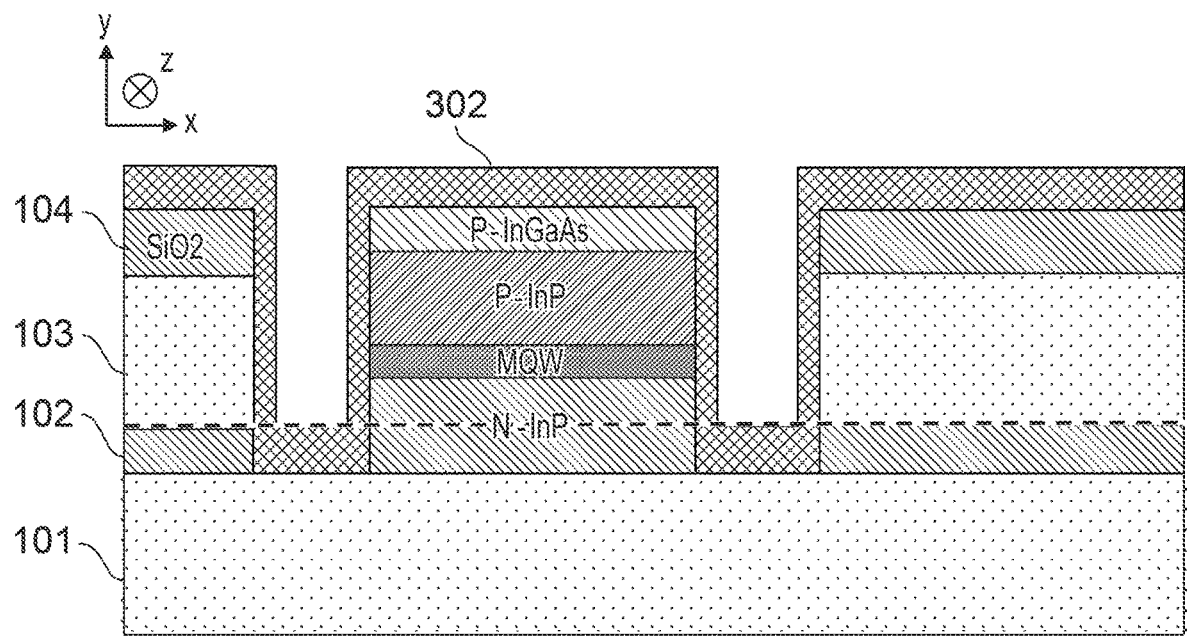
Figure 3V:
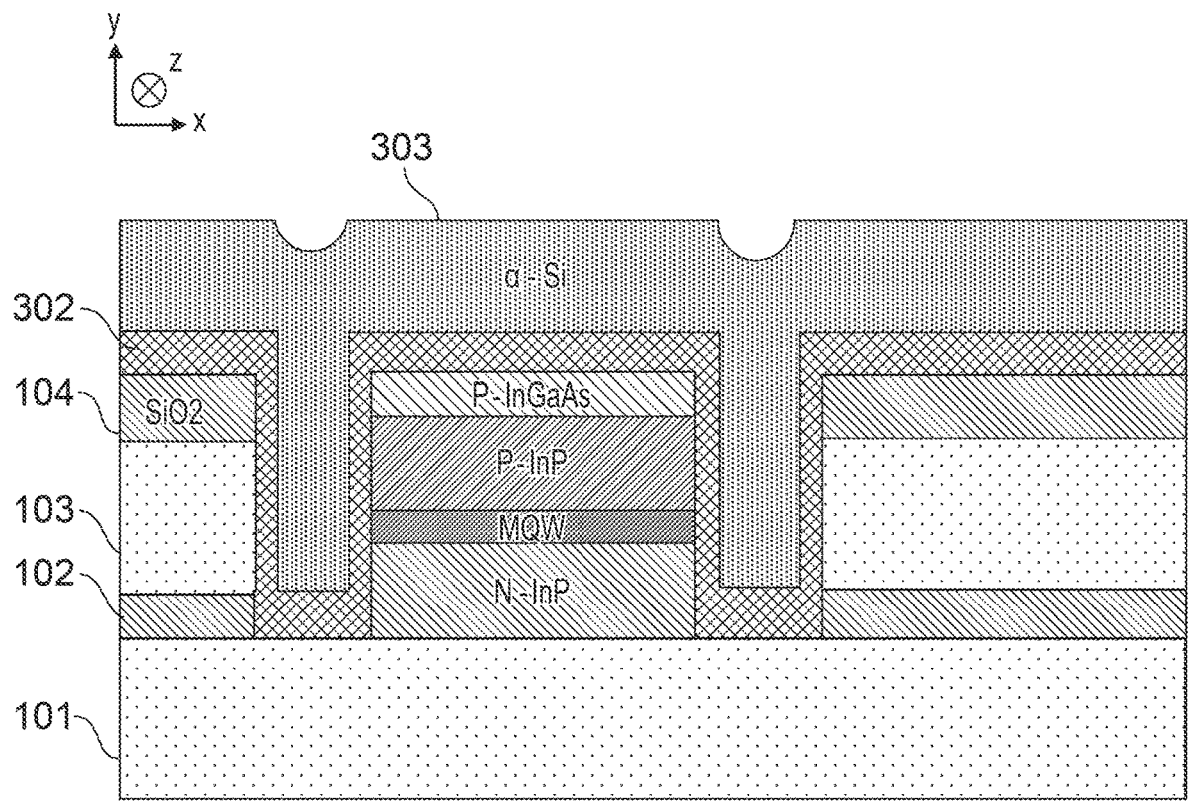
Figure 3:
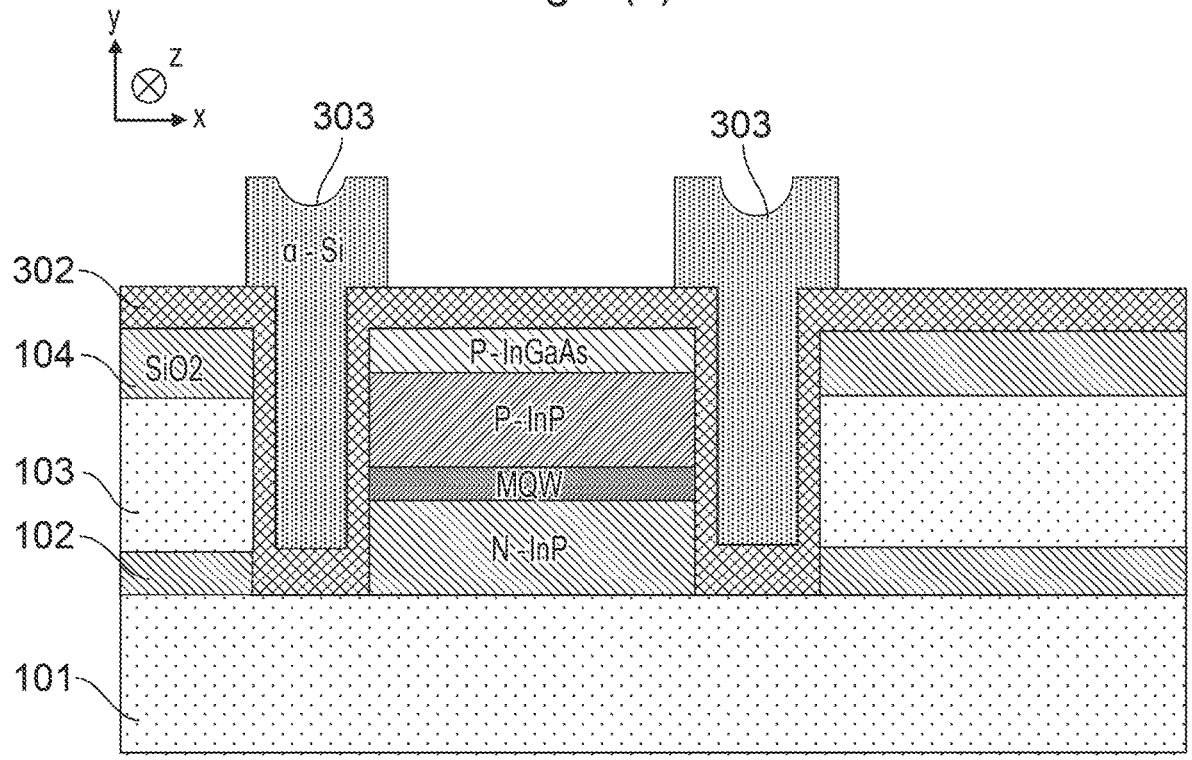
Figure 3:
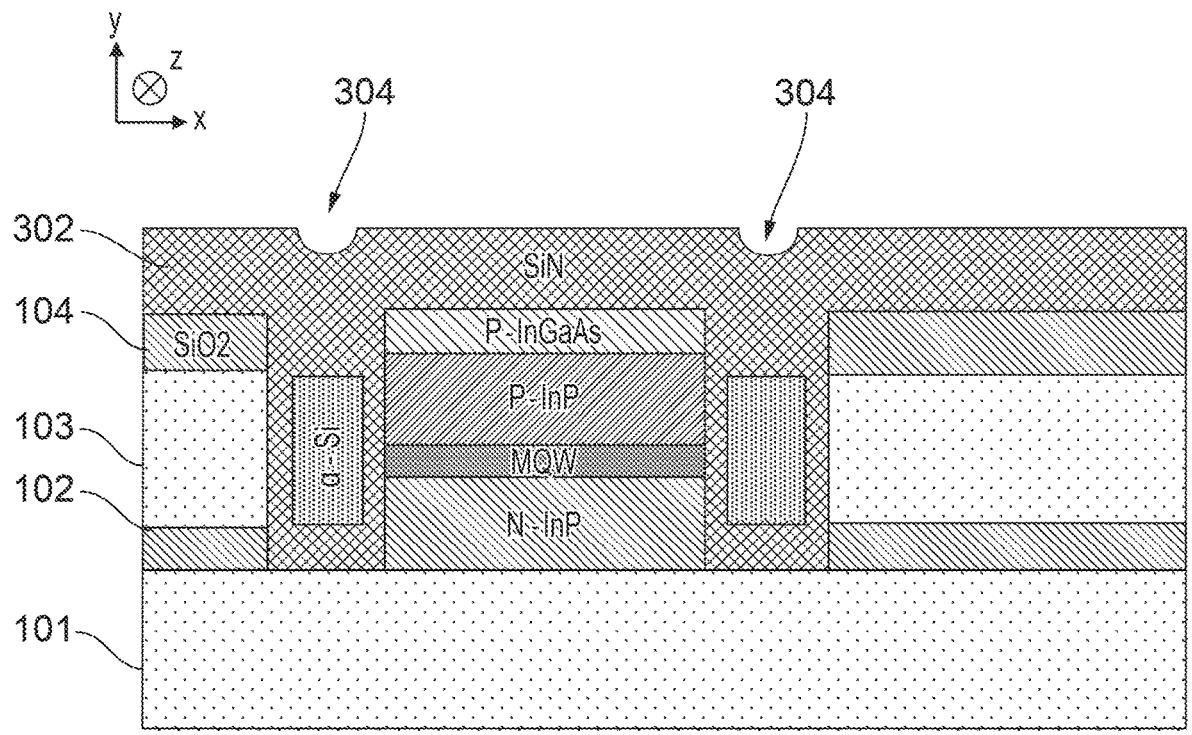

After the III-V device coupon 210, and the cavity 105, are prepared, a stamp is used to pick up the III-V device coupon from the indium phosphide substrate 201. The device coupon is then printed onto the bed of cavity 105 and the bonded SOI wafer with device coupons go through 300° C. annealing for 1-15 hours. The result of this is shown in FIG. 3(*i*). Notably, in an example where the final device is a DBR laser, a distance from the left hand side of the device coupon 210 to the nearest sidewall 105*a* of the cavity is between 10 μm and 100 μm. Whereas, the distance from the right hand side of the device coupon to the nearest sidewall 105*b* is around 6 μm±3 μm. Further, the uppermost or top surface of the P—InGaAs layer is aligned with the top surface of the silicon dioxide layer 104, as indicated by the dashed line.

Next, in a step shown in FIG. 3(*ii*)(A), the protective silicon nitride layer is removed. As a result, the uppermost surface of the device coupon (the uppermost surface of the P doped InGaAs layer) is aligned with an uppermost surface of the silicon dioxide layer 104. Channel 301 results from this step, running between the outer lateral periphery of the device coupon 210 and the sidewalls of the cavity 105. FIG. 3(*ii*)(B) shows this step from a top-down perspective. As can be seen, the distance between the upper (in this view)

vertical edge of the device coupon 210 and the nearest sidewall is around 15 μm±5 μm.

In a further step, shown in FIG. 3(*iii*), silicon nitride 302, in some embodiments $Si_3N_4$, is disposed as an antireflective lining or coating (ARC) over the exposed surfaces of the now bonded wafer and coupon. The ARC has a thickness of at least 230 nm and no more than 260 nm approximately, and a refractive index of at least 2.5 and no more than 2.8 approximately. The portion of the antireflective coating present on the bed of the cavity is etched, such that an uppermost surface of the silicon nitride layer along the bed of the cavity is aligned with an uppermost surface of the buried oxide layer 102. The result of this is shown in FIG. 3(*iv*).

After the anti-reflective coating has been etched, bulk amorphous silicon 303 (α-Si) is deposited over the device as shown in FIG. 3(*v*). This deposition fills channel 301, and also covers the uppermost surface of the device. Next, in a step shown in FIG. 3(*vi*), the amorphous silicon is partially etched so that only portions surrounding the channels remain. This etch releases wafer stress, and prepares the wafer for the next step.

After the etch, a chemical-mechanical planarization (CMP) process is performed so that the uppermost surface of amorphous silicon is aligned with the uppermost surface of the silicon nitride liner. The result of this CMP step is shown in FIG. 3(*vii*). Next, the α-Si is trimmed so that the top surface of the α-Si is aligned with the top surface of the adjacent device layer 103. This is shown in FIG. 3(*viii*). This step, in effect, provides bridge-waveguides 304 in that the device layer 103 of the wafer is now optically coupled to the device coupon 210. Further etching/layer depositions, as discussed below, provide further definition to the bridge-waveguides.

After the trimming step, further silicon nitride 302 is provided to fill the channel (also referred to as a trench). The result of this is shown in FIG. 3(*ix*). Due to the bulk deposition of silicon nitride, all exposed surfaces of the device are covered. Therefore, in a subsequent step shown in FIG. 3(*x*), a further CMP process is performed to render the upper surface of the device flat. The CMP process is performed until the top surface of silicon dioxide layer 104 is exposed, as well as the top surface of the P—InGaAs layer.

Next, in a metallization step, p-contact seed metal layer 305 is provided in contact with the upper surface of the P—InGaAs layer. The result of this is shown in FIG. 3(*xi*). After the p-contact seed metal layer has been provided, further silicon dioxide 104 is disposed over the upper surface of the device, and this silicon dioxide is then capped with a silicon nitride layer 307. The result of this is shown in FIG. 3(*xii*).

FIG. 3(*xiii*) shows a subsequent manufacturing stage from a sectional view (top) and a top-down view (bottom). A photoresist 308 is provided and patterned in the manner shown in the top-down view. The photoresist defines the waveguides to be etched, as well as covering lateral sides of the device coupon. The top-down view has had the silicon nitride 307 and silicon dioxide layers 104 removed for clarity.

FIG. 3(*xiv*) shows a top-down view of the device after a dry etch is used to remove the silicon nitride 307 layer which is not covered by photoresist 308. FIGS. 3(*xiv*)(A)-(D) are section views along the lines A-A' to D-D' respectively. Notably, in FIG. 3(*xiv*)(C), an important result of the dry etch can be seen. The etch is performed through to the silicon dioxide layer 104, and so leaves a rectangular portion of silicon nitride 307 located above the p-contact seed metal layer. Photoresist 308 is then removed.

Next, as shown in FIG. 3(*xv*), a further photoresist 309 is disposed over the device coupon and some surrounding areas of the SOI wafer. The uncovered portions are then dry etched to remove any exposed regions of silicon dioxide, the results of which are shown in FIGS. 3(*xv*)(A)-(D), again sections along the lines A-A' to D-D' respectively. Notably, in FIGS. 3(*xv*)(A), (B), and (D), it can be seen that the etch removes the portions of silicon dioxide not covered by the silicon nitride 307 layer or the further photoresist 309. The top surface of the device layer 103 is therefore exposed, as is the top surface of the silicon nitride 302.

The etch is continued, using the same photoresist 309 as in the step shown in FIG. 3(*xvi*). The etch now selectively removes silicon nitride, and uses silicon dioxide as a hard mask. The result of this is shown in FIGS. 3(*xvi*) and 3(*xvi*)(A)-(D) again corresponding section views. Notably, silicon nitride layer 307 has been entirely removed as shown in FIGS. 3(*xvi*)(A), (B), and (D). Also of note, is that the etch extend partially into the silicon nitride 302 used to line the channel. This results in an inverted 'T' shape as shown in FIG. 3(*xvi*)(D), with a small ridge or rib of silicon nitride extending from a base of silicon nitride, the ridge or rib being capped by silicon dioxide 104.

The etch is, again, continued, this time selectively etching silicon and amorphous silicon. Silicon dioxide is again used as a hard mask. The result of this is shown in FIG. 3(*xvii*) and FIG. 3(*xvii*)(A)-(D) which are again corresponding section views. This time, as shown in FIGS. 3(*xvii*)(A) and (B), the silicon device layer 103 and α-Si portion 303 are etched to provide an inverted 'T' shape. Each has a small ridge or rib of silicon or α-Si extending from a corresponding base. Both are capped with silicon dioxide 104. The α-Si portion 303 is also capped by a silicon nitride 302 portion which is between the silicon dioxide and the α-Si portion.

Notably, this etching step defines (geometrically) the silicon waveguide(s) and α-Si portion of the bridge-waveguide. In this example, there is only a single silicon waveguide in the device layer 103, as the device is intended to function as a laser (and so needs only have an output waveguide). Of course, in other examples, there may be two or more waveguides in the device layer.

In a final etching step using photoresist 309, another selective etch is performed which removes silicon nitride (using silicon dioxide as a hard mask). This etch only effects the silicon nitride adjacent to the α-Si, i.e. adjacent to the cavity sidewalls 105*a/b*. The result of this etch is shown in FIGS. 3(xviii) and 3(xviii)(A)-(D). Of note is FIG. 3(xviii) (D), where the height of the base silicon nitride 307 portion not covered by silicon dioxide 104 has been further decreased. The height of this silicon nitride portion is substantially equal to the height of the base portions in the device layer 103 and α-Si portion 303.

Photoresist 309 is then removed, and a further photoresist 310 is disposed over the portions of the device on either side of the cavity. This is shown in FIG. 3(*xix*), and FIG. 3(*xix*)(A)-(D), again section views. After this photoresist is provided, a dry etch is performed removing the silicon dioxide and two trenches 311 of the III-V based stack to thereby make a III-V based waveguide. The result of this is shown in FIG. 3(*xix*)(C) where trenches 311 are shown extending through silicon nitride layer 307, silicon dioxide 104, and layers of the device coupon. The etch is performed so that strips of the top surface of the MQW layer are exposed, through trenches 311. This etch defines the waveguide within the device coupon.

Photoresist 310 is then removed, as is the exposed silicon dioxide 104 and the uppermost layer of silicon nitride 302 (i.e. the one on the upper side of silicon dioxide 104). The result of this is shown in FIGS. 3(xx) and 3(xx)(A)-(D), again section views. Notably, as shown in FIG. 3(xx)(C), the silicon nitride layer 307 and some layers of the device coupon extend above a top surface of the device layer 103.

After this step, back side reflection facet 312 is etched into the device coupon. This is show in FIG. 3(xxi). The back side reflection facet 312 is on an opposing side of the bridge-waveguide to the output waveguide formed in the device coupon. In some embodiments, where a DBR laser is being manufactured, a further step shown in FIG. 3(xxi') is performed, in which a grating 313 is etched into a portion of the output waveguide. FIG. 3(xxi')(A) shows this grating in a section view along the line A-A'.

After the back side reflection facet has been provided, and in embodiments after the grating has been provided, an upper cladding layer 314 formed of silicon dioxide is disposed over the exposed surfaces of the device. After the upper cladding layer 314 has been provided, an etch is performed to provide an N contact via 315 which extends down through the device to expose an upper surface of the N doped layer InP 203. This is shown in FIG. 3(xxii) which is a section view along the lines C-C' given previously. After the N contact via 315 has been etched, n contact seed metal 316 is provided which electrically contacts the N doped InP layer. This is shown in FIG. 3(xxiii). Next, as shown in FIG. 3(xxiv), further silicon dioxide 314 is deposited, the N contact via 315 and P contact via 317 are opened so that the top surface of the P and N contact seed metal layers are exposed.

Next, in a metallization step shown in FIG. 3(xxv), a top view, and FIG. 3(xxv)(A), a section view along the line A-A', P contact 319 and N contact 320 are provided. Further, the back side reflection facet is metallized providing a highly reflective back side reflection facet 318.

This step completes the manufacturing of a III-V based laser which is integrated with a silicon based platform. As can be seen in FIG. 3(xxv), output waveguide 330 is optically coupled through bridge waveguide 332, to a waveguide 334 within the III-V device coupon. The inaccuracies in locating the device coupon within the cavity are therefore overcome through the use of a bridge-waveguide which fills the gap between the waveguide in the device coupon and the output waveguide.

Figure 3X:
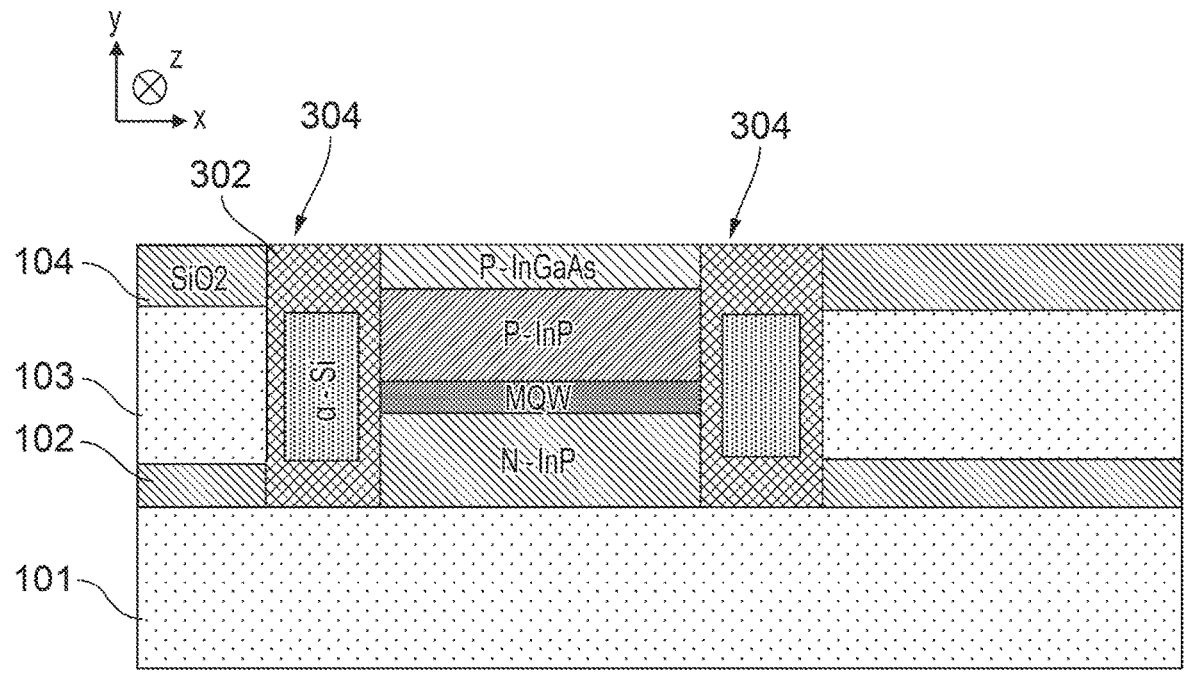
Figure 3:
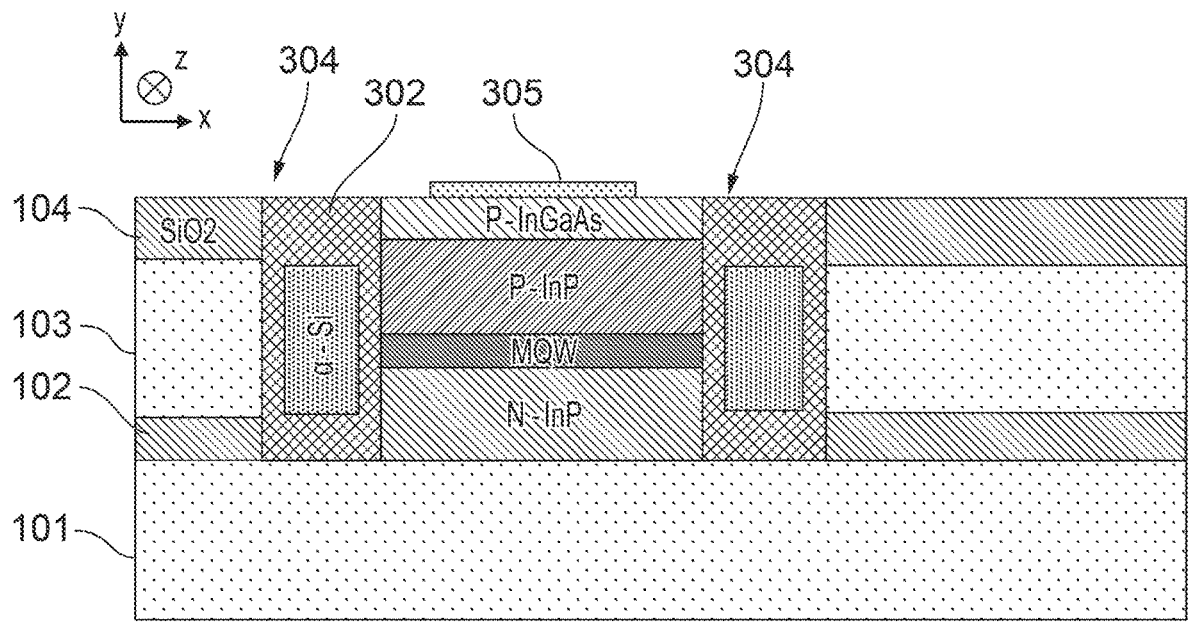
Figure 3:
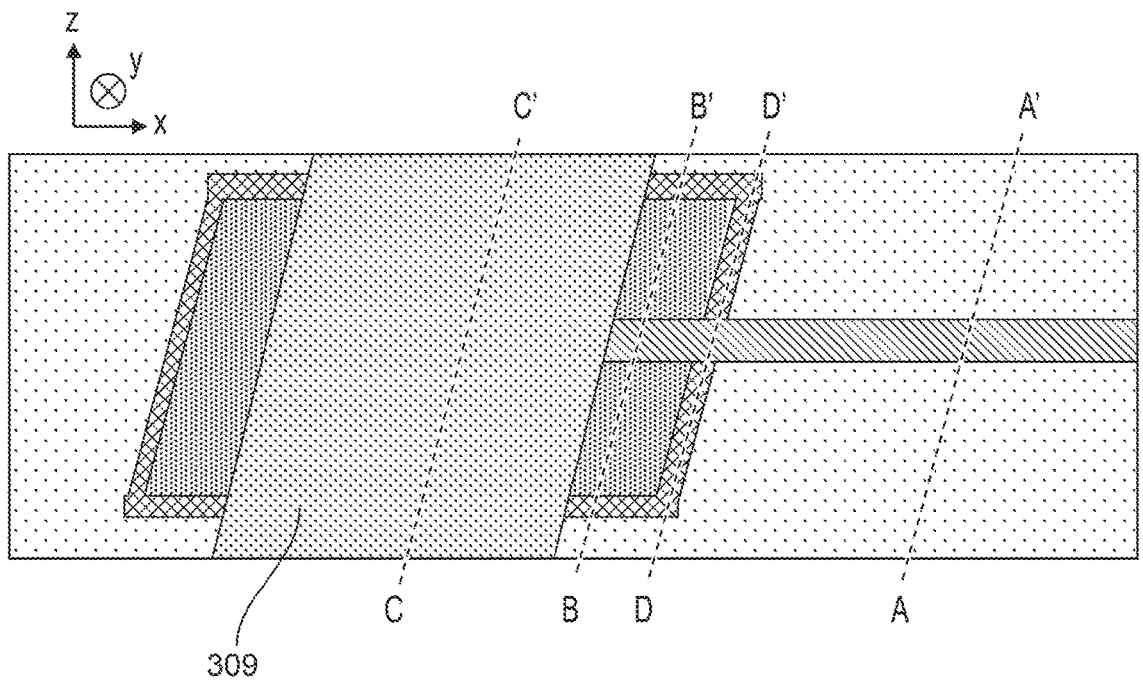
Figure 3:
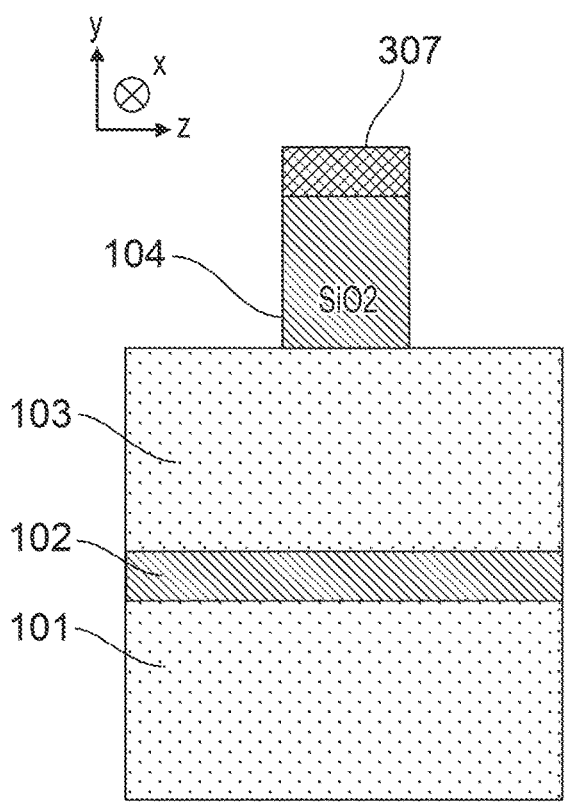
Figure 3:
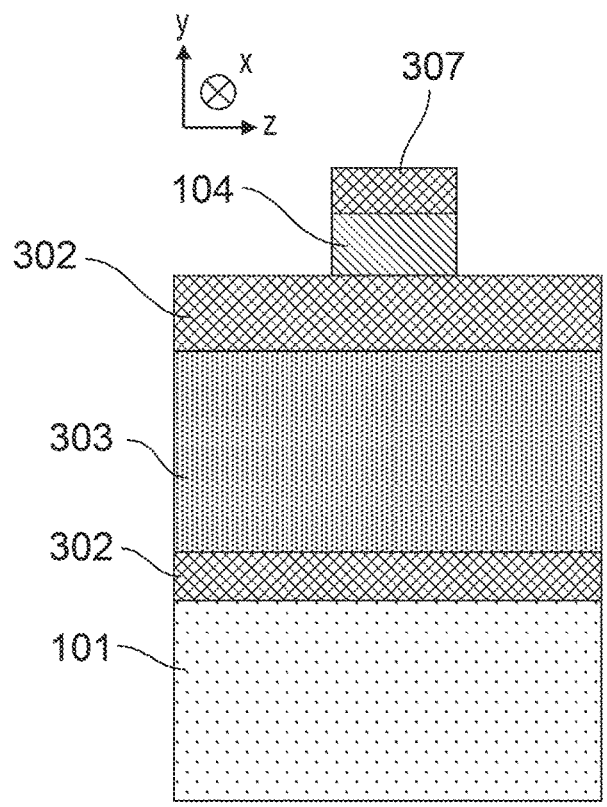
Figure 3:
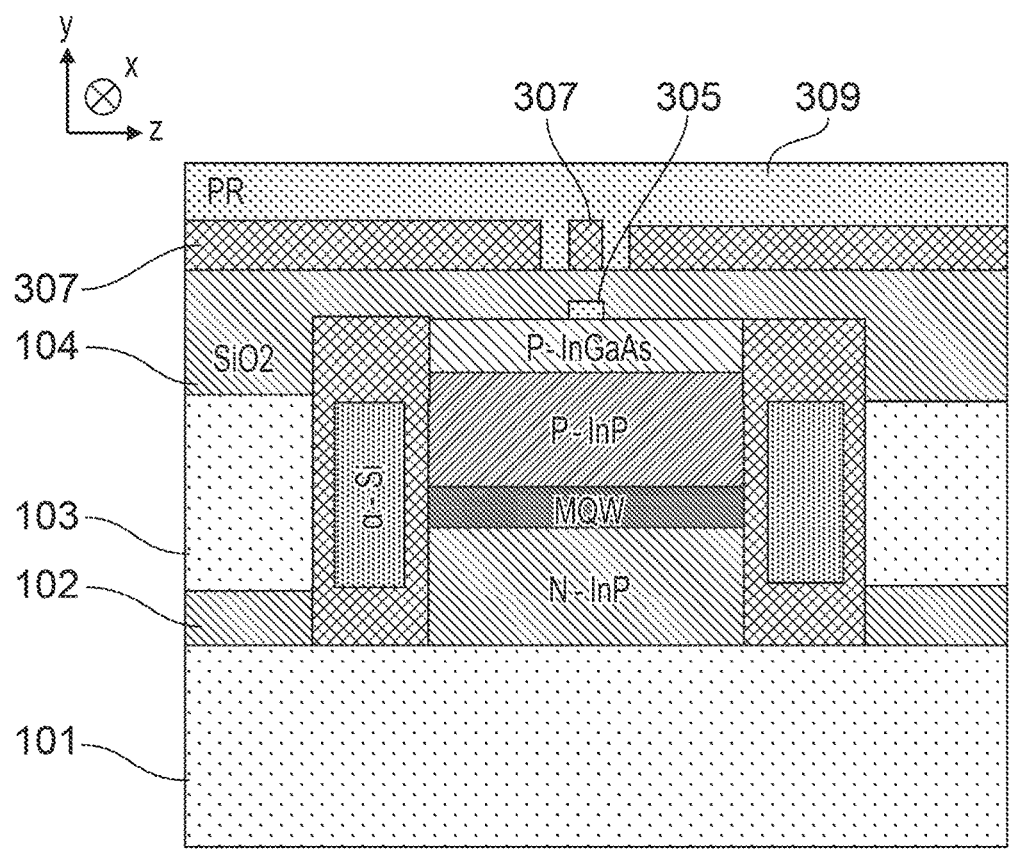
Figure 3:
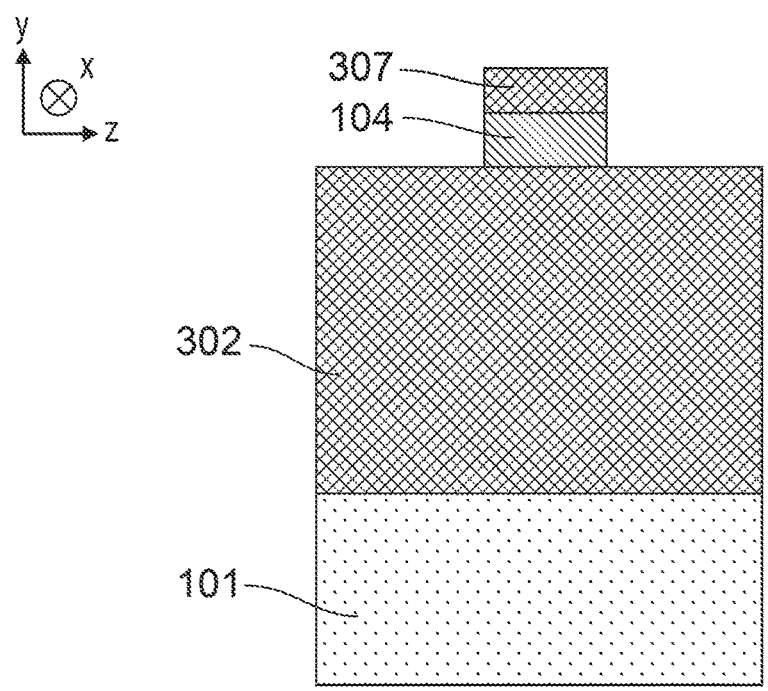
Figure 3:
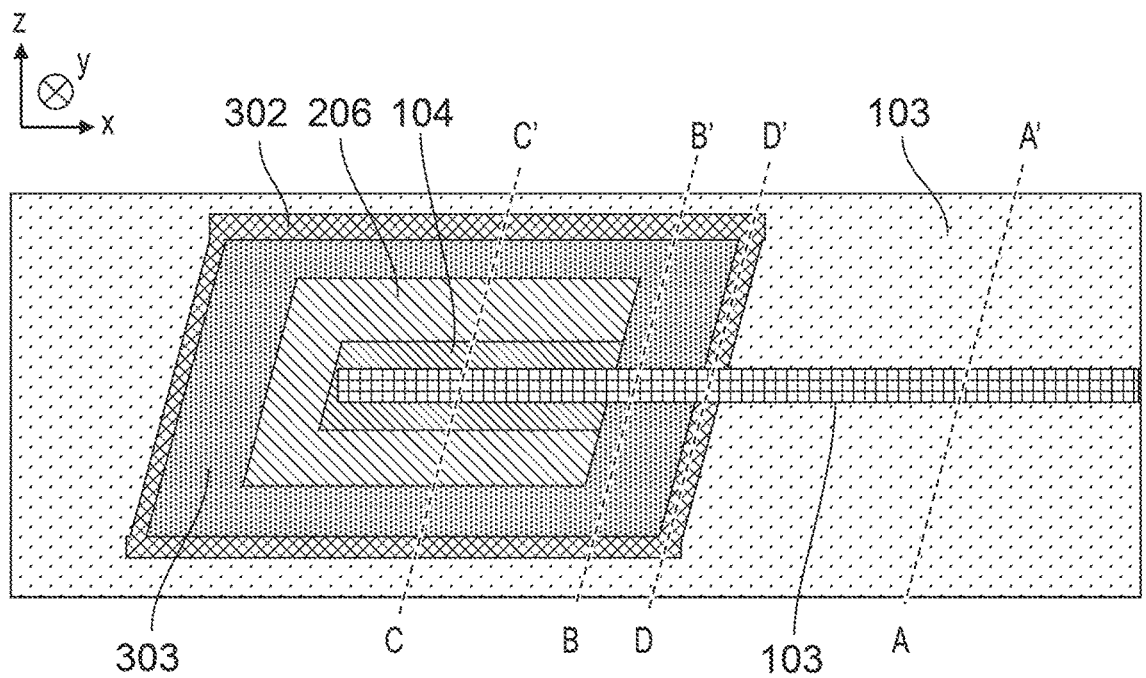
Figure 3:
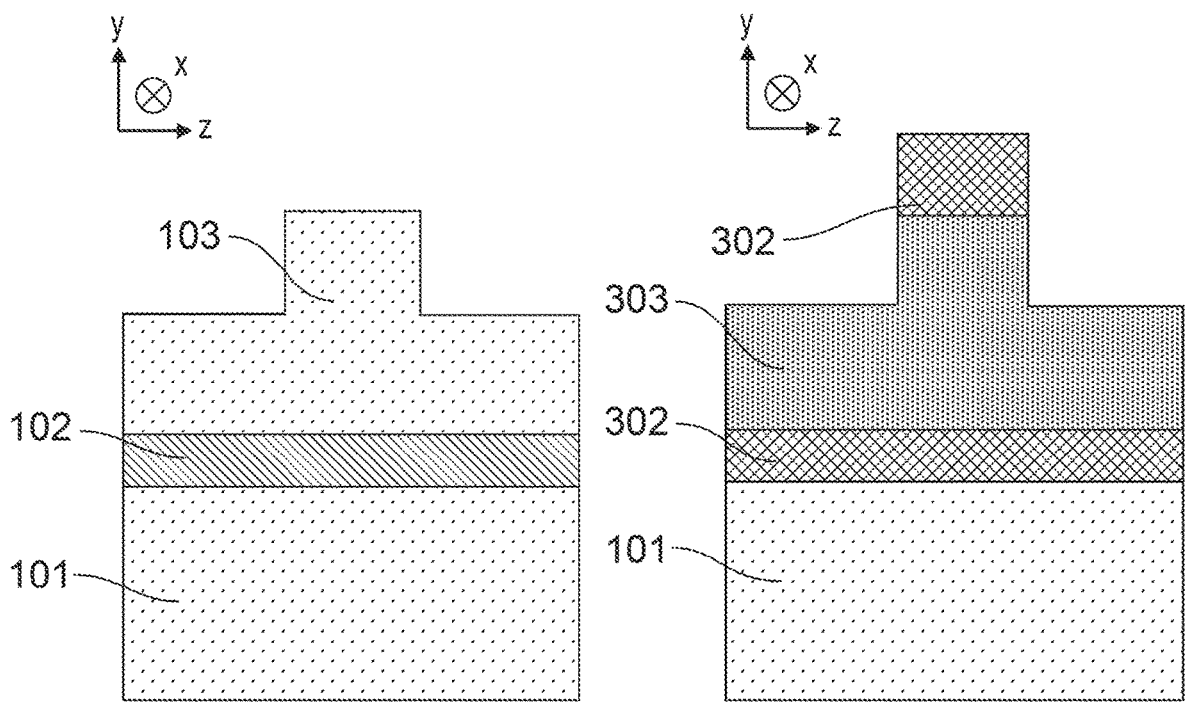
Figure 3:
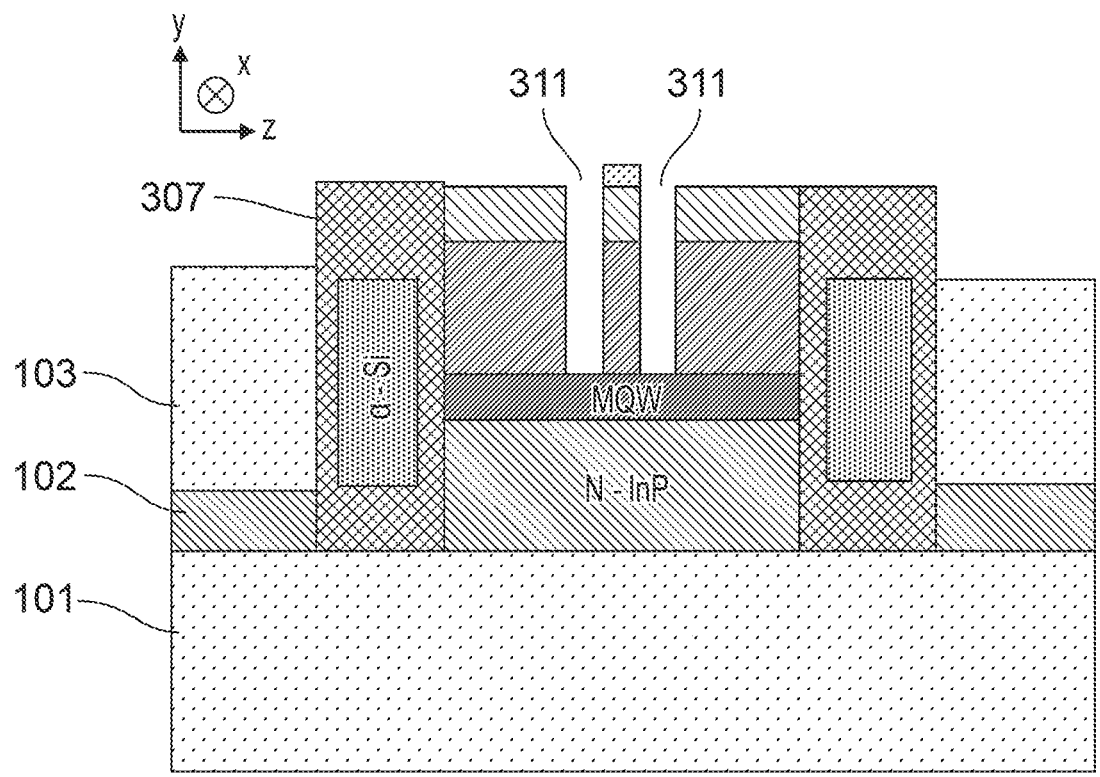
Figure 3:
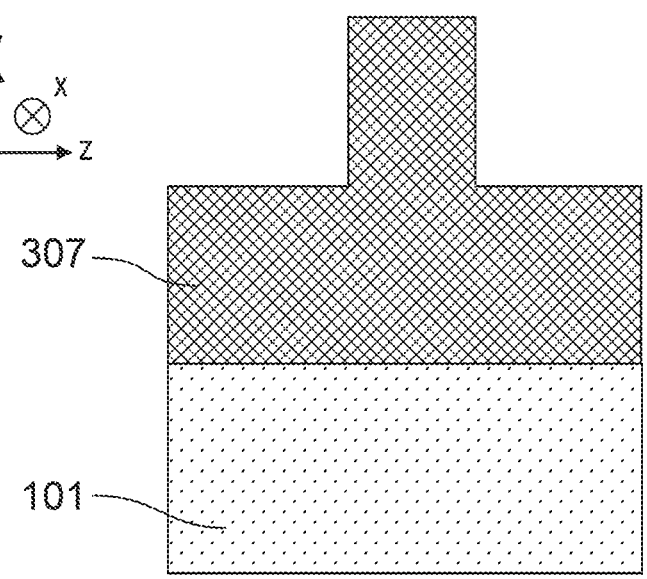
Figure 4I:
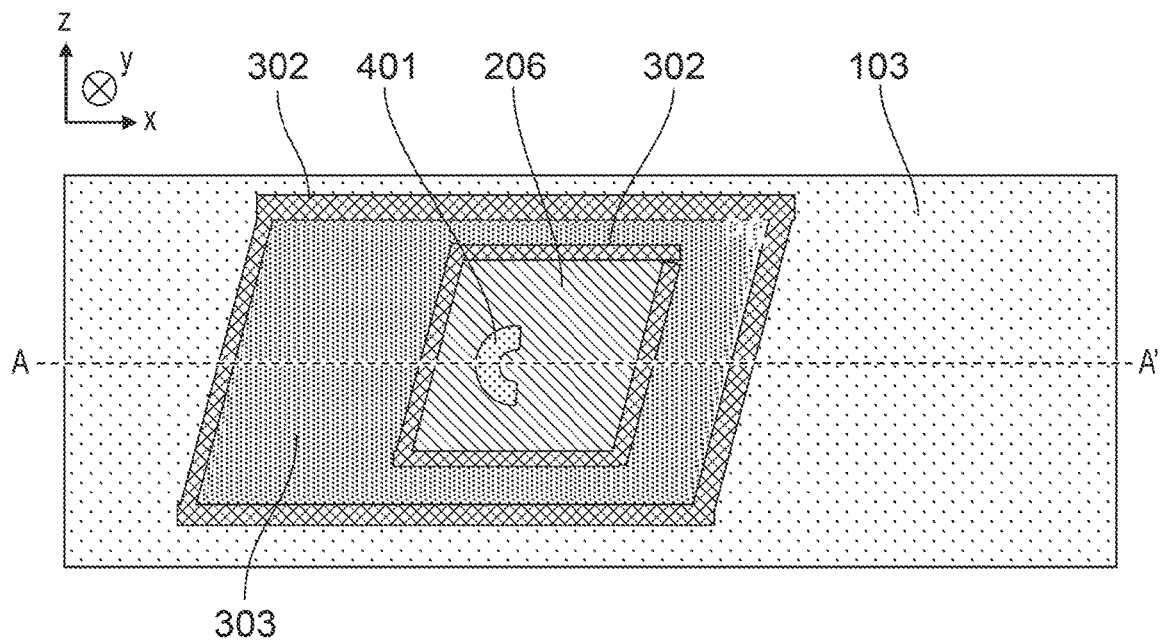
FIGS. 4(*i*)-4(*xvii*)(D) show a variant method of manufacturing a III-V based optoelectronic device.
Figure 4I:
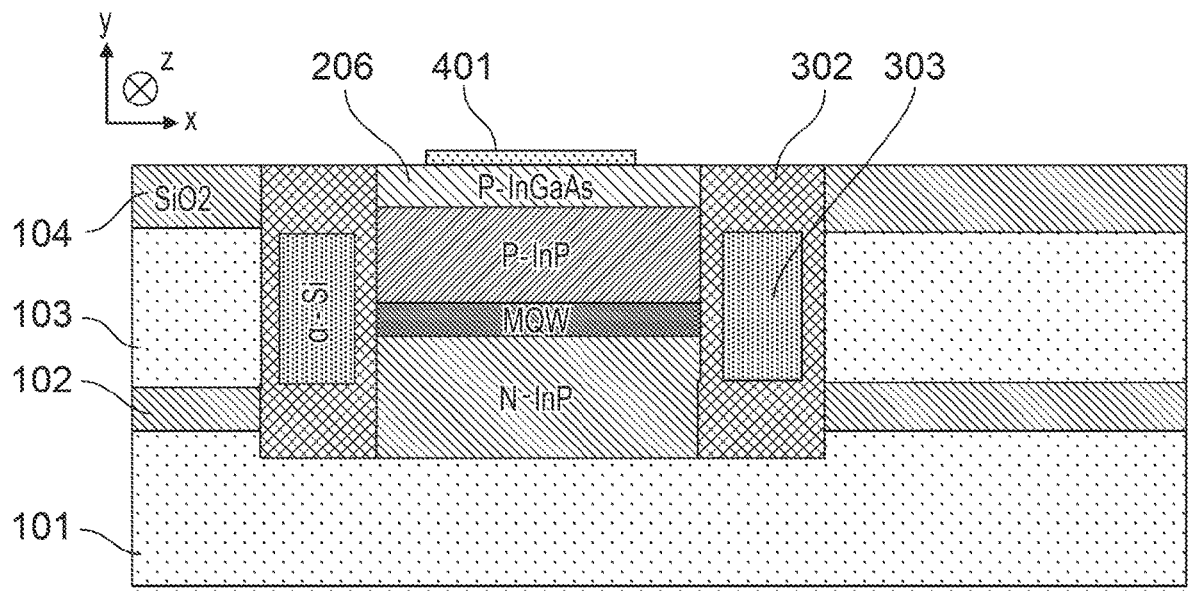
Figure 4:
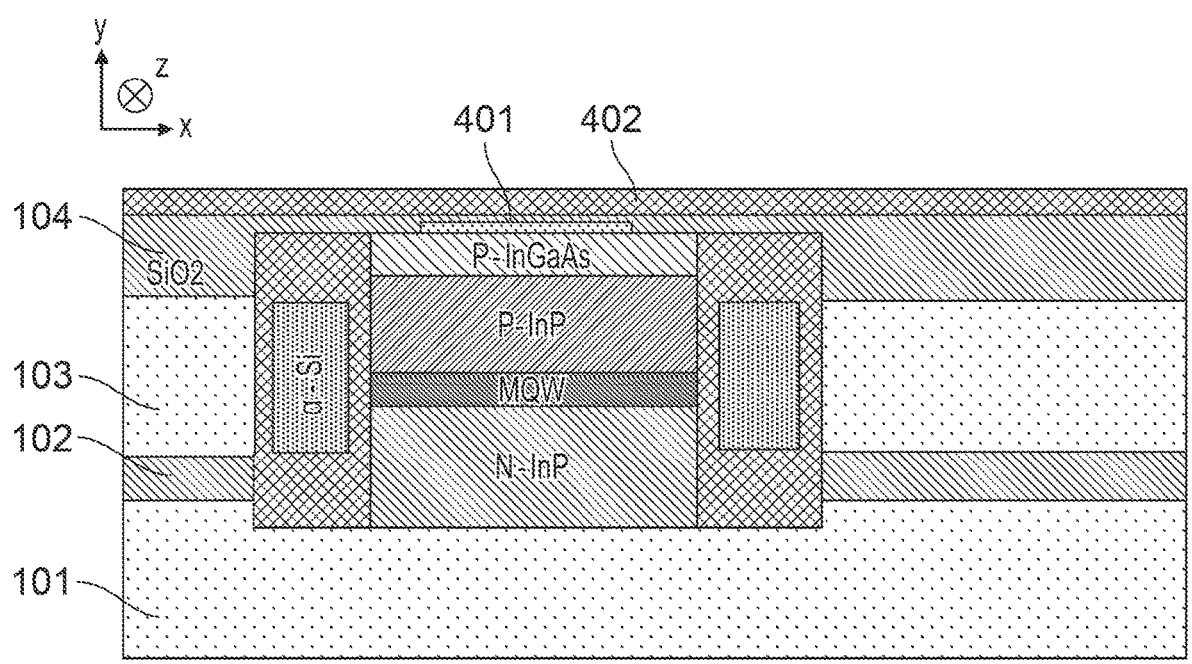
Figure 4:
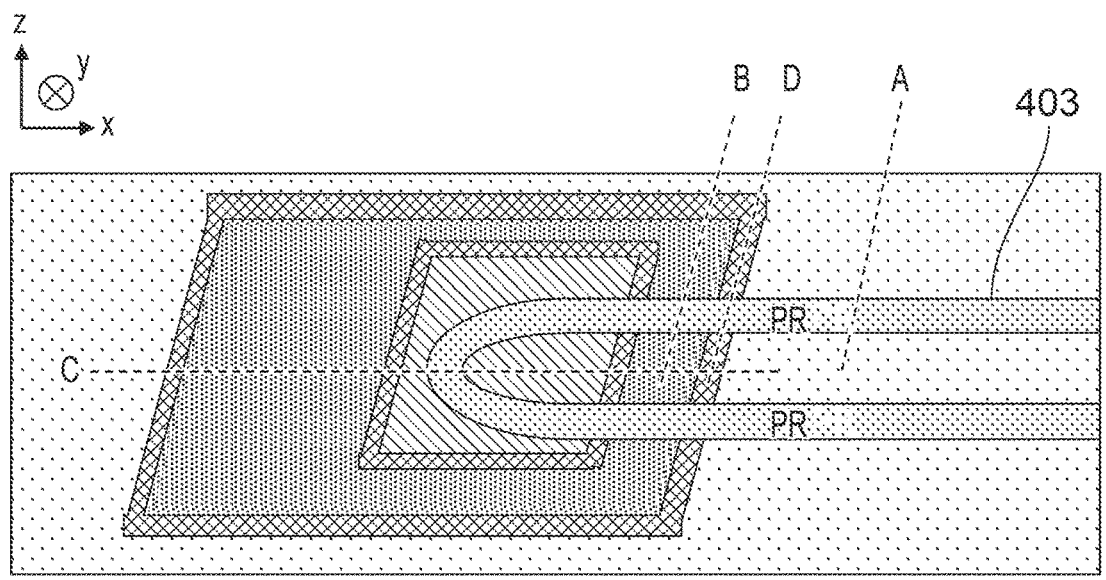
Figure 4:
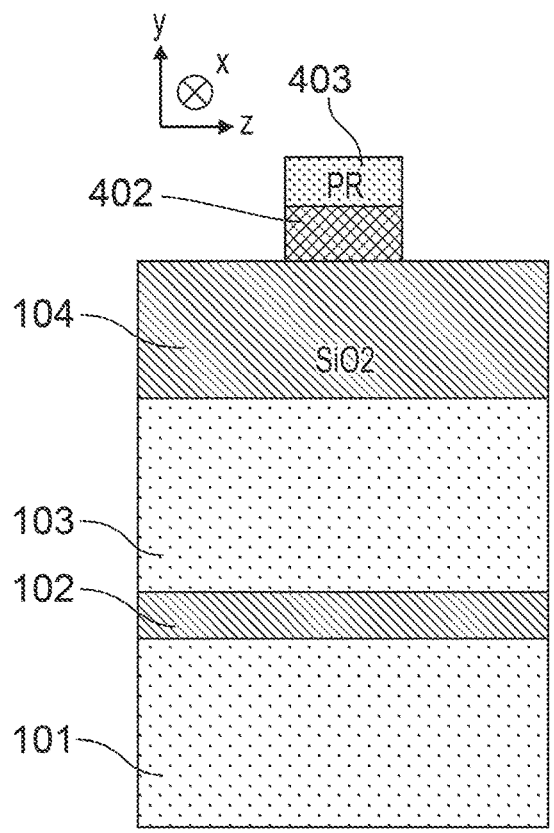
Figure 4:
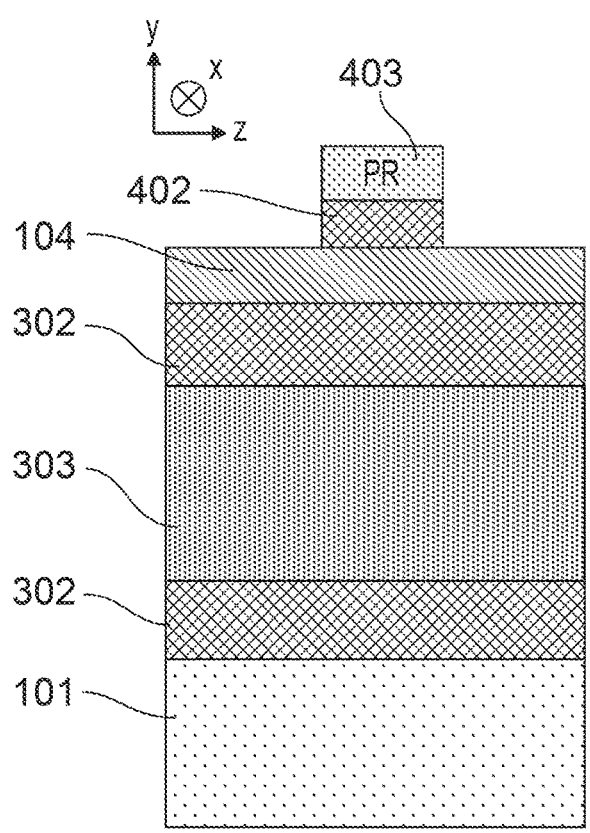
Figure 4:
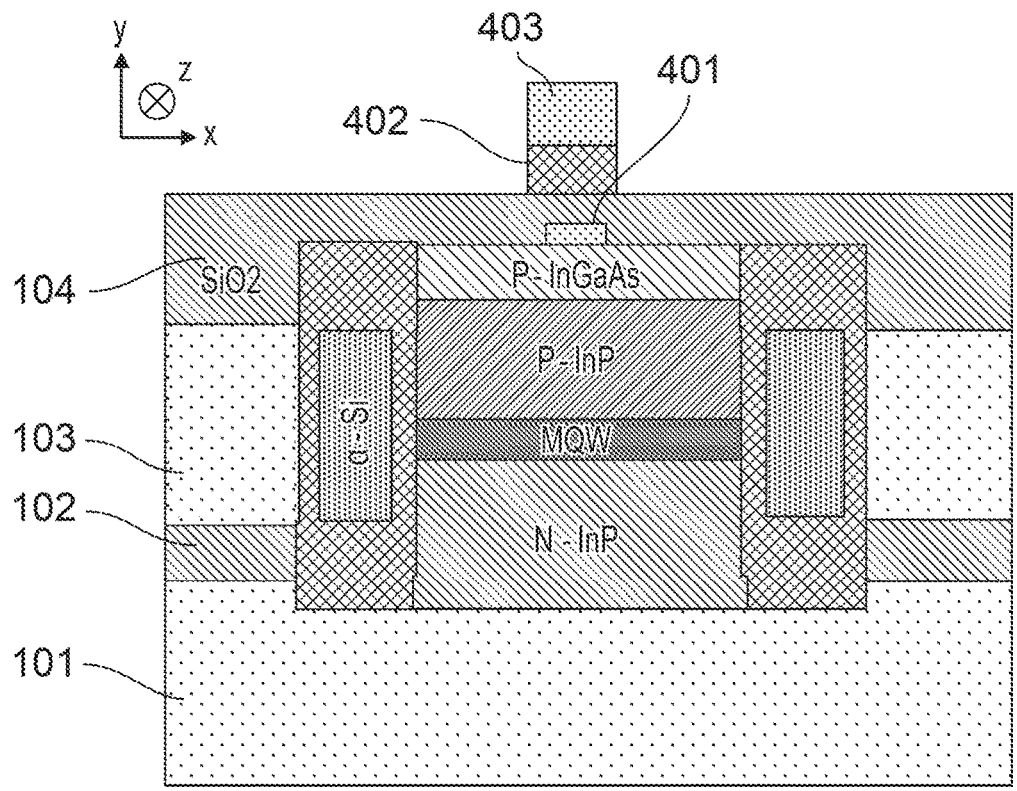
Figure 4:
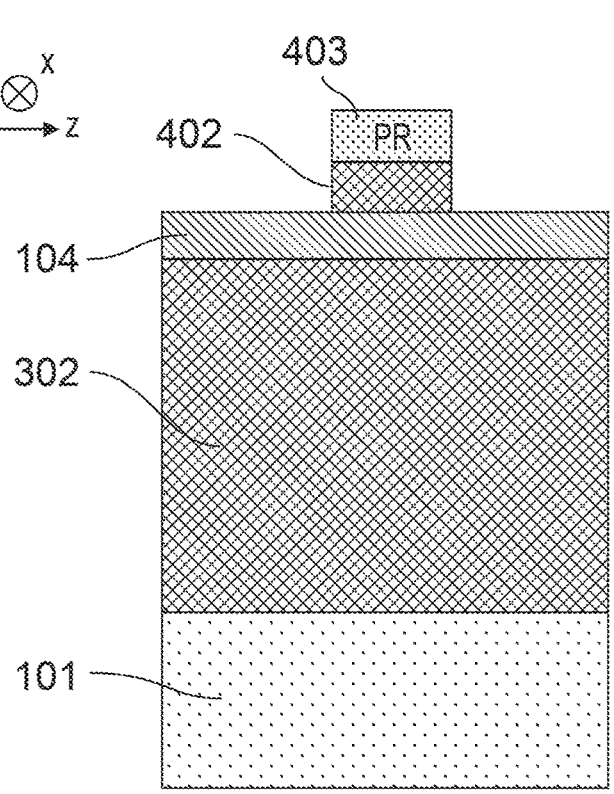

FIGS. 4(i)-4(xvii)(D) show various manufacturing steps of variant method. The steps up to but not including FIGS. 4(i) and 4(i)(A), a section view along the line A-A' of FIG. 4(i), substantially mirror those shown in FIGS. 3(i) to 3(x) and so these are not repeated here.

FIG. 4(i) shows a device coupon already bonded to the cavity of a silicon-on-insulator wafer according to the method discussed previously. Silicon dioxide layer 104 has been omitted for clarity. As can be seen the uppermost layer of the device coupon, in this instance P doped InGaAs layer 206 is exposed. The device coupon is surrounded by a layer of silicon nitride 302 and amorphous silicon 303. A step of providing P contact seed metal 401 has been performed. Notably, as best seen in FIG. 4(i) which is a top-down view, the P contact seed metal 401 has a C or crescent shape, due to the shape of the waveguide formed subsequently.

After the P contact seed metal 401 has been provided, further silicon dioxide 104 and then a silicon nitride layer 402 are deposited over the device. This is shown in FIG. 4(ii). The device is now ready for waveguide fabrication. Next, as shown in FIG. 4(iii), the top half of which is a section view along the lines A-D, and the bottom half of which is a top-down view, a photoresist 403 is provided and patterned. The patterned photoresist 403 defines the width of the input and output waveguides which will be optically coupled to respective bridge-waveguides. A curved, or U-shaped, waveguide is defined within the device coupon, which may mirror in curvature the C or crescent shaped P contact seed metal.

After the photoresist is provided, the silicon nitride 402 not covered by photoresist 403 is etched away via a dry etch. The silicon dioxide 104 is used as an etch stop. The result of this etch is shown in FIG. 4(iv), a top down view, and FIGS. 4(iv)(A)-(D) which are section views along the lines A to D respectively. As can be seen in the section views, a small portion of silicon nitride 402 is retained directly below the photoresist 403.

Figure 4V:
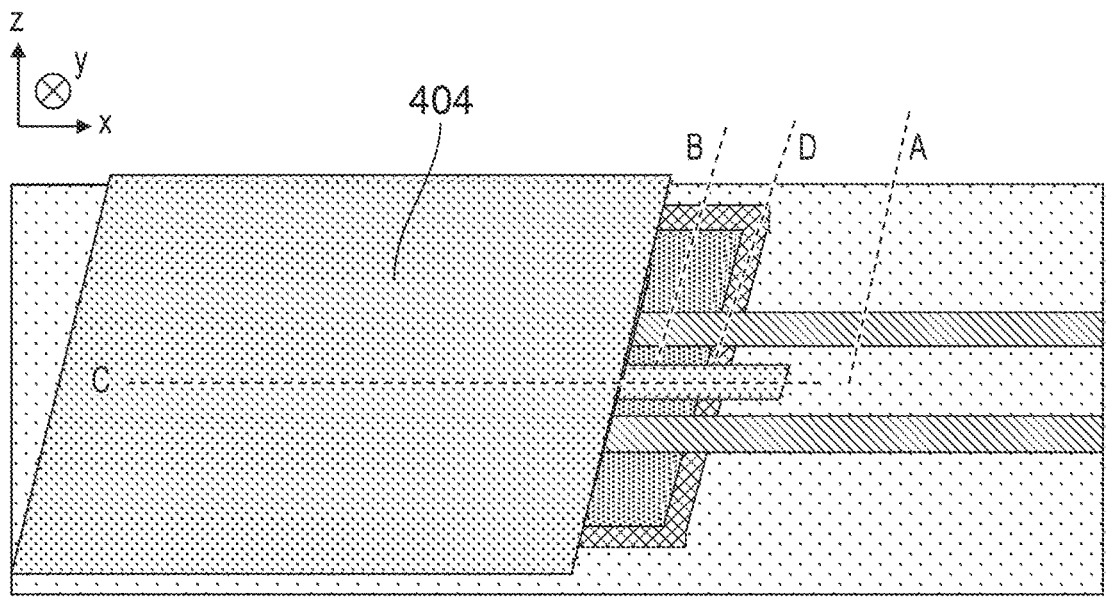
Figure 4V:
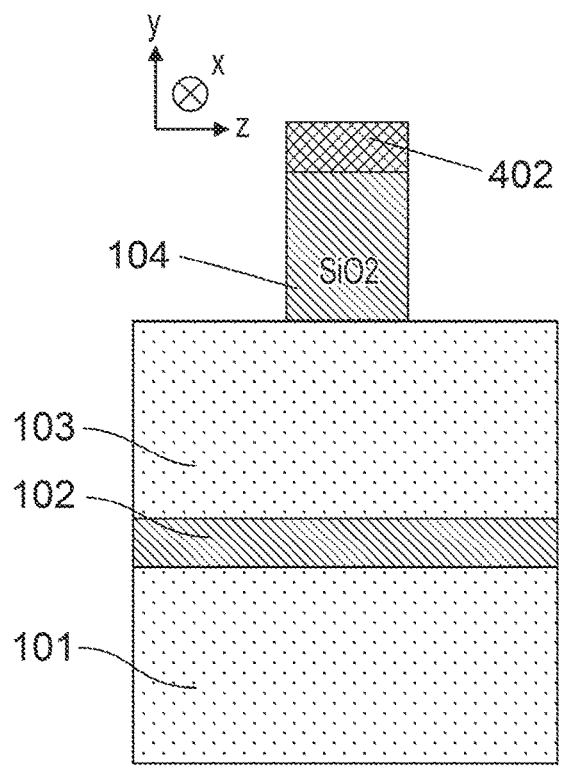
Figure 4V:
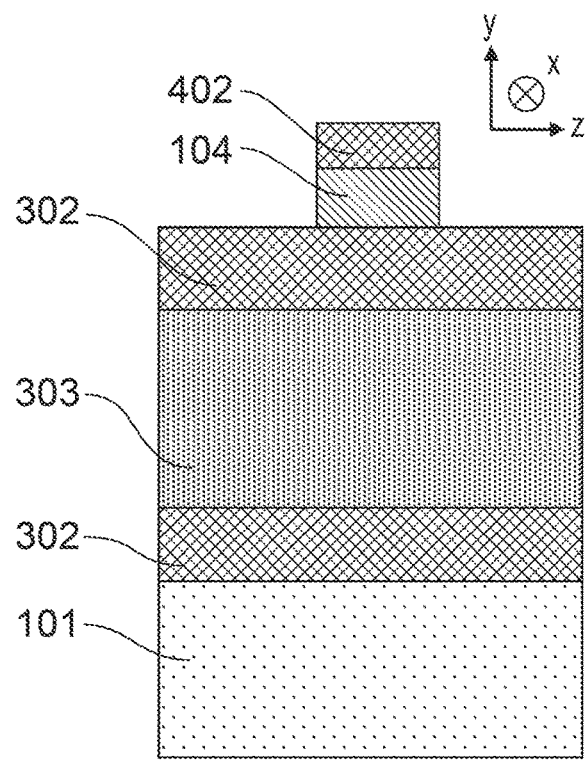
Figure 4V:
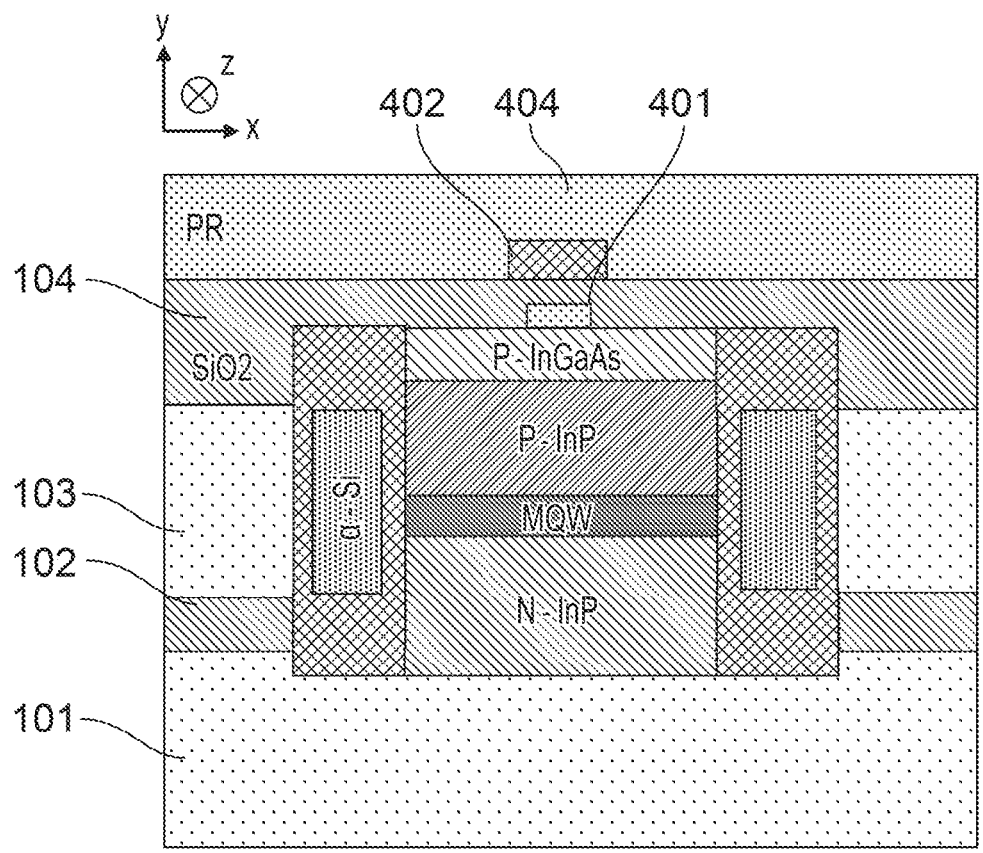
Figure 4V:
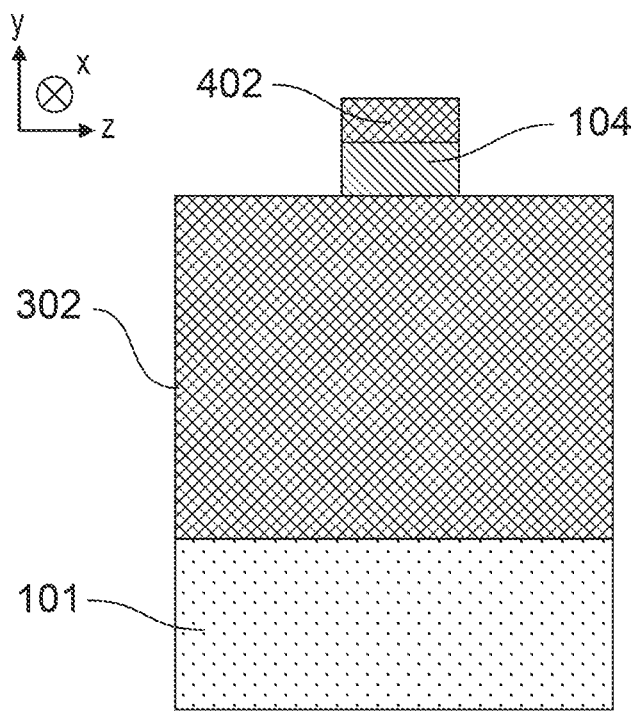
Figure 4:
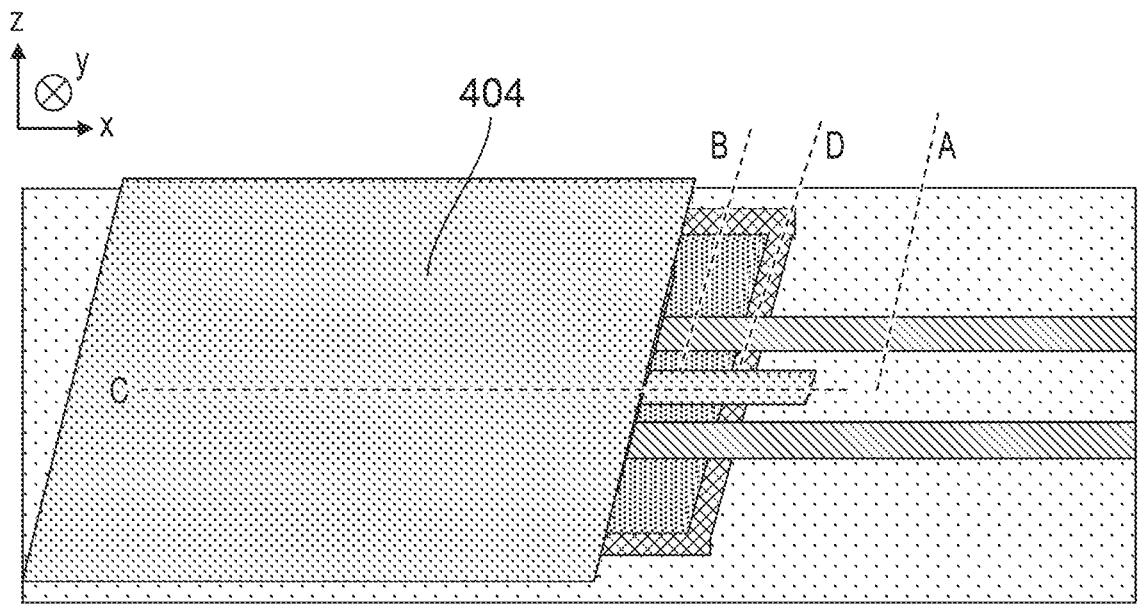
Figure 4:
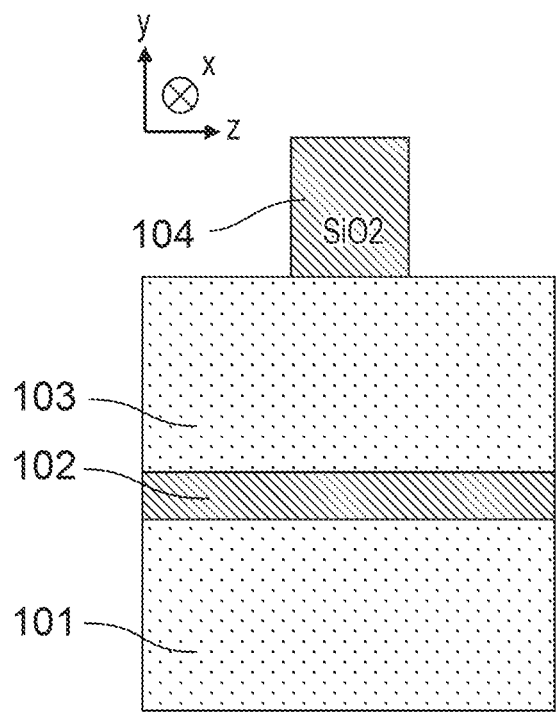
Figure 4:
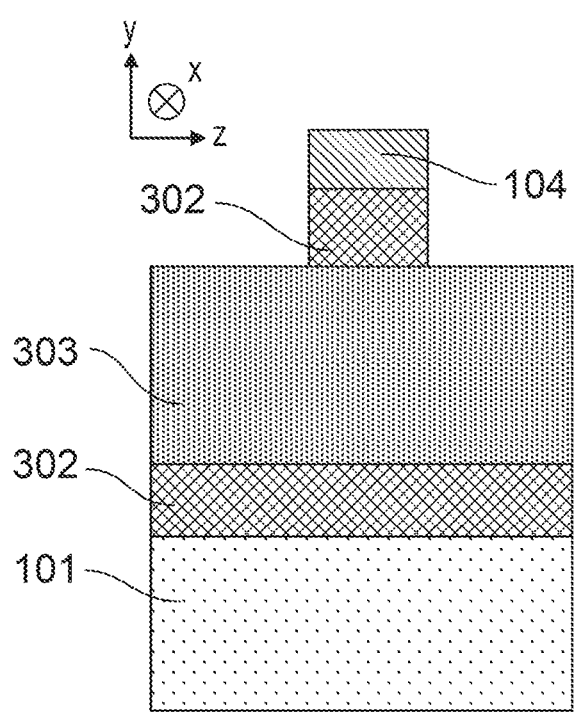
Figure 4:
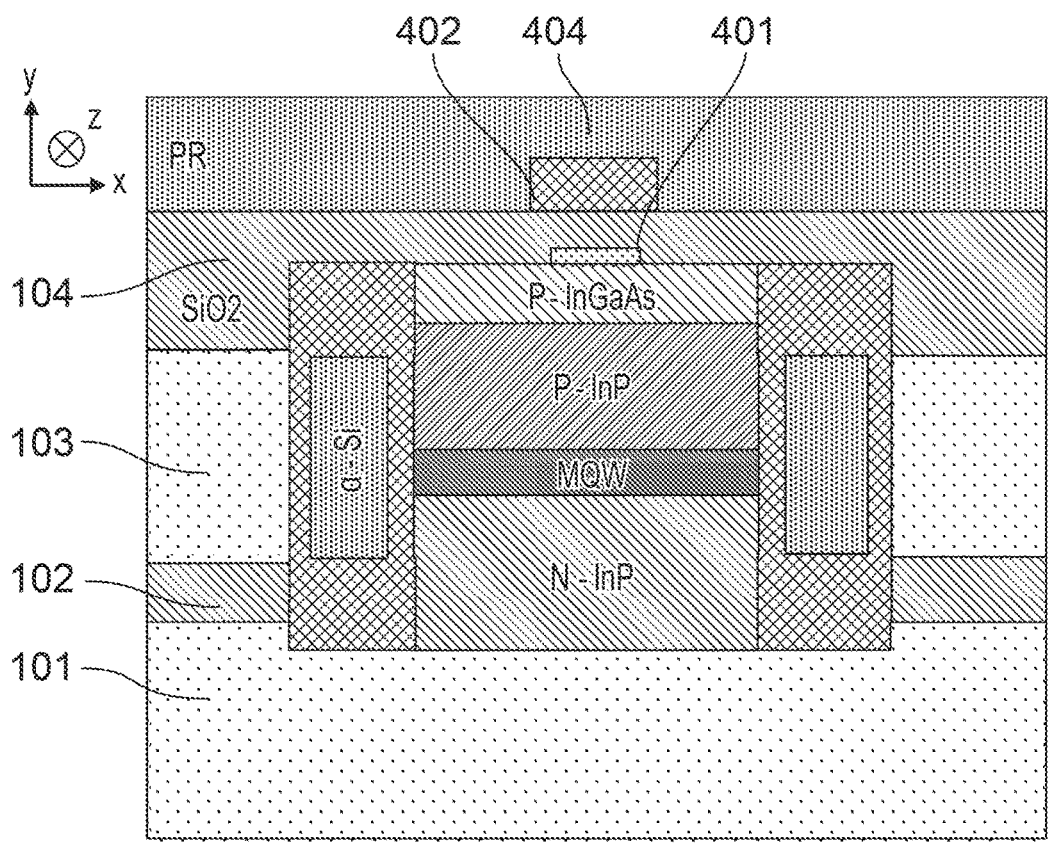
Figure 4:
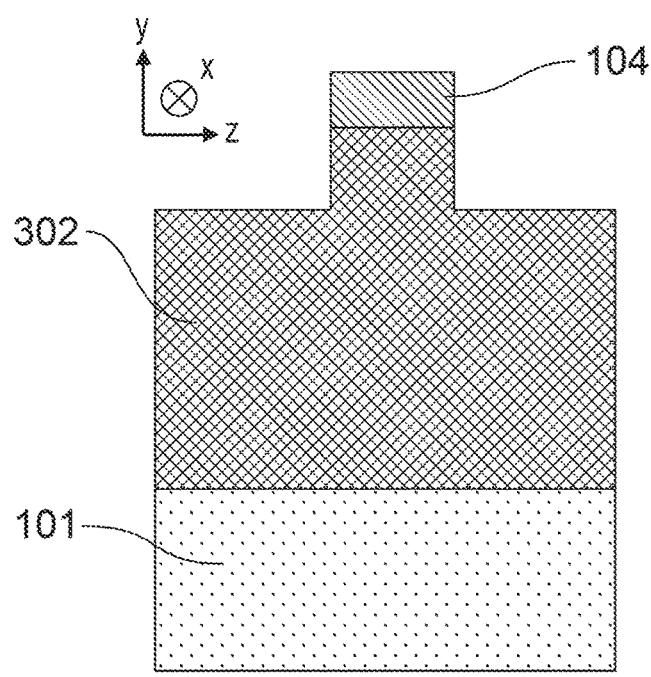
Figure 4:
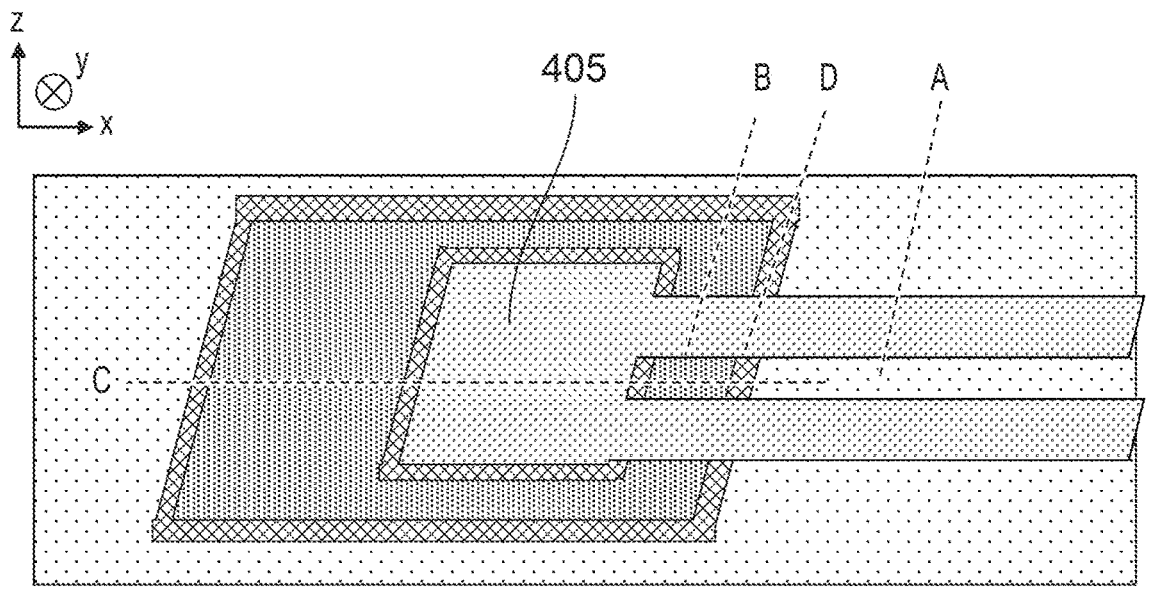
Figure 4:
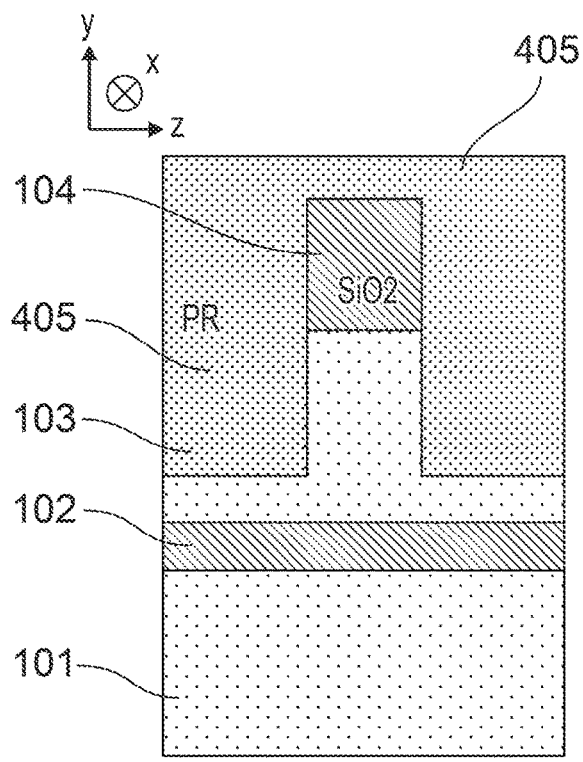
Figure 4:
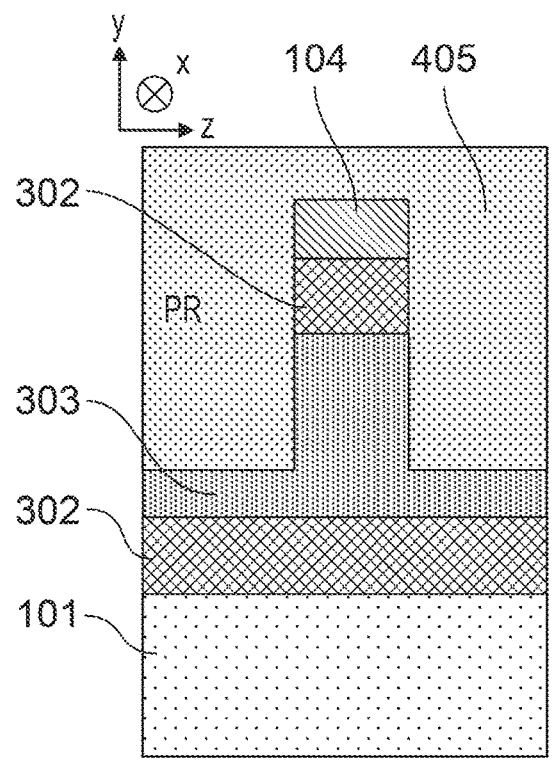
Figure 4:
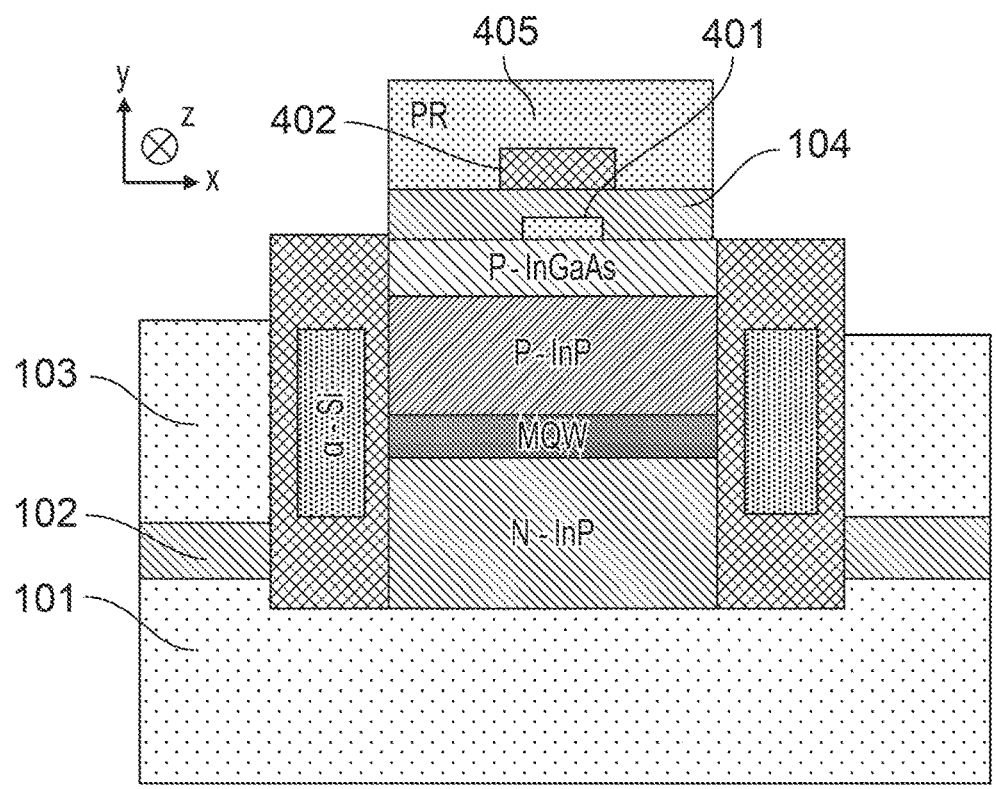
Figure 4:
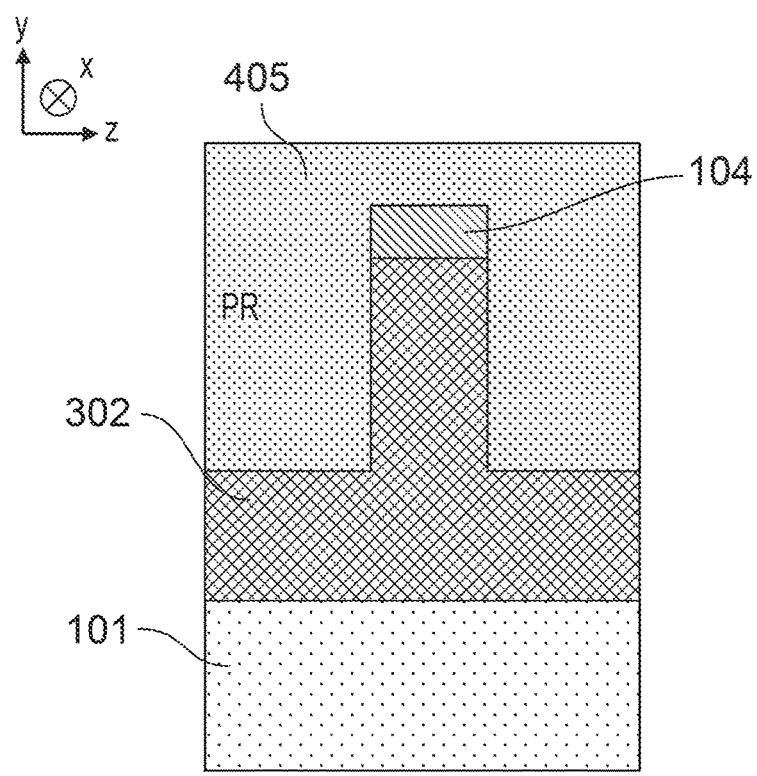

Photoresist 403 is then removed, and a further photoresist 404 is disposed over a region of the device including at least the device coupon, and also a portion of the device between the two legs of the previous photoresist 403 so as to enhance the isolation between the input and output waveguides. This is shown in FIG. 4(v). A dry etch is then performed, which removes the silicon dioxide 104 not covered by photoresist 404 or silicon nitride 402. The results of the etch can be seen in FIGS. 4(v)(A)-(D), again section views along the lines A to D respectively. Using the same photoresist 404, a selective dry etch is then performed to remove exposed silicon nitride 302. In this instance silicon dioxide 104 is used as a hard mask and so, as shown in FIGS. 4(vi) and 4(vi)(A)-(D), a portion of silicon nitride 302 is retained below the upper silicon dioxide 104 portion. As before, this etch results in a silicon nitride 302 region having an inverted T shape in which a rib or ridge extends from a base portion. The rib or ridge being underneath a silicon dioxide 104 cap. After this step, a further dry etch is performed using the same photoresist 404. This further dry etch selectively etches away silicon or α-Si, and uses silicon dioxide as a hard mask. The result of this further dry etch is shown in FIGS. 4(vii) and 4(vii)(A)-(D). This step defines the input and output waveguides provided in the silicon device layer 103, as well as the α-Si portions of the bridge-waveguides. This is most clearly seen in FIGS. 4(vii)(A) and (B). In a final dry etch using photoresist 404, the silicon nitride 302 is selectively etched away as shown in FIGS. 4(viii) and 4(viii)(A)-(D). This defines the silicon nitride portion of the bridge-waveguide, as most clearly seen in FIG. 4(viii)(D).

Figure 4X:
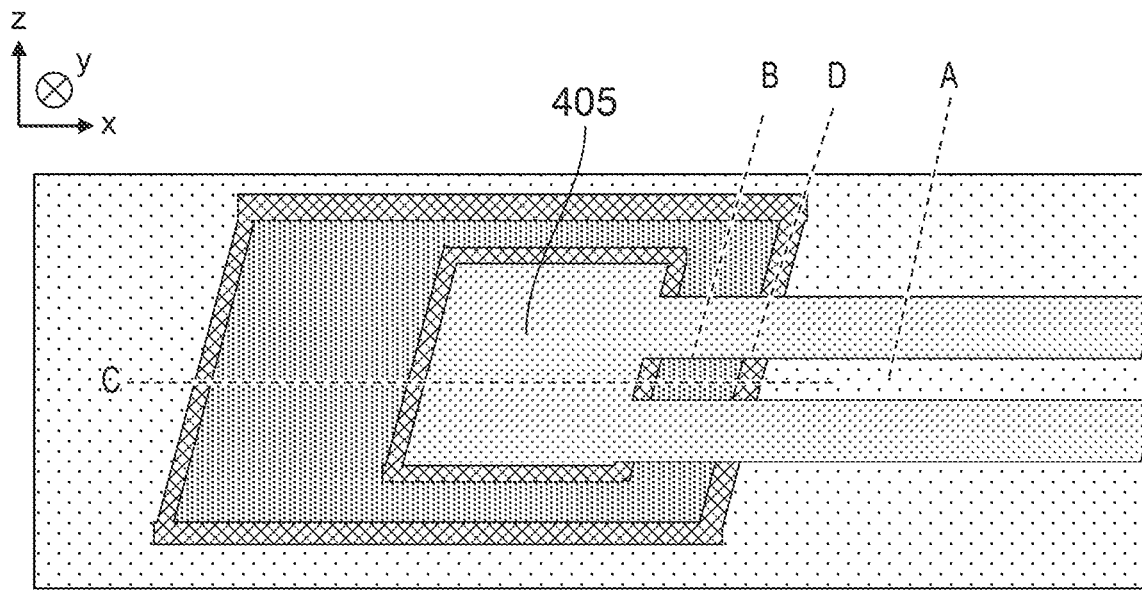
Figure 4X:
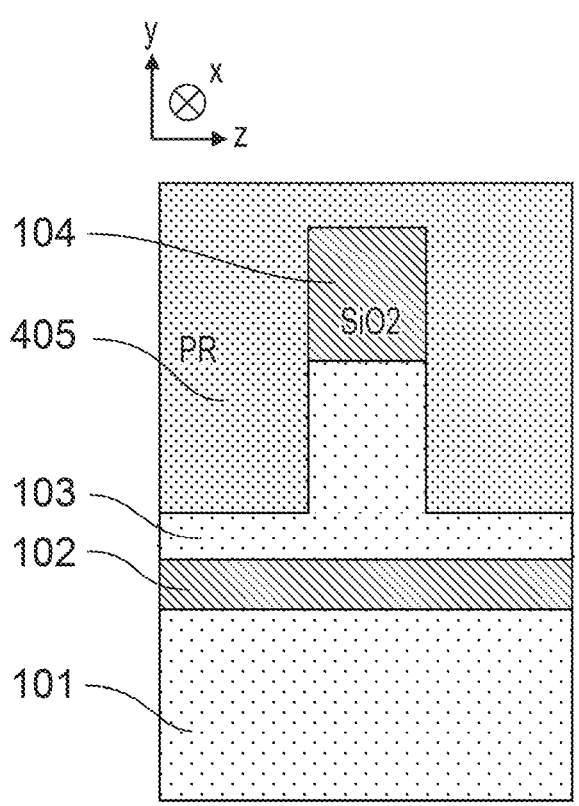
Figure 4X:
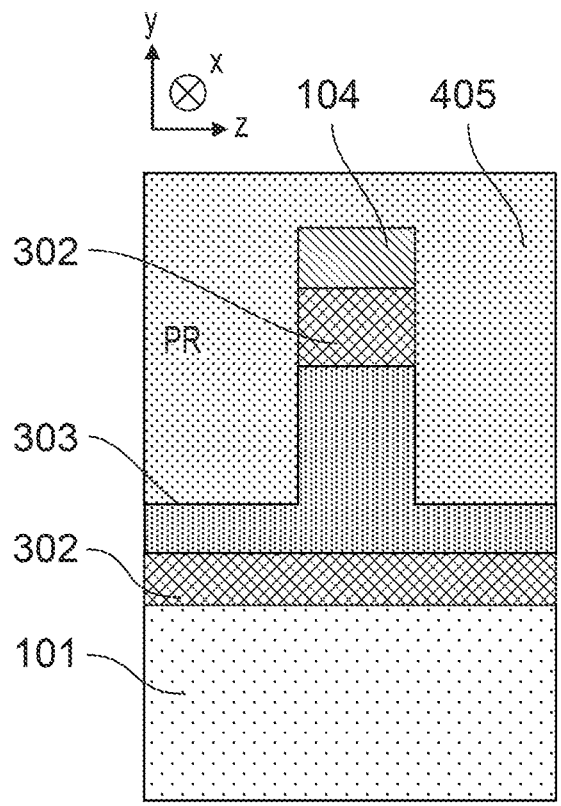
Figure 4X:
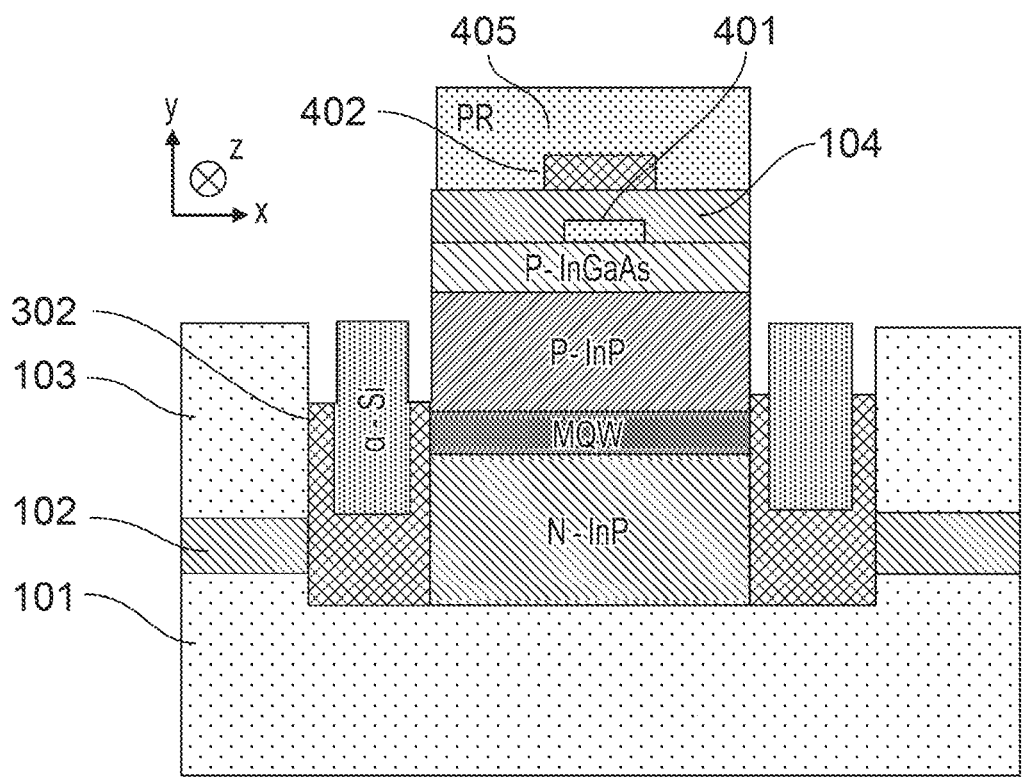
Figure 4X:
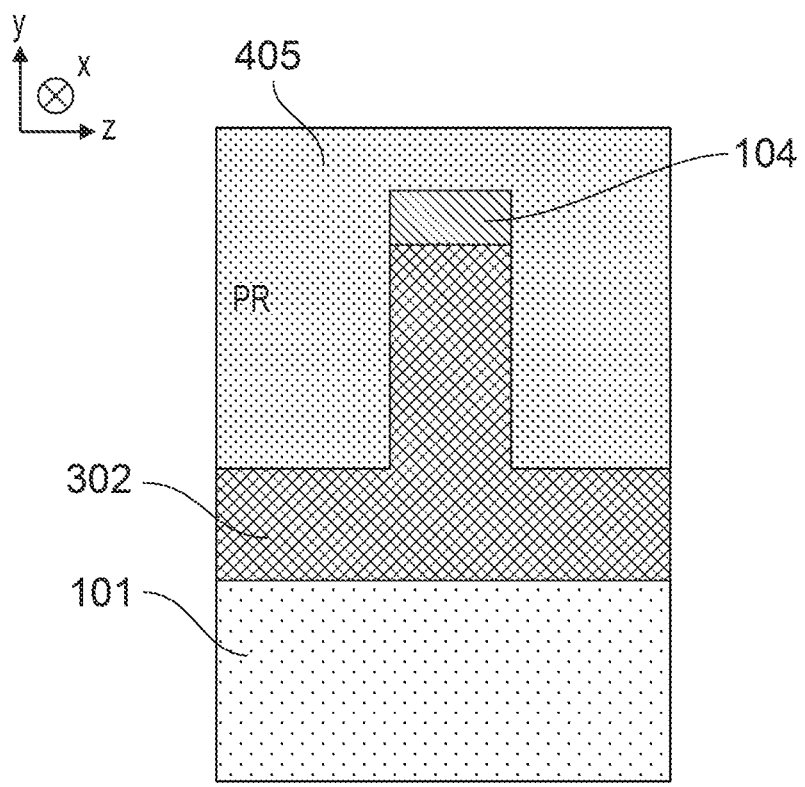
Figure 4:
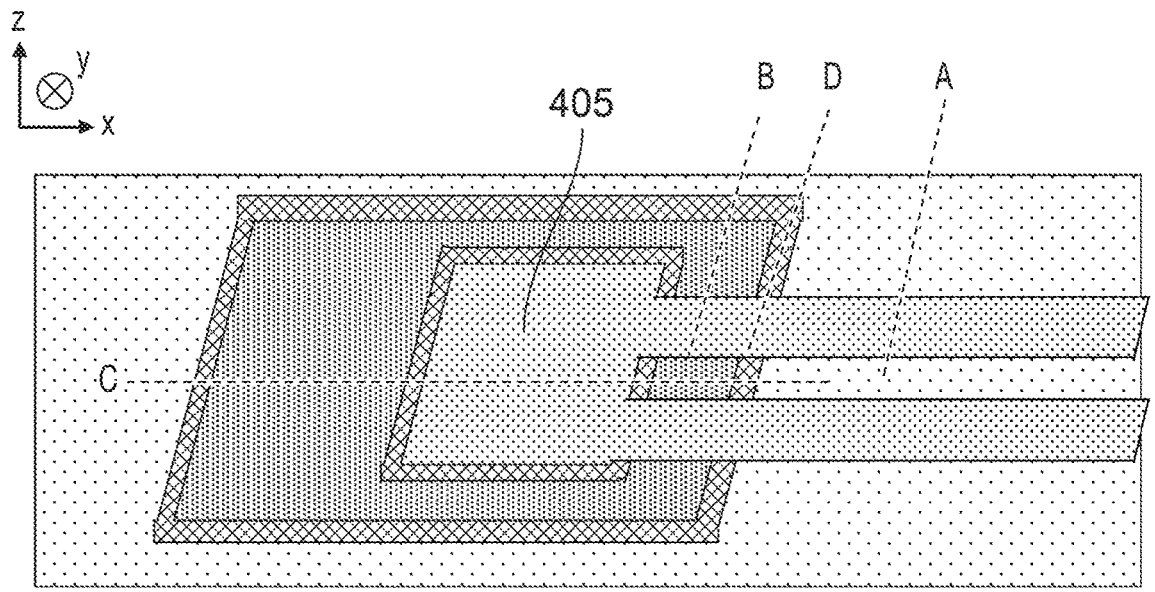
Figure 4:
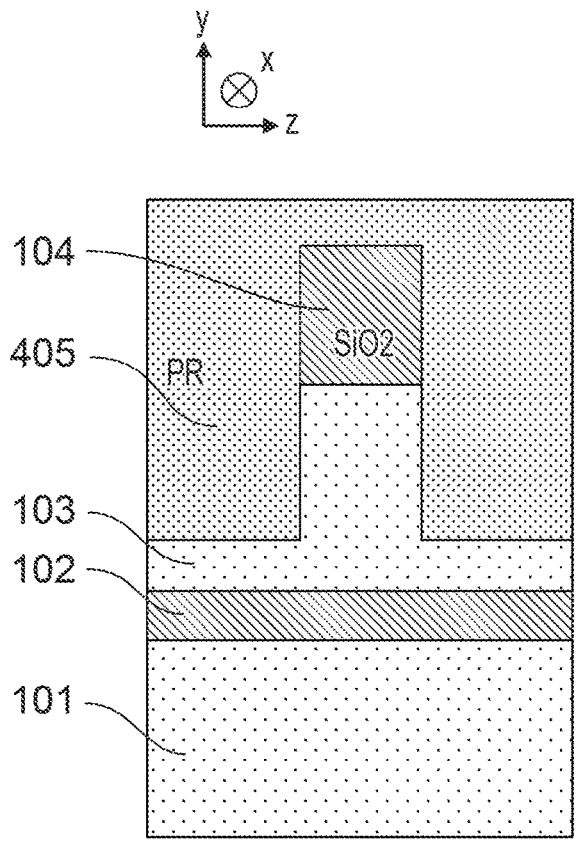
Figure 4:
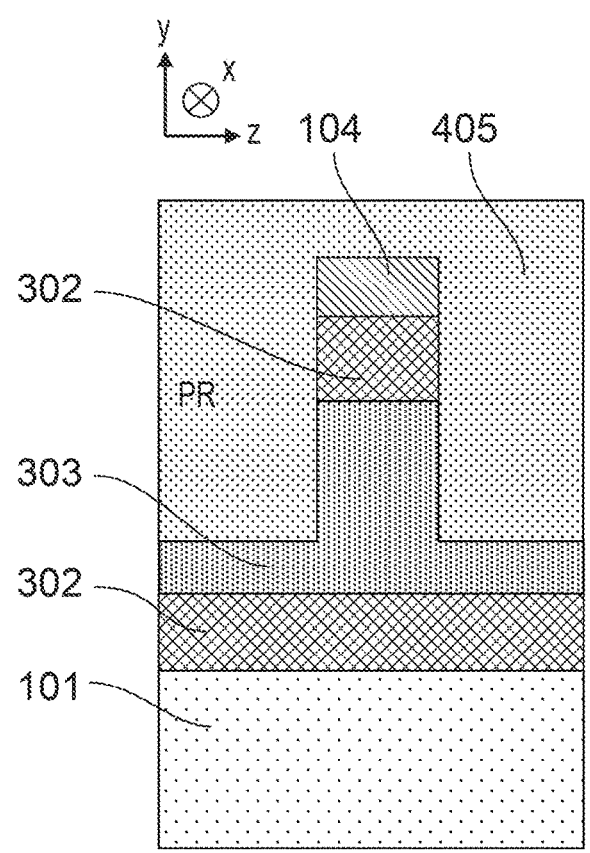
Figure 4:
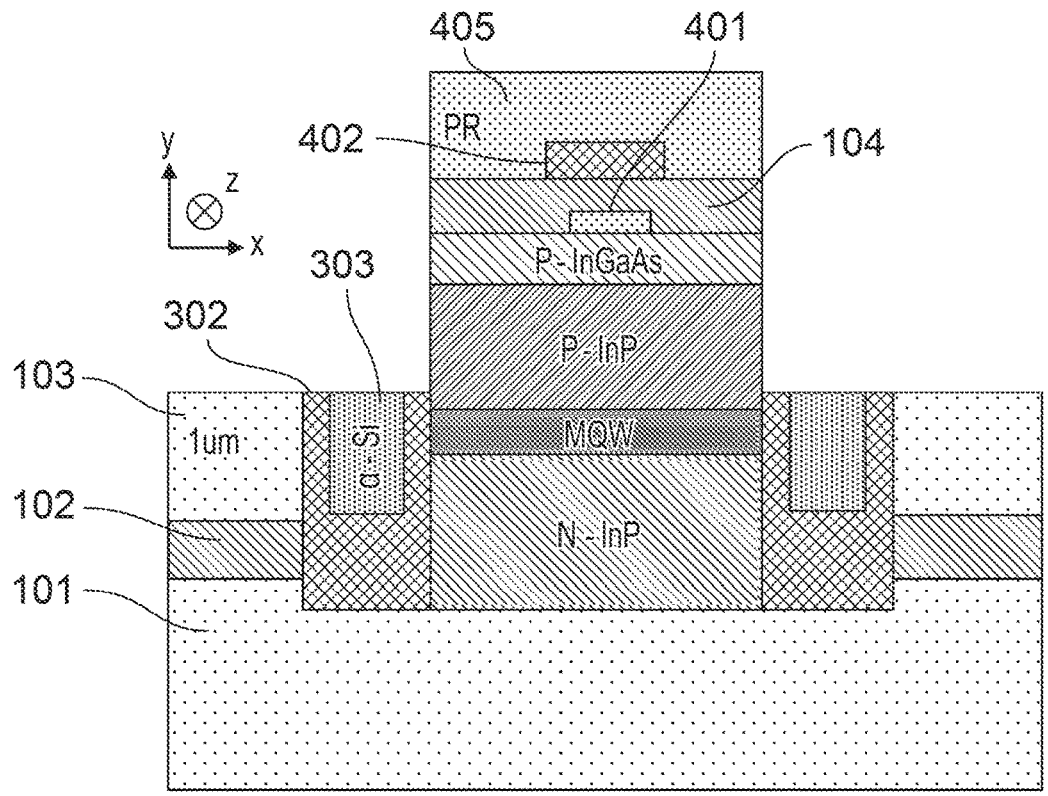
Figure 4:
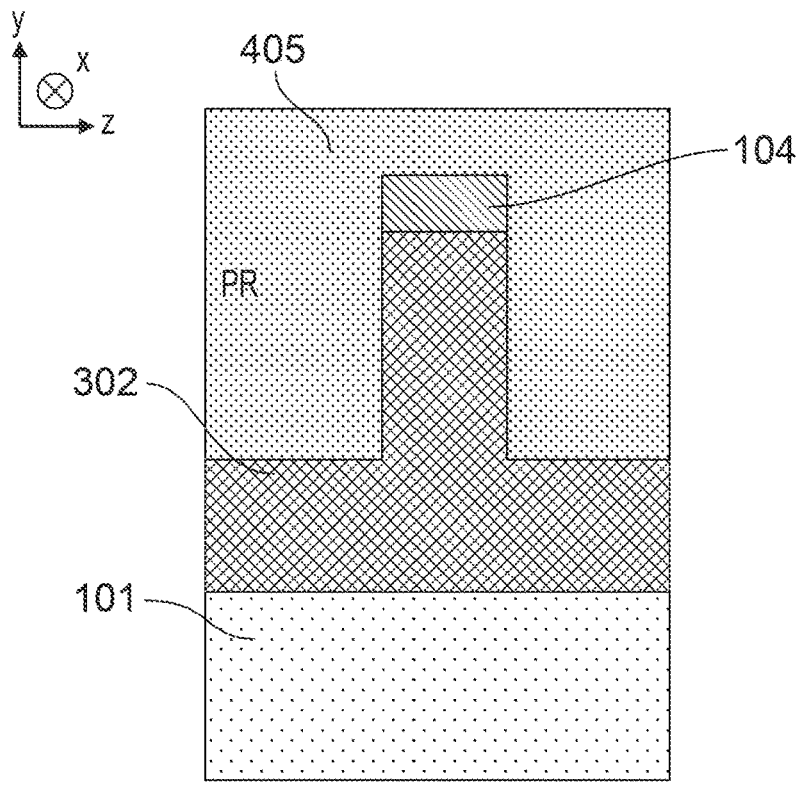
Figure 4:
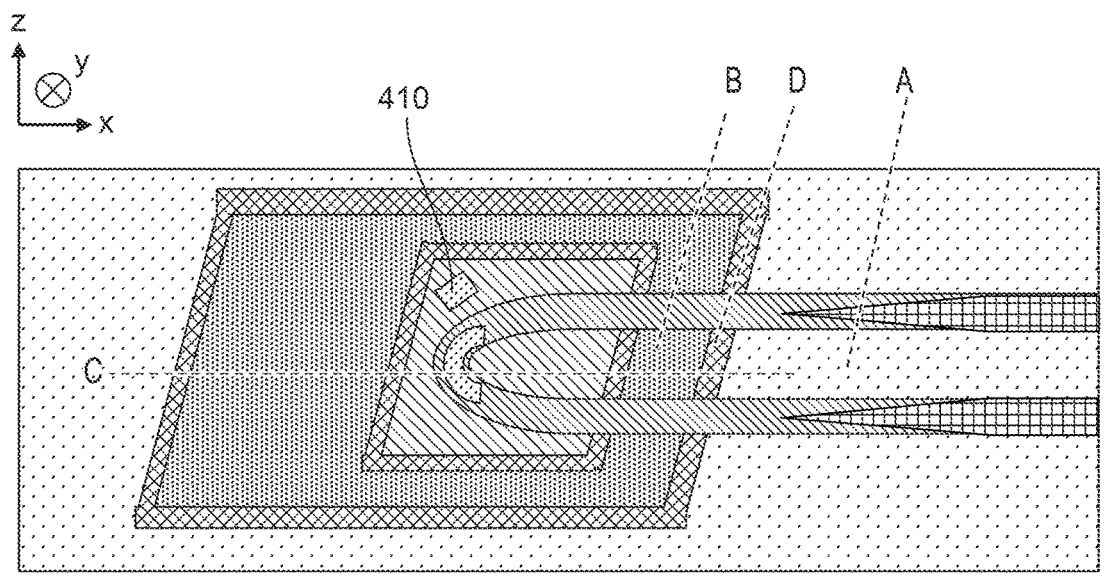
Figure 4:
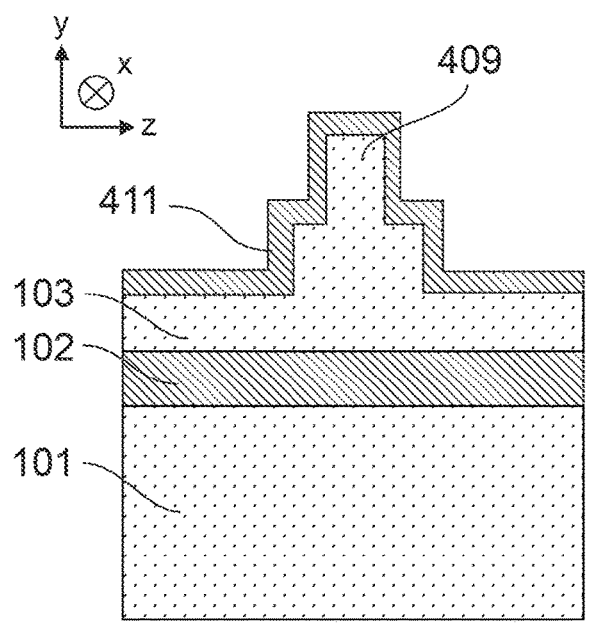
Figure 4:
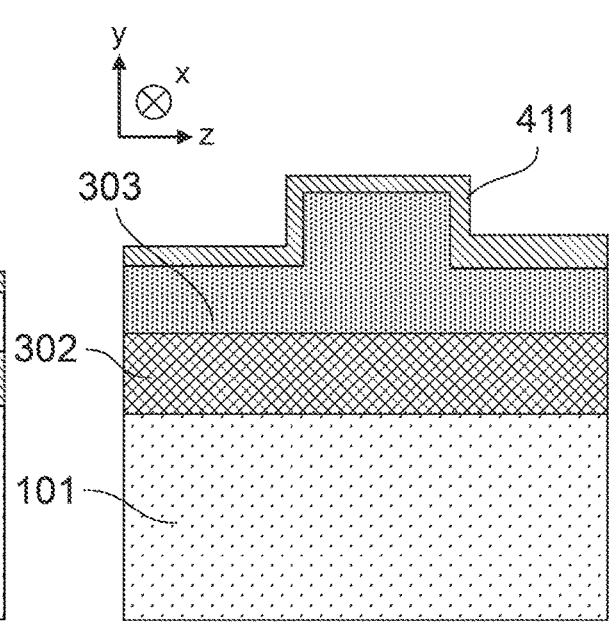
Figure 4:
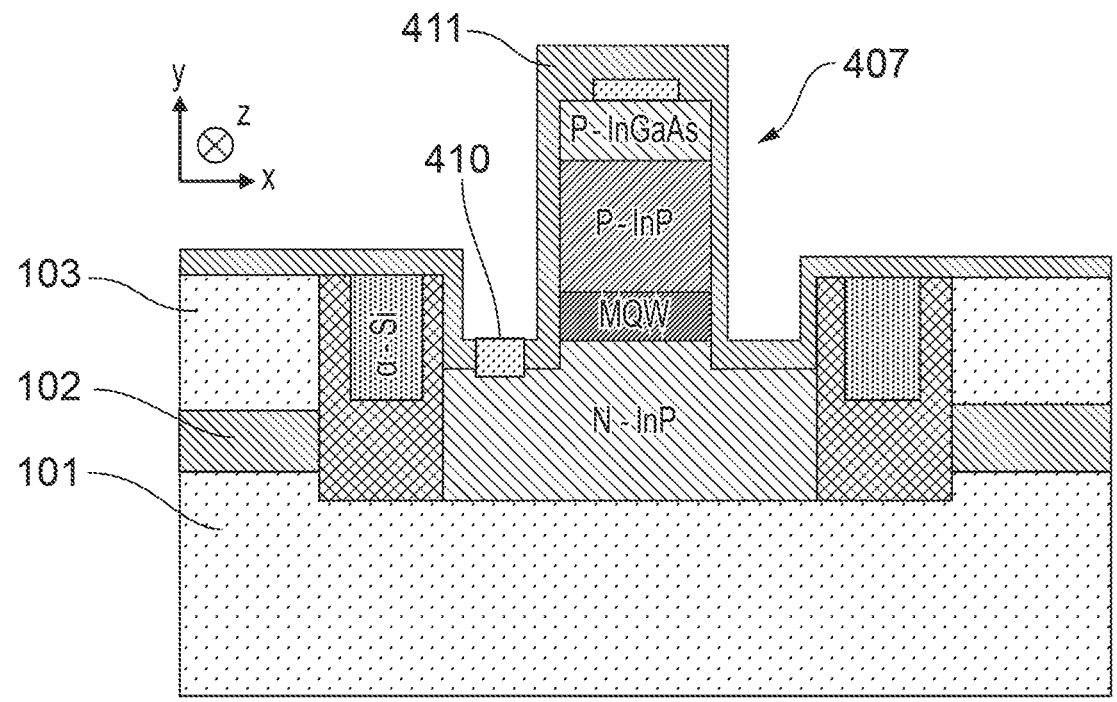
Figure 4:
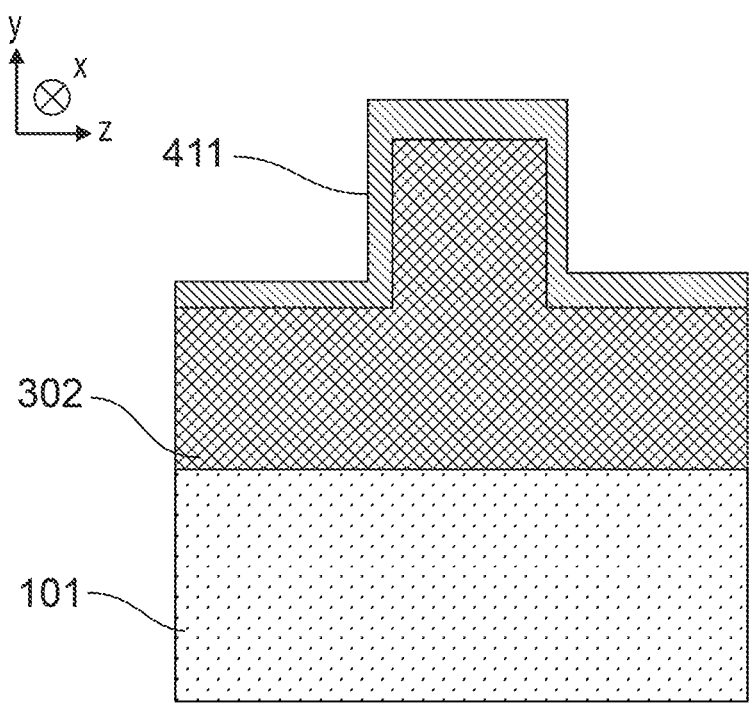

Photoresist 404 is then removed, and a further photoresist 405 is applied as shown in FIGS. 4(ix) and 4(ix)(A)-(D). The photoresist 405 encapsulates the waveguides formed previously and covers the III-V based device coupon. After the application of the photoresist 405, a dry etch is used to remove all silicon dioxide 104 not covered by the photoresist. The most notable result of this is shown in FIG. 4(ix)(C), where the silicon dioxide previously covering the silicon nitride liner has been removed. After the silicon dioxide etch, a selective silicon nitride dry etch is performed to reduce the height of the silicon nitride liner to approximately 1 μm. This is shown in FIGS. 4(x) and 4(x)(A)-(D), and most notably in FIG. 4(x)(C).

Next, a further dry etch is performed using the same photoresist 405. This time the dry etch selectively etches away silicon and α-Si, such that the uncovered device layer 103 and amorphous silicon 303 are level relative to the silicon nitride liner 302 to make a step for electrode pads later. This is shown in FIGS. 4(xi) and 4(xi)(A)-(D), most notably in FIG. 4(xi)(C).

Photoresist 405 is then removed, and a further photoresist 406 provided which covers most of the device bar the III-V device coupon. This is shown in FIG. 4(*xii*). An etch is then performed using the silicon nitride 402 as a hard mask, which geometrically defines waveguide ridge or rib 407 within the III-V device coupon. The etch extends down through the layers of the III-V device coupon, stopping shortly after it enters the N doped InP layer.

Photoresist 406 is then removed, as well as any exposed silicon dioxide. A further layer of silicon dioxide 104 is then disposed over the entire device. The result of this step is shown in FIGS. 4(*xiii*) and 4(*xiii*)(A)-(D), noting that in FIG. 4(*xiii*) the silicon dioxide has been omitted for clarity. Next, in a step shown in FIGS. 4(*xiv*) and 4(*xiv*)(A)-(D), a waveguide taper is formed in the silicon waveguides in the device layer 103. This is seen most clearly in FIG. 4(*xiv*)(A), where waveguide taper 409, formed of silicon, extends from the device layer 103. The waveguide taper in this example tapers from a height of around 3 μm (distal to the III-V device coupon waveguide and proximal to an edge of the wafer) to around 1 μm (proximal to the III-V device coupon waveguide).

After the waveguide taper is formed, further silicon dioxide 104 is provide over the exposed surfaces of the device, a via is formed and N contact seed metal 410 is disposed in electrical contact with the N doped InP layer of the III-V device coupon. The result of this is shown in FIGS. 4(*xv*) and 4(*xv*)(A)-(D), notably 4(*xv*)(A) which shows the silicon dioxide and 4(*xv*)(C) which shows the N contact seed metal 410. The silicon dioxide provided forms a passivation layer 411, which also functions as an upper cladding layer for at least the α-Si and SiN portions of the bridge-waveguide.

Next, in a step shown in FIGS. 4(*xvi*) and 4(*xvi*)(A)-(D), an isolation trench 412 is etched into the III-V device coupon, on an opposing side of the waveguide ridge/rib to the N contact seed metal 410. This is most clearly seen in FIG. 4(*xvi*)(C). After this, further silicon dioxide is provided to line the isolation trench 412. Vias are etched, to expose the upper surfaces of the N contact seed metal and P contact seed metal previously formed. P contact 413 and N contact 414 are then provided, which respectively electrically connect to the P contact seed metal and N contact seed metal. The results of these steps are shown in FIGS. 4(*xvii*) and 4(*xvii*)(A)-(D), again section views.

This completes the fabrication of a III-V based electro-absorption modulator (EAM), located within waveguide ridge or rib 407, which has been integrated with a silicon platform. In use, light enters the device from one of the silicon waveguides 420 and 422. The optical mode is transitioned through the waveguide taper discussed previously, and the light is coupled through a respective one of bridge-waveguides 424 and 426 (formed of α-Si and SiN) into the waveguide ridge or rib 407 containing III-V based EAM. A driver (not shown) applies a voltage to one or both of the P and N contacts 413 and 414, so as to modulate the light passing through the III-V based EAM. The light then exits through the silicon waveguide, via the other bridge-waveguide.

In FIGS. 4(*iv*) to 4(*xvii*), the section views along lines A, B, and D illustrate one of the two silicon waveguides or bridge waveguides. Both the input and output silicon waveguides can be located on one side of the III-V device coupon which has an U-shape waveguide as shown in above figures. However, the input and output silicon waveguides can be located on opposite sides of the III-V device coupon, the coupon having a straight waveguide. Alternatively the input and output silicon waveguides can be located on either side of the III-V device coupon which has an L-shape waveguide; or input and output silicon waveguides can be located on either side of the III-V device coupon whose waveguide forms an angle from 90 degree to 180 degree. It will be understood that of course the same process occurs in the other silicon waveguide and bridge waveguide, however these views have been omitted for conciseness.

Figure 5:
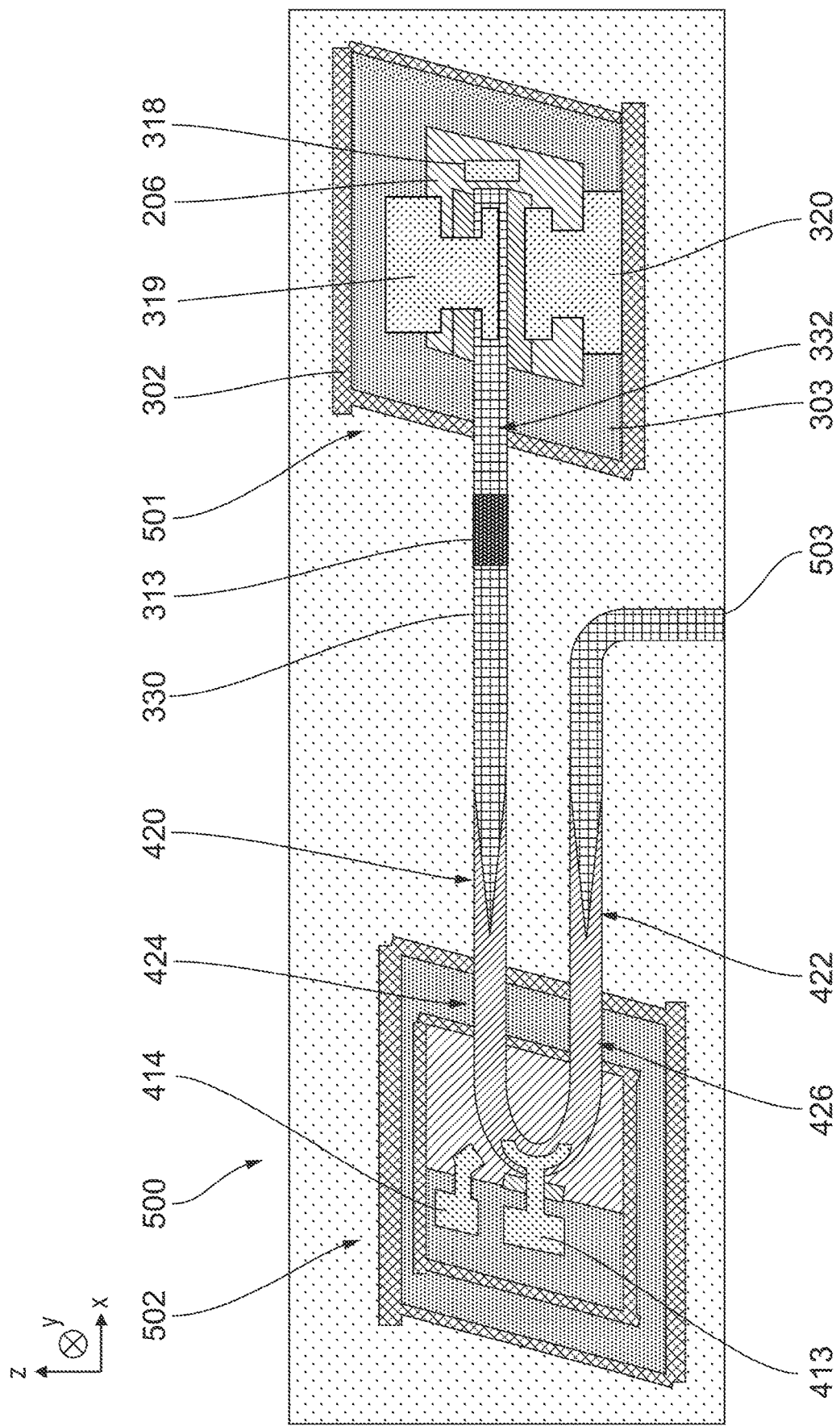
FIG. 5 shows an integrated photonic circuit incorporating two III-V based optoelectronic devices.

FIG. 5 shows an photonic integrated circuit, PIC, 500, including a III-V based laser 501 manufactured using the method discussed in relation to FIGS. 3(*i*)-3(*xxv*)(A), which is directly optically coupled to a III-V based EAM 502 manufactured using the method discussed in relation to FIGS. 4(*i*)-4(*xvii*)(D). Accordingly, the PIC can be used as a modulator transmitter. An unmodulated optical signal can be generated by laser 501, and provided to EAM 502. The EAM can then modulate the signal, and provide it to a chip output waveguide 503 for further transmission. In FIG. 5, a top passivation layer (in some embodiments formed of silicon dioxide) has been omitted for clarity.

Typically, in the top-down views described above and shown in the figures, one or more upper layers may have been omitted for clarity.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

LIST OF FEATURES

101 Silicon substrate
102 Buried oxide layer
103 Silicon device layer
104 Silicon dioxide
105 Cavity
105*a* Sidewall(s)
105*b* Sidewall(s)
105*c* Bed
200 III-V stack
201 InP substrate
202 Sacrificial layer
203 N doped InP layer
204 Optically active layer
205 P doped InP layer
206 P doped InGaAs layer
207 SiN protective layer
208 Photoresist tether
210 Device coupon including SiN protective layer
301 Channel
302 Silicon nitride
303 α-silicon fill
304 Bridge-waveguide
305 P contact seed metal layer
307 Silicon nitride layer
308, 309, 310 Photoresist
311 Trench
312 Back side reflection facet
313 Grating
314 Upper cladding layer
315 N contact via
316 N contact seed metal layer
317 P contact via
318 Highly reflective back side reflection facet 319 P contact
320 N contact
401 P contact seed metal
402 Silicon nitride
403, 404, 405, 406 Photoresist
407 Waveguide ridge/rib
409 Waveguide taper
410 N contact seed metal
411 Upper cladding layer
412 Isolation trench
413 P contact
414 N contact
500 PIC
501 Laser
502 EAM
503 Chip output waveguide

The invention claimed is:

1. An optoelectronic device, comprising:
a silicon-on-insulator wafer including:
   a silicon waveguide located within a silicon device layer, a substrate, and an insulator layer between the substrate and silicon device layer;
   a III-V semiconductor based waveguide, located within a cavity of the silicon-on-insulator wafer; and
   a bridge-waveguide, which optically couples the silicon waveguide located within the silicon device layer to the III-V semiconductor based waveguide located within the cavity; and
   one or more anti-reflective liners, located between the silicon waveguide and the bridge-waveguide,
wherein the III-V semiconductor based waveguide is a multi-layered structure obtained or obtainable by a process of epitaxially growing a sequence of layers, and wherein a layer of the multi-layered structure distalmost to the cavity was grown last in said process.

2. The optoelectronic device of claim 1, wherein the one or more anti-reflective liners are further located between the bridge-waveguide and the III-V semiconductor based waveguide.

3. The optoelectronic device of claim 1, wherein a geometry of the III-V semiconductor based waveguide, a geometry of the bridge-waveguide, and a geometry of the silicon waveguide adjacent to the bridge-waveguide are substantially identical.

4. The optoelectronic device of claim 1, wherein the III-V semiconductor based waveguide is electrically connected to one or more electrical bonding pads located on the silicon-on-insulator wafer.

5. The optoelectronic device of claim 1, wherein the bridge-waveguide is formed of amorphous silicon.

6. The optoelectronic device of claim 1, including a reflection facet, adjacent to an end of the III-V semiconductor based waveguide which is distal to the bridge-waveguide, such that the optoelectronic device is operable as a laser.

7. The optoelectronic device of claim 6, wherein the silicon waveguide includes a grating, such that the optoelectronic device is operable as a distributed Bragg reflector laser.

8. The optoelectronic device of claim 1, wherein the optoelectronic device is operable as an electro-absorption modulator.

9. The optoelectronic device of claim 1, wherein the silicon waveguide includes a waveguide taper, which tapers an optical mode from a first optical mode distal to the bridge-waveguide, for transmission from/reception to the optoelectronic device, to a second optical mode proximal to the bridge-waveguide, for guiding through the optoelectronic device.

10. The optoelectronic device of claim 1, wherein the cavity has a parallelogramal shape.

11. An optoelectronic device, comprising:
a silicon-on-insulator wafer including:
   a silicon waveguide located within a silicon device layer, a substrate, and an insulator layer between the substrate and silicon device layer;
   a III-V semiconductor based waveguide, located within a cavity of the silicon-on-insulator wafer, the cavity having the shape of a non-rectangular parallelogram; and
   a bridge-waveguide, which optically couples the silicon waveguide located within the silicon device layer to the III-V semiconductor based waveguide located within the cavity,
wherein the III-V semiconductor based waveguide is a multi-layered structure obtained or obtainable by a process of epitaxially growing a sequence of layers, and wherein a layer of the multi-layered structure distalmost to the cavity was grown last in said process.

12. A method of manufacturing the optoelectronic device of claim 1, wherein the method includes the steps of:
providing a device coupon, the device coupon being formed of a plurality of III-V based layers;
providing the silicon-on-insulator wafer, the cavity of the silicon-on-insulator wafer having a bonding region;
transfer printing the device coupon into the cavity, and bonding a layer of the device coupon to the bonding region, such that a channel is left around one or more lateral sides of the device coupon;
filling the channel with a bridge-waveguide material; and
performing one or more etches on the device coupon, silicon-on-insulator wafer, and/or channel to provide the III-V semiconductor based waveguide in the device coupon, the bridge-waveguide, in the channel, and the silicon waveguide in the silicon-on-insulator wafer.

13. The method of claim 12, further including, before filling the channel, lining the channel with an anti-reflective liner.

14. The method of claim 13, wherein the channel is lined such that a portion of the anti-reflective liner which coats a bed of the channel has an upper surface which is aligned with an upper surface of the insulator layer.

15. The method of claim 12, further including, after filling the channel with the bridge-waveguide material, aligning an upper surface of the bridge-waveguide material with an upper surface of the silicon device layer.

16. The method of claim 12, wherein a geometry of the III-V semiconductor based waveguide, a geometry of the bridge-waveguide in the channel, and a geometry of the silicon waveguide are substantially identical.

17. The method of claim 12, wherein the III-V semiconductor based waveguide, the bridge-waveguide, and the silicon waveguide are etched with a same etching hard mask.

18. The method of claim 12, including forming one or more electrical bonding pads on the silicon-on-insulator wafer.

19. The method of claim 12, wherein the bridge-waveguide material is formed from amorphous silicon.

20. The method of claim 12, further including etching a reflection facet, which is adjacent to an end of the III-V semiconductor based waveguide which is distal to the bridge-waveguide, such that the optoelectronic device is operable as a laser.

21. The method of claim 20, further including etching a grating into the silicon waveguide, such that the optoelectronic device is operable as a distributed Bragg reflector laser.

22. The method of claim 12, wherein the optoelectronic device is operable as an electro-absorption modulator.

23. The method of claim 22, wherein the III-V semiconductor based waveguide is U-shaped, the silicon waveguide is an input waveguide, and the silicon-on-insulator wafer is also etched to provide an output waveguide, the input waveguide and output waveguide being optically coupled to respective legs of the III-V semiconductor based waveguide through respective bridge-waveguides including the bridge-waveguide.

24. The method of claim 22, wherein the III-V semiconductor based waveguide is L-shaped, or substantially L-shaped, the silicon waveguide is an input waveguide, and the silicon-on-insulator wafer is also etched to provide an output waveguide, the input waveguide and output waveguide being optically coupled to respective legs of the III-V semiconductor based waveguide through respective bridge-waveguides including the bridge-waveguide.

25. The method of claim 23, further including fabricating a waveguide taper in each of the input and output waveguides, which tapers an optical mode from a first optical mode distal to the bridge-waveguide, for transmission from/reception to the optoelectronic device, to a second optical mode proximal to the bridge-waveguide, for guiding through the optoelectronic device.

26. The method of claim 25, wherein the second optical mode is smaller than the first optical mode.

27. The method of claim 12, wherein the cavity has a parallelogramal shape.

* * * * *